US008372309B2

(12) United States Patent
Nagatomi et al.

(10) Patent No.: US 8,372,309 B2
(45) Date of Patent: *Feb. 12, 2013

(54) PHOSPHOR AND MANUFACTURING METHOD THEREFORE, AND LIGHT EMISSION DEVICE USING THE PHOSPHOR

(75) Inventors: Akira Nagatomi, Tokyo (JP); Kenji Sakane, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/912,179

(22) Filed: Oct. 26, 2010

(65) Prior Publication Data

US 2011/0084235 A1 Apr. 14, 2011

Related U.S. Application Data

(62) Division of application No. 11/885,439, filed as application No. PCT/JP2006/304175 on Mar. 3, 2006, now Pat. No. 7,887,718.

(30) Foreign Application Priority Data

| Mar. 4, 2005 | (JP) | 2005-061627 |
|---|---|---|
| Mar. 16, 2005 | (JP) | 2005-075854 |
| Jun. 30, 2005 | (JP) | 2005-192691 |

(51) Int. Cl.
C09K 11/59 (2006.01)
(52) U.S. Cl. ............................................. 252/301.4 F
(58) Field of Classification Search ............. 252/301.4 F
See application file for complete search history.

(56) References Cited

U.S. PATENT DOCUMENTS

| 7,524,437 B2 | 4/2009 | Sakane et al. |
| 2003/0030368 A1 | 2/2003 | Ellens et al. |
| 2003/0052595 A1 | 3/2003 | Ellens et al. |
| 2003/0094893 A1 | 5/2003 | Ellens et al. |
| 2007/0007494 A1 | 1/2007 | Hirosaki et al. |
| 2009/0236963 A1 | 9/2009 | Nagatomi et al. |

FOREIGN PATENT DOCUMENTS

| EP | 1 278 250 A2 | 1/2003 |
| EP | 1 278 250 A3 | 1/2003 |
| EP | 1 296 376 A2 | 3/2003 |
| EP | 1 296 376 A3 | 3/2003 |
| EP | 1 296 383 A2 | 3/2003 |
| EP | 1 296 383 A3 | 3/2003 |
| JP | A-2002-322474 | 11/2002 |
| JP | A-2002-363554 | 12/2002 |
| JP | A-2003-203504 | 7/2003 |
| JP | A-2003-206481 | 7/2003 |
| JP | 2004-67837 | 3/2004 |
| JP | 2004-235598 | 8/2004 |
| JP | A-2005-0089794 | 1/2005 |
| JP | A-2005-048105 | 2/2005 |
| WO | WO 2004/029177 A1 | 4/2004 |
| WO | WO 2004/055910 A1 | 7/2004 |

OTHER PUBLICATIONS

Office Action issued Aug. 21, 2009 in China Application No. 200680007164.0.
Office Action issued Apr. 26, 2010 in China Application No. 200680007164.0.
Office Action issued Nov. 3, 2010 in China Application No. 200680007164.0.
Extended European Search Report issued Feb. 17, 2012 in patent application No. 06715234.8.
J. W. H. van Krevel, et al., "Luminescence Properties of Terbium-, Cerium-, or Europium-Doped α-Sialon Materials", Journal of Solid State Chemistry, vol. 165, No. 1, XP 001157540, Apr. 1, 2002, pp. 19-24.
Rong-Jun Xie, et al., "Preparation and Luminescence Spectra of Calcium- and Rare-Earth (R = Eu, Tb, and Pr)-Codoped α-SiAlON Ceramics", Journal of the American Ceramic Society, vol. 85, No. 5, XP 001151981, 2002, pp. 1229-1234.
Van Krevel, "Luminescence properties of rare earth doped α-SiAlON materials", Luminescence of RE doped α-SiAlON's, Chapter 11, XP 008060386, Jan. 1, 2000, pp. 145-157.
H. Mandal, et al., "CeO$_2$-doped α-sialon ceramics", Journal of Materials Science Letters, vol. 15, XP008074097, Jan. 1, 1996, pp. 1435-1438.
U.S. Appl. No. 13/280,074, filed Oct. 24, 2011, Nagatomi, et al.
Office Action issued Nov. 1, 2011, in Japanese Application No. 2007-506042.
Office Action issued Aug. 10, 2012, in Korean patent application No. 2007-7020732.
Office Action issued May 15, 2012, in Japanese patent application No. 2007-506042.
Nötzold et al, "On the Influence of Substituitons of Ions of the Same Charge on Luminescence of Pentastrontium Chlloridephosphate Activated by Divalent Europium", Z. anorg. Allg. Chem. (1992), vol. 613, pp. 127-131, (w/English abstract)
Barry, J., "Equlibria and Eu$^{2+}$. Luminescence of Subsolidus Phases Bounded by $Ba_3MgSi_2O_8$, $Sr_3MgSi_2O_8$, and $Ca_3MgSi_2O_8$", Electrochem. Soc., (1968), vol. 115, No. 7, pp. 733-738.
Corrected Extended Search Report issued on Nov. 22, 2012, in European patent application No. 06715234.8.

*Primary Examiner* — Carol M Koslow
(74) *Attorney, Agent, or Firm* — Oblon, Spivak, McClelland, Maier & Neustadt, L.L.P.

(57) ABSTRACT

To provide a phosphor having an emission spectrum with a broad peak in a range from green color to yellow color, having a broad and flat excitation band capable of using lights of broad range from near ultraviolet/ultraviolet to blue lights as excitation lights, and having excellent emission efficiency and luminance. The problem is solved by providing the phosphor expressed by a general composition formula MmAaBbOoNn:Z (where element M is one or more kinds of elements having bivalent valency, element A is one or more kinds of elements having tervalent valency, element B is one or more kinds of elements having tetravalent valency, O is oxygen, N is nitrogen, and element Z is one or more kinds of elements acting as the activator), satisfying $4.0<(a+b)/m<7.0$, $a/m \geq 0.5$, $b/a>2.5$, $n>o$, $n=2/3m+a+4/3b-2/3o$, and having an emission spectrum with a peak wavelength of 500 nm to 650 nm when excited by light in a wavelength range from 300 nm to 500 nm.

4 Claims, 17 Drawing Sheets

PRIOR ART

FIG.26A-C
(A)
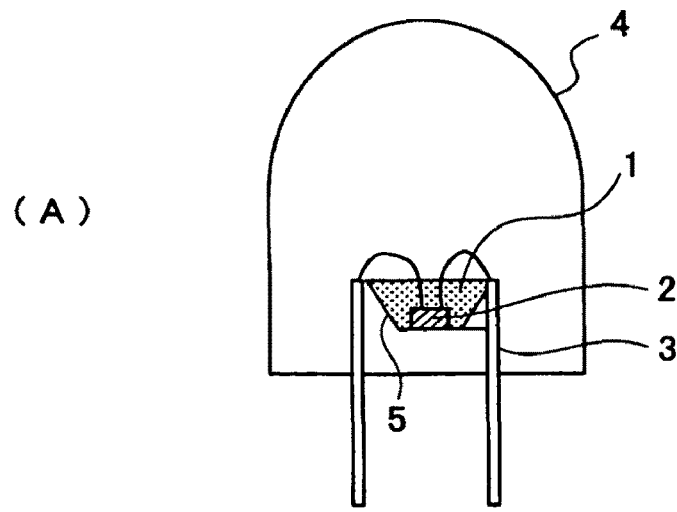
(B)
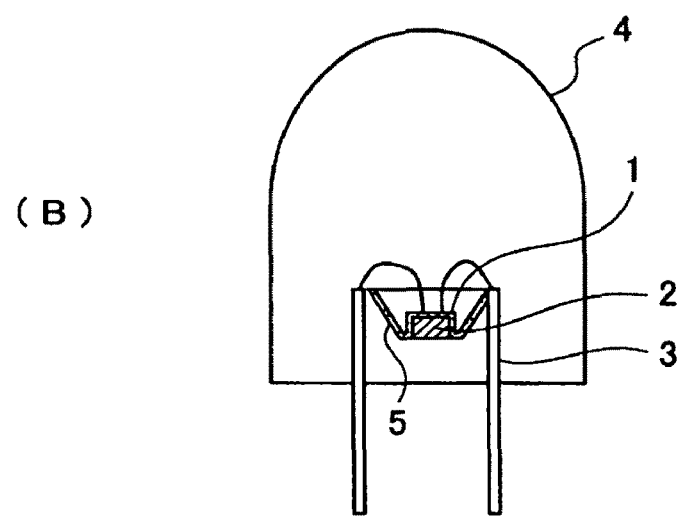
(C)
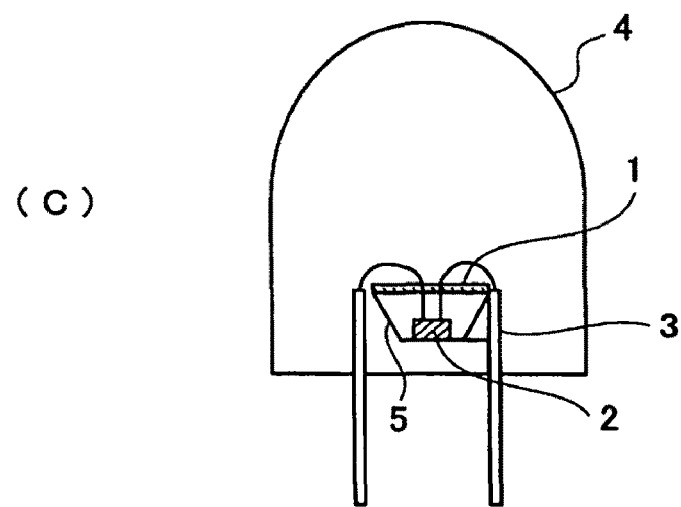

FIG.27A-E
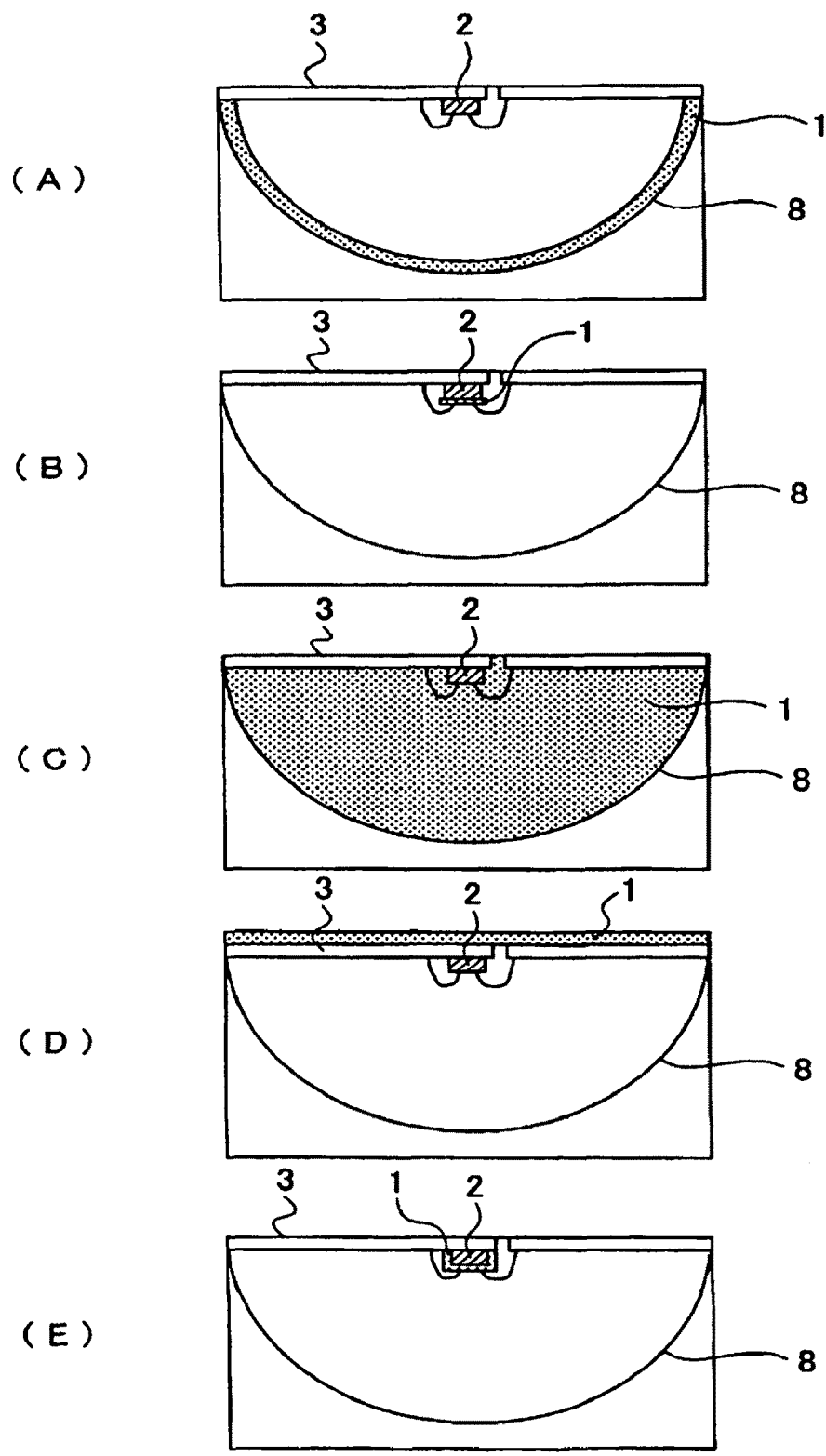

PHOSPHOR AND MANUFACTURING METHOD THEREFORE, AND LIGHT EMISSION DEVICE USING THE PHOSPHOR

This is a Division of application Ser. No. 11/885,439 filed Aug. 31, 2007, now U.S. Pat. No. 7,887,718, issued Feb. 15, 2011, which in turn is a National Phase of Application No. PCT/JP2006/304175 filed Mar. 3, 2006, which claims priority to Japanese Patent Application Nos. 2005-192691 filed Jun. 30, 2005, 2005-075854 filed Mar. 16, 2005, and 2005-061627 filed Mar. 4, 2005. The disclosure of the prior applications is hereby incorporated by reference herein in their entirety.

TECHNICAL FIELD OF THE INVENTION

The present invention relates to a phosphor containing nitrogen used for a display such as a cathode-ray tube (CRT), a field emission display (FED) and a plasma display (PDP), and an illumination device such as a fluorescent lamp and a fluorescent display tube, and an illumination device such as a liquid crystal back light, and to a method of manufacturing the phosphor, and also to a phosphor mixture, a phosphor sheet, and a light emission device such as a white LED illumination in which a semiconductor light emitting element (LED) and this phosphor are combined.

BACKGROUND OF THE INVENTION

At present, a discharge type fluorescent lamp and an incandescent bulb used as the illumination device involve problems that a harmful substance such as mercury is contained, and life span is short. However, in recent years, a high luminance LED emitting light of near ultraviolet/ultraviolet to blue color has been developed in sequence, and the white LED illumination for the practical application of the next generation has been actively studied and developed, in which the white light is created by mixing the light of the near ultraviolet/ultraviolet to blue color generated from the LED and the light generated from the phosphor having an excitation band in a wavelength region thereof. When the white LED illumination is put to practical use, since efficiency of converting electric energy into light is improved, less heat is generated and it is constituted of the LED and a phosphor, the white LED has advantages of good life span without burn-out of a filament like a conventional incandescent bulb and the harmful substance such as mercury is not contained, and miniaturization of the illumination device is realized, thus realizing an ideal illumination device.

Two systems are proposed as the system of the LED illumination. One of them is a multi-chip type system which creates white color by using three primary color LEDs such as high luminance red LED, green LED, and blue LED, and the other one is one-chip type system which creates white color by combining a high luminance LED emitting light of near ultraviolet/ultraviolet to blue color and a phosphor excited by the light of the near ultraviolet/ultraviolet to blue color emitted from this LED. When these two systems are compared from the viewpoint of illumination, particularly in the one-chip type system, the phosphor having an emission spectrum with a broad peak is used, therefore the emission spectrum can be made closer to the spectrum of solar light, and therefore the white light having excellent color rendering properties can be obtained, compared to the multi-chip type system. Further, the one-chip type system has many advantages such as a simplified drive circuit, enabling miniaturization, eliminating an optical waveguide for mixing colors, with no necessity of considering a difference in drive voltage and optical output of each LED, and reducing a cost. Therefore, the one-chip type system, in which an LED and a phosphor are combined, is focused as an illumination of the next generation.

The white LED illumination, in which a high luminance blue LED and a phosphor emitting yellow color by being excited by the blue light generated from the LED are combined, is given as one of the examples of the one chip type white LED illumination. Specifically, for example, a high luminance blue LED and an yellow phosphor $(Y,Gd)_3$, $(Al,Ga)_5O_{12}:Ce(YAG:Ce)$, $Tb_3Al_5O_{12}:Ce$, $Ca_3Sc_2Si_3O_{12}:Ce$, and $CaSc_2O_4:Ce$ can be combined. In the white LED illumination, white color is obtained by using a complementary relation between the blue emission of the LED and the yellow emission of the phosphor, thereby allowing less phosphor to be used. Further, the yellow phosphor YAG:Ce used for the white LED illumination has an excitation spectrum with a peak near the wavelength of 460 nm, thereby allowing emission with high efficiency, and has an emission spectrum with a luminance (visibility) peak at about 560 nm, thereby allowing high luminance white LED to be obtained. However, the problem of the white LED illumination is that the emission on the longer-wavelength side of visible light range, specifically the emission of red color component is insufficient, and therefore, only slightly bluish white emission can be obtained, and a slightly reddish white emission like an electric bulb can not be obtained, thereby the color rendering properties are insufficient. However, in recent years, a nitrogen-containing phosphor having a broad emission spectrum with a peak in a wavelength range from yellow color to red color, and also having a good excitation band in a range from near ultraviolet/ultraviolet to blue color has been developed in sequence. Then, by adding such a phosphor, the color rendering properties are improved.

Also, another example of the one chip type white LED illumination obtains white color by using a mixed color of lights of the LED emitting the near ultraviolet/ultraviolet color, and lights of the phosphor emitting red color (R), the phosphor emitting green color (G) and the phosphor emitting blue (B) color, obtained by being excited by the near ultraviolet/ultraviolet light generated from the LED. A method of obtaining white emission by the lights of the R, G, B, and other colors is capable of obtaining an arbitrary emission color other than white light, depending on the combination and mixed ratio of the R, G, B, and is excellent in color rendering properties, because the white emission is obtained not by the complementary relation of the lights but by the relation of mixed colors using the R,G,B.

Then, as the phosphor used for such an application, examples are given such as $Y_2O_2S:Eu$, $La_2O_2S:Eu$, $3.5MgO.0.5MgF_2.GeO_2:Mn$, $(La, Mn, Sm)_2O_2S.Ga_2O_3:Eu$ for the red phosphor, $ZnS:Cu,Al$, $CaGa_2S_4:Eu$, $SrGa_2S_4:Eu$, $BaGa_2S_4:Eu$, $SrAl_2O_4:Eu$, $BAM:Eu,Mn$, $(Ba,Sr,Ca,Mg)_2SiO_4:Eu$ for the green phosphor, and $BAM:Eu$, $Sr_5(PO_4)_3Cl:Eu$, $ZnS:Ag$, $(Sr, Ca, Ba, Mg)_{10}(PO_4)_6Cl_2:Eu$ for the blue phosphor. However, the red phosphors out of the phosphors of three colors have a sharp emission spectrum, while the phosphors of other colors have broad emission spectra, thereby involving the problem that the color rendering properties of the white light obtained is unsatisfactory, and emission characteristic at a high temperature is deteriorated. However, such a problem has also been solved, as described above, by developing in sequence phosphors containing nitrogen, excellent in temperature characteristic and excitation band characteristic, and emitting from yellow color to red color.

The problem involved in the phosphor emitting yellow color to red color is substantially solved, by developing the nitrogen-containing phosphor having the emission spectrum with a peak in the wavelength range from yellow color to red color, having a broad emission spectrum, and further having a good excitation band in the wavelength range from the near ultraviolet/ultraviolet to blue color. As the phosphor containing nitrogen as described above, $Ca_2Si_5N_8$:Eu, $Sr_2Si_5N_8$:Eu, $Ba_2Si_5N_8$:Eu, $Ca_x(Al,Si)_{12}(O,N)_{16}$:Eu ($0<x\leq1.5$), $CaAl_2Si_4N_8$:Eu, $CaAlSiN_3$:Eu and so forth are typically given as examples.

Here, as a necessary factor as a light source for a general illumination such as a white LED as described above, firstly a factor of brightness and secondary a factor of color rendering properties are given. As the first factor of brightness, the brightness (luminance) as the light source and emission efficiency are given, and in the LED, are largely influenced by the emission efficiency of the used semiconductor element, the emission efficiency of the used phosphor, and the structure of the white LED itself. As the second factor, the color rendering property, a value showing reproducibility of the color by the light source is given as an example, and generally an evaluation method of this color rendering property is shown in JISZ8726 (1990). Therefore, the color rendering property will be explained by using the evaluation method of JISZ8726.

According to JISZ8726, the color rendering property of the light source is numerically expressed by a general color rendering index (Ra). This is a value obtained by evaluating a difference of colors between a reference sample for color rendering evaluation illuminated by a sample light source, and the reference sample illuminated by a reference light approximated a natural light, and when there is no difference between them and they are completely the same values, the color rendering index (Ra) is 100. Even if color temperatures of the light sources are the same, there is a difference in the way color is observed depending on the color rendering index, and when the color rendering index is low, a color is dull and appears dark. When the light source has a uniform density of light over an entire region of visible light, this light source has an excellent color rendering property.

The color rendering property is improved by development of the aforementioned new phosphor emitting light from yellow color to red color, and the next problem is the phosphors with the emission peak wavelength from green color to yellow color.

First, the problem involved in the yellow phosphor YAG:Ce is explained by using FIG. 25. FIG. 25 is a graph showing the emission intensity (relative intensity) taken on the ordinate axis and the wavelength of an excitation light taken on the abscissa axis, and showing an excitation spectrum obtained by measuring an intensity of the light having the wavelength of 559.2 nm emitting light when the YAG:Ce is excited by an excitation light having the wavelength of 300 to 570 nm.

In the white LED illumination obtained by combining the high luminance blue LED and the YAG:Ce phosphor emitting yellow color by being excited by blue color generated from the LED, the YAG:Ce phosphor has a high-efficiency excitation band for the light having the wavelength of 460 nm generated from the blue LED, and further, has an emission spectrum with a peak near to the wavelength of 560 nm in which the luminance (visibility) is highest, thereby allowing a high luminance white LED illumination to be obtained. However, as clarified from FIG. 25, the YAG:Ce phosphor has an emission characteristic of emitting the light having the wavelength of 560 nm or around with high efficiency, when excited by the light having the wavelength of 460 nm. However, since the excitation band is narrow, the emission wavelength of the blue LED changes due to variation in manufacturing the blue LED, then if the emission wavelength is deviated from the range of an optimal excitation band of the YAG:Ce phosphor when excited by the blue light of the blue LED, disruption of balance between the blue color and yellow color emission intensity occurs. Such a situation involves the problem that color tone of the white light obtained by combining the blue light and the yellow light is changed.

Further, this YAG:Ce phosphor has an excellent emission spectrum in the wavelength range from about 500 to 550 nm of green color component of visible light. Therefore, preferably the YAG:Ce phosphor is used as a green phosphor of the white LED illumination in which the near ultraviolet/ultraviolet LED, the red (R) color emitting phosphor, the green (G) color emitting phosphor, and the blue color (B) emitting phosphor are combined. However, when light-emitted by the near ultraviolet/ultraviolet light, as shown in FIG. 25, this YAG:Ce phosphor has a low-efficiency excitation band in the emission wavelength (380 to 410 nm or around in FIG. 25) of the near ultraviolet/ultraviolet LED. Therefore, the problem involved therein is that a sufficient emission can not be obtained, and the high luminance white LED illumination can not be obtained.

Next, the problem involved in the green phosphor used in combination with the ultraviolet LED will be explained. As the white LED illumination using the near ultraviolet/ultraviolet emitting LED and the mixed colors of light of the red (R) color emitting phosphor, the green (G) color emitting phosphor, and the blue (B) color emitting phosphor obtained by being excited by the light of the near ultraviolet/ultraviolet light generated from the LED, the green phosphor such as ZnS:Cu,Al, $SrAl_2O_4$:Eu, BAM:Eu,Mn, $(Ba,Sr,Ca,Mg)_2SiO_4$:Eu are presently used. Among the phosphors, there is a problem that a sulfide phosphor is significantly deteriorated in emission intensity, when heat is applied thereto, and further has no water-resisting property. In addition, an oxide phosphor does not have a good efficient excitation band in a broad range of the wavelength in the vicinity of the near ultraviolet/ultraviolet. Therefore, the problem involved therein is that when the variation in emission wavelength occurs due to by variation in manufacturing the near ultraviolet/ultraviolet LED, the emission wavelength of the near ultraviolet/ultraviolet LED is deviated from the optimal excitation range, thereby disrupting the balance in emission intensity among the red color, green color, and blue color, resulting in the change of the color tone of the white light.

Therefore, as the green to yellow emitting phosphor by being excited by the light of the near ultraviolet/ultraviolet to blue color also, demand on a new phosphor having a flat high-efficiency excitation band in the wavelength range from near ultraviolet/ultraviolet to blue color, and having a broad emission spectrum, and further having an excellent durability against heat and water, and replacing YAG:Ce phosphor and ZnS:Cu,Al phosphor is increased. In order to respond to such a demand, green to yellow emitting phosphors are actively pursued, and in recent years, silicon nitride-based phosphor (for example see patent document 1), a phosphor comprising sialon as a matrix (for example, see patent documents 2, 3, 4), and oxynitride phosphor (for example, see patent documents 5 and 6) are proposed as the green to yellow emitting phosphor.

(Patent document 1) Japanese Patent Laid Open No. 2002-322474
(Patent document 2) Japanese Patent Laid Open No. 2003-203504

(Patent document 3) Japanese Patent Laid Open No. 2003-206481
(Patent document 4) Japanese Patent Laid Open No. 2002-363554
(Patent document 5) WO Publication No. 2004/029177 A1 pamphlet
(Patent document 6) WO Publication No. 2004/055910 A1 pamphlet

DISCLOSURE OF THE INVENTION

Problem to be Solved by the Invention

However, although such a phosphor containing nitrogen has an excellent durability against heat and water, has a flat excitation band in the wavelength range from near ultraviolet/ultraviolet to blue color, and has an emission spectrum with a broad peak, the emission efficiency does not meet a satisfactory level when excited by the excitation light of the near ultraviolet/ultraviolet to blue color, and a sufficient emission intensity and luminance are not obtained. Therefore, although the white LED illumination having an excellent durability can be manufactured, the emission intensity and luminance are insufficient. Therefore, when the white LED illumination is manufactured by combining the near ultraviolet/ultraviolet LED, the blue LED or the like and the aforementioned phosphor containing nitrogen, the luminance which is a most important factor as the illumination becomes insufficient. In addition, as a demand of a market hereafter, the emission device capable of performing various emissions such as a white color emission having excellent emission efficiency, excellent luminance, and excellent color rendering properties, are considered to be desired.

In view of the aforementioned problems, the present invention is provided, and an object of the present invention is to provide a phosphor having a broad emission spectrum with a peak from green color to yellow color, having a flat and wide excitation band in the range from near ultraviolet/ultraviolet to blue color, and having an excellent emission efficiency and luminance, a manufacturing method thereof, a phosphor mixture using this phosphor, a phosphor sheet, and an emission device such as a white LED illumination using such a phosphor, which has an excellent emission efficiency, luminance and color rendering properties.

Means to Solve the Problem

In order to solve the aforementioned problems, study on the response to the emission device or a light source having an excellent luminance and excellent color rendering properties is pursued. Then, as a result, it is found that the aforementioned problem can be solved by combining an yellow or green phosphor with a broad emission spectrum with a maximum peak (the maximum peak of the emission spectrum is sometimes described as simply a maximum peak hereunder) in a range from 520 nm to 580 nm, and having an excitation band in the light of a broad wavelength from ultraviolet to visible light (such as blue light), and phosphor of other colors.

Namely, it is found that by creating a phosphor mixture by combining this green phosphor, red phosphor similarly having an excitation band in the light with a broad wavelength from ultraviolet to visible light (such as blue light), and having the emission spectrum with a maximum peak in the wavelength range from 590 nm to 680 nm, and/or blue phosphor having emission spectrum with a maximum peak in the range from 420 nm to 500 nm, and when this phosphor mixture and various light sources (such as light source from ultraviolet light to blue light) are combined, the emission device capable of causing various light emissions such as white emission having an excellent emission efficiency, with high luminance, and having excellent color rendering properties can be manufactured.

Therefore, study on already known green and yellow phosphors having emission spectrum with a maximum peak in the range from 520 nm to 580 nm and the phosphor described in the patent document 3 are firstly studied on. However, it is found that the already known green and yellow phosphors have low emission efficiency when the blue LED and the ultraviolet LED are used as the excitation light, thus making it impossible to obtain light emission with high luminance.

Therefore, in order to solve the aforementioned problems, study on various phosphor compositions containing nitrogen is pursued. Then, as a result, it is found that a new phosphor having a broad and flat excitation band in the range from near ultraviolet/ultraviolet to blue color, having an improved emission intensity and luminance in the range from green color to yellow color, and having a broad emission spectrum can be obtained by adjusting the phosphor with a matrix composition having a site where Ce and Eu atoms can be easily and stably replaced. Further, it is found that the phosphor having excellent emission intensity and luminance in the range from yellow color to red color is obtained, when Eu or the like is used as an activator.

Further, the above-described problem can be solved by developing a phosphor mixture obtained by mixing the green phosphor, one or more kinds of blue phosphor having an emission spectrum with a maximum peak in the wavelength range from 420 nm to 500 nm and/or one or more kinds of red phosphors having an emission spectrum with a maximum peak in the wavelength range form 590 nm to 680 nm, and further by developing an emission device having this phosphor mixture and an emission part for emitting light with the wavelength range from 300 nm to 500 nm.

In a first aspect in order to solve the above-mentioned problems, a phosphor is provided, which is given as a general composition formula expressed by $M_mA_aB_bO_oN_n:Z$, (where element M is one or more kinds of elements having bivalent valency, element A is one or more kinds of elements having tervalent valency, element B is one or more kinds of elements having tetravalent valency, O is oxygen, N is nitrogen, and element Z is one or more kinds of activators), satisfying $4.0<(a+b)/m<7.0$, $a/m\geq0.5$, $b/a>2.5$, $n>o$, $n=2/3m+a+4/3b-2/3o$, wherein when being excited by the light with the wavelength range from 300 nm to 500 nm, the phosphor has an emission spectrum with a peak wavelength in a range from 500 nm to 650 nm.

In a second aspect, the phosphor according to the first aspect is provided, satisfying $0.5\leq a/m\leq2.0$, $3.0<b/m<7.0$, $0<o/m\leq4.0$.

In a third aspect, the phosphor according to either of the first aspect or the second aspect is provided, satisfying by $0.8\leq a/m\leq1.5$, $3.0<b/m<6.0$, $0<o/m\leq3.0$.

In a fourth aspect, the phosphor according to any one of the first to third aspects is provided, satisfying $1.1<a/m\leq1.5$, $3.5\leq b/m\leq4.5$, $0<o/m\leq1.5$.

In a fifth aspect, the phosphor according to any one of the first to fourth aspects is provided, wherein the element M is one or more kinds of elements selected from the group consisting of Mg, Ca, Sr, Ba, Zn, and rare earth elements having bivalent valency, the element A is one or more kinds of elements selected from the group consisting of Al, Ga, In, Ti, Y, Sc, P, As, Sb, and Bi, the element B is one or more kinds of elements selected from the group consisting of Si, Ge, Sn, Ti, Hf, Mo, W, Cr, Pb, and Zr, and the element Z is one or more kinds of elements selected from rare earth elements and transition metal elements.

In a sixth aspect, the phosphor according to any one of the first to fifth aspects is provided, wherein the element M is one or more kinds of elements selected from the group consisting of Mg, Ca, Sr, Ba, and Zn, the element A is one or more kinds of elements selected from the group consisting of Al, Ga, and In, the element B is Si and/or Ge, and the element Z is one or more kinds of elements selected from the group consisting of Eu, Ce, Pr, Tb, and Mn.

In a seventh aspect, the phosphor according to any one of the first to sixth aspects is provided, wherein the element M is Sr, the element A is Al, the element B is Si, and the element Z is Eu and/or Ce.

In an eighth aspect, the phosphor according to any one of the first to seventh aspects is provided, wherein when the general formula is expressed by MmAaBbOoNn:Zz, the value of z/(m+z), which is a molar ratio of the element M to the element Z, is not less than 0.0001 and not more than 0.5.

In a ninth aspect, the phosphor according to any one of the first to eighth aspects is provided, containing Sr of 19.5 to 29.5 wt %, Al of 5.0 to 16.8 wt %, O of 0.5 to 8.1 wt %, N of 26.0 to 32.0 wt %, and Ce of more than 0 to 3.5 wt % or less, wherein when the phosphor is irradiated with one or more kinds of monochromatic lights or continuous lights having the wavelength range from 350 nm to 500 nm as an excitation light, a peak wavelength in the emission spectrum is in the range from 500 to 600 nm, and x of chromaticity (x, y) of the emission spectrum is in the range from 0.3000 to 0.4500, and y of the chromaticity (x, y) is in the range from 0.5000 to 0.6000.

In a tenth aspect, the phosphor according to any one of the first to eighth aspects is provided, containing Sr of 19.5 to 29.5 wt %, Al of 5.0 to 16.8 wt %, O of 0.5 to 8.1 wt %, N of 22.6 to 32.0 wt %, and Eu of more than 0 to 3.5 wt % or less, wherein when the phosphor is irradiated with one or more kinds of monochromatic lights or continuous lights having the wavelength range from 350 nm to 500 nm as an excitation light, the peak wavelength of the emission spectrum is in the range from 550 to 650 nm, and x of the chromaticity of the emission spectrum (x, y) is in the range from 0.4500 to 0.6000, and y of the chromaticity of the emission spectrum (x, y) is in the range from 0.3500 to 0.5000.

In an eleventh aspect, the phosphor according to the tenth aspect is provided, wherein when the phosphor is irradiated with the monochromatic light having the wavelength range from 350 nm to 500 nm as an excitation light, the relation of $P_H$ and $P_L$ is given satisfying $(P_H-P_L)/P_H \times 100 \leq 20$, when a peak intensity of a maximum peak in a spectrum of light emission that occurs by absorbing the excitation light that makes it highest is defined as $P_H$, and the peak intensity of the maximum peak in the spectrum of light emission that occurs by absorbing the excitation light that makes it smallest is defined as $P_L$.

In a twelfth aspect, the phosphor according to any one of the first to eleventh aspects is provided, wherein when the value of relative intensity of the maximum peak in the emission spectrum is defined as $P_{25}$ when the phosphor is irradiated with a specified monochromatic light in the wavelength range from 300 nm to 500 nm as the excitation light at 25° C., and the value of the relative intensity of the maximum peak is defined as $P_{200}$ when the phosphor is irradiated with the specified monochromatic light as the excitation light at 200° C., the relation of $P_{25}$ and $P_{200}$ is given satisfying $(P_{25}-P_{200})/P_{25} \times 100 \leq 35$.

In a thirteenth aspect, the phosphor according to any one of the first to twelfth aspects is provided, containing primary particles with particle size of 50 μm or less and aggregates in which the primary particles agglutinate, wherein an average particle size (D50) of the powdery phosphor containing the primary particles and the aggregates is 1.0 μm or more and 50.0 μm or less.

In a fourteenth aspect, the phosphor according to any one of the first to thirteenth aspects is provided, containing the primary particles with particle size of 20 μm or less and the aggregates in which the primary particles agglutinate, wherein the average particle size (D50) of the powdery phosphor containing the primary particles and the aggregates is 1.0 μm or more and 20.0 μm or less.

In a fifteenth aspect, a method of manufacturing the phosphor according to any one of the first to fourteenth aspects is provided, wherein by using a crucible composed of nitride as a firing crucible, raw materials are fired at temperature of 1400° C. or more and 2000° C. or less in an atmosphere containing one or more kinds of gases selected from nitrogen gas, rare gas, and ammonia gas.

In a sixteenth aspect, the method of manufacturing the phosphor according to the fifteenth aspect is provided, wherein the raw materials are fired by setting pressure inside furnace at 0.001 MPa or more and 0.5 MPa or less.

In a seventeenth aspect, the method of manufacturing the phosphor according to either of the fifteenth or sixteenth aspect is provided, wherein the crucible composed of nitride is a BN crucible.

In an eighteenth aspect, the method of manufacturing the phosphor according to any one of the fifteenth to seventeenth aspects is provided, wherein the raw materials are fired, with 0.1 ml/min or more gas containing one or more kinds of gases selected from the nitrogen gas, rare gas, and the ammonia gas flowing inside the furnace.

In a nineteenth aspect, the method of manufacturing the phosphor according to the eighteenth aspect is provided, wherein a gas containing 80% or more of nitrogen gas is used as an atmosphere gas inside said furnace.

In a twentieth aspect, the method of manufacturing the phosphor according to any one of the fifteenth to nineteenth aspect is provided, wherein by using raw material particles of 10 μm or less, the raw material is fired in a powdery state.

In a twenty-first aspect, a phosphor mixture is provided, including the phosphor described in any one of the first to fourteenth aspects, one or more kinds of blue phosphors having the emission spectrum with a maximum peak in the wavelength range from 420 nm to 500 nm, when being excited with said excitation light in the wavelength range from 300 nm to 500 nm, and/or one or more kinds of red phosphors having the emission spectrum with a maximum peak in the wavelength range from 590 nm to 680 nm, when being excited with the excitation light in the wavelength range from 300 nm to 500 nm.

In a twenty-second aspect, a phosphor mixture is provided, including the phosphor described in any one of the first to fourteenth aspects, one or more kinds of blue phosphors having the emission spectrum with a maximum peak in the wavelength range form 420 nm to 500 nm when being excited by said excitation light in the wavelength range from 300 nm to 420 nm, and one or more kinds of red phosphors having the emission spectrum with a maximum peak in the wavelength range from 590 nm to 680 nm, when being excited with the excitation light in the wavelength range from 300 nm to 420 nm.

In a twenty-third aspect, a phosphor mixture is provided, which is the phosphor mixture according to the twenty-first or twenty-second aspect, wherein when emission intensity of each phosphor constituting the mixture at a temperature of 25° C. when being excited by a specified excitation light in the wavelength range from 300 nm to 500 nm is defined as $P_{25}$, and the emission intensity at a temperature of 200° C. when being excited by said specified excitation light is defined as $P_{200}$, $((P_{25}-P_{200})/P_{25})\times 100 \leqq 30$.

In a twenty-fourth aspect, the phosphor mixture according to the twenty-first or twenty-third aspect is provided, wherein in the emission spectrum under excitation of the excitation light in a range from 300 nm to 420 nm, a correlated color temperature is in a range from 7000K to 2500K, with three or more emission peaks in the wavelength range from 420 nm to 750 nm and with a continuous spectrum without being interrupted in the wavelength range from 420 nm to 780 nm.

In a twenty-fifth aspect, the phosphor mixture according to any one of the twenty-first to twenty-fourth aspects is provided, wherein a red phosphor having the emission spectrum with a peak in the wavelength range from 590 nm to 680 nm is given as a general composition formula expressed by MmAaBbOoNn:Z, (where the element M is one or more kinds of elements selected from the group consisting of Ca, Mg, Sr, Ba, and Zn, the element A is one or more kinds of elements selected from the group consisting of Al, Ga, and In, the element B is one or more kinds of elements selected from the group consisting of Si, Ge, and Sn, and the element Z is one or more kinds of elements selected from rare earth elements and transition metal elements), satisfying n=2/3m+a+4/3b−2/3o, m=1, a$\geqq$0, b$\geqq$m, n>o, o$\geqq$0).

In a twenty-sixth aspect, the phosphor mixture according to the twenty-fifth aspect is provided, wherein the red phosphor having the emission spectrum with the maximum peak in the wavelength range from 590 nm to 680 nm meets the equation of m=a=b=1, and n=3, having the composition formula expressed by $CaAlSiN_3$:Eu.

In a twenty-seventh aspect, the phosphor mixture according to any of the twenty-first to twenty-sixth aspect is provided, wherein a blue phosphor having the emission spectrum with a maximum peak in the wavelength range from 420 nm to 500 nm is one or more kinds of phosphors selected from BAM:Eu($BaMgAl_{10}O_{17}$:Eu), $(Sr,Ca,Ba,Mg)_{10}(PO_4)_6Cl_2$:Eu.

In a twenty-eighth aspect, the phosphor mixture according to any one of the twenty-first to twenty-seventh aspects is provided, wherein the phosphor mixture is composed of a phosphor having an average particle size (D50) of 1 μm or more and 50 μm or less.

In a twenty-ninth aspect, a phosphor sheet is provided, wherein the phosphor according to any one of the first to fourteenth aspects, or the phosphor mixture according to any one of the twenty-first to twenty-eighth aspects are dispersed in resin or glass.

In a thirtieth aspect, a light emission device is provided, having the phosphor according to any one of the first to fourteenth aspects and a light emission part for emitting light of a first wavelength, wherein the light of a different wavelength from the first wavelength is emitted from the phosphor, by using a part or an entire part of the light of the first wavelength as an excitation light.

In a thirty-first aspect, the light emission device is provided, having the phosphor mixture according to any one of the twenty-first to twenty-eighth aspects and the light emission part for emitting light of the first wavelength, wherein the light of the different wavelength from the first wavelength is emitted from the phosphor, by using a part or an entire part of the light of the first wavelength as an excitation light.

In a thirty-second aspect, a light emission device is provided, having the phosphor sheet of the twenty-ninth aspect and the light emission part for emitting light of the first wavelength, wherein the light of the different wavelength from the first wavelength is emitted from the phosphor, by using a part or an entire part of the light of the first wavelength as an excitation light.

In a thirty-third aspect, a light emission device according to any one of the thirtieth to thirty-second aspects is provided, wherein the first wavelength is the wavelength of 350 nm to 500 nm.

In a thirty-fourth aspect, the light emission device according to any one of the thirtieth to thirty-third aspects is provided, wherein the correlated color temperature of the light emission device is in a range from 10000K to 2000K.

In a thirty-fifth aspect, the light emission device according to anyone of the thirtieth to thirty-fourth aspects is provided, wherein the correlated color temperature of the light emission device is in a range from 7000K to 2500K.

In a thirty-sixth aspect, the light emission device according to any one of the thirtieth to thirty-fifth aspects is provided, wherein an general color rendering index Ra of the light emission device is 80 or more.

In a thirty-seventh aspect, the light emission device according to any one of the thirtieth to thirty-sixth aspects is provided, wherein a special color rendering index R15 of the light emission device is 80 or more.

In a thirty-eighth aspect, the light emission device according to any one of the thirtieth to thirty-seventh aspects is provided, wherein a special color rendering index R9 of the light emission device is 60 or more.

In a thirty-ninth aspect, the light emission device according to any one of the thirtieth to thirty-eighth aspects is provided, wherein the light emission part is a light emitting diode (LED).

In a fortieth aspect, a phosphor given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is one or more kinds of activators), satisfying 4.0<(a+b)/m<7.0, a/m$\geqq$0.5, b/a>2.5, n>o, n=2/3m+a+4/3b−2/3o.

In a forty-first aspect, the phosphor according to the fortieth aspect is provided, satisfying 0.5$\leqq$a/m$\leqq$1.5, 3.5<b/m<6.5, 0<o/m<4.0.

In a forty-second aspect, the phosphor according to the fortieth or forty-first aspect is provided, satisfying 0.8$\leqq$a/m$\leqq$1.2, 4.0$\leqq$b/m$\leqq$6.0, 0<o/m$\leqq$3.0.

In a forty-third aspect, the phosphor according to any one of the fortieth to forty-second aspects is provided, wherein the element M is one or more kinds of elements selected from the group consisting of Mg, Ca, Sr, Ba, Zn and rare earth elements having bivalent valency, the element A is one or more kinds of elements selected from the group consisting of Al, Ga, In, Tl, Y, Sc, P, As, Sb, and Bi, the element B is one or more kinds of elements selected from the group consisting of Si, Ge, Sn, Ti, Hf, Mo, W, Cr, Pb, Zr, and the element Z is one or more kinds of elements selected from the group consisting of rare earth elements and transition metal elements.

In a forty-forth aspect, the phosphor according to any one of the fortieth to forty-third aspects is provided, wherein the element M is one or more kinds of elements selected from the group consisting of Mg, Ca, Sr, Ba, Zn, the element A is one or more kinds of elements selected from the group consisting of Al, Ga, In, the element B is Si and/or Ge, and the element Z is one or more kinds of elements selected from the group consisting of Eu, Ce, Pr, Tb, and Mn.

In a forty-fifth aspect, the phosphor according to any one of the fortieth to forty-forth aspects is provided, wherein the element M is Sr, the element A is Al, the element B is Si, and the element Z is Eu and/or Ce.

In a forty-sixth aspect, the phosphor according to any one of the fortieth to forty-fifth aspects is provided, wherein when the general formula is expressed by MmAaBbOoNn:Zz, the value of z/(m+z), which is a molar ratio of the element M to the element Z, is 0.0001 or more and 0.5 or less.

In a forty-seventh aspect, the phosphor according to any one of the fortieth to forty-sixth aspects is provided, which is given as formulas expressed by: $Sr_6Al_6Si_{18}O_3N_{32}$:Ce, $SrAlSi_3ON_5$:Ce, $Sr_3Al_3Si_9O_6N_{13}$:Ce, $Sr_6Al_6Si_{24}O_3N_{40}$:Ce, $Sr_3Al_3Si_{12}O_3N_{19}$:Ce, $Sr_3Al_3Si_{12}O_6N_{17}$:Ce, $Sr_6Al_6Si_{27}O_3N_{44}$:Ce, $Sr_2Al_2Si_9O_2N_{14}$:Ce, $Sr_6Al_6Si_{27}O_{12}N_{38}$:Ce, $Sr_2Al_2Si_{10}ON_{16}$:Ce, $Sr_3Al_3Si_{15}O_3N_{23}$:Ce, $SrAlSi_5O_2N_7$:Ce, $Sr_6Al_6Si_{36}O_3N_{56}$:Ce, $SrAlSi_6ON_9$:Ce, $Sr_3Al_3Si_{18}O_6N_{25}$:Ce, $Sr_6Al_6Si_{18}O_3N_{32}$:Eu, $SrAlSi_3ON_5$:Eu, $Sr_3Al_3Si_9O_6N_{13}$:Eu, $Sr_6Al_6Si_{24}O_3N_{40}$:Eu, $Sr_3A_{13}Si_{12}O_3N_{19}$:Eu, $Sr_3Al_3Si_{12}O_6N_{17}$:Eu, $Sr_6Al_6Si_{27}O_3N_{44}$:Eu, $Sr_2Al_2Si_9O_2N_{14}$:Eu, $Sr_6Al_6Si_{27}O_{12}N_{38}$:Eu, $Sr_2Al_2Si_{10}ON_{16}$:Eu, $Sr_3Al_3Si_{15}O_3N_{23}$:Eu, $SrAlSi_5O_2N_7$:Eu, $Sr_6Al_6Si_{36}O_3N_{56}$:Eu, $SrAlSi_6ON_9$:Eu, $Sr_3Al_3Si_{18}O_6N_{25}$:Eu.

In a forty-eighth aspect, the phosphor according to any one of fortieth to forty-seventh aspects, containing Sr of 20.0 to 27.0 wt %, Al of 5.0 to 9.0 wt %, Si of 30.0 to 39.0 wt %, O of 0.5 to 6.0 wt %, N of 26.0 to 32.0 wt %, and Ce of more than 0 to 3.5 wt % or less, wherein when the phosphor is irradiated with one or more kinds of monochromatic lights or continuous lights having the wavelength range from 350 nm to 500 nm as an excitation light, a peak wavelength in the emission spectrum is in the range from 500 to 600 nm, and x of chromaticity (x, y) of the emission spectrum is in the range from 0.3500 to 0.4500, and y of the chromaticity (x, y) is in the range from 0.5000 to 0.6000.

In a forty-ninth aspect, the phosphor according to any one of the fortieth to forty-seventh aspects is provided, containing Sr of 20.0 to 27.0 wt %, Al of 5.0 to 9.0 wt %, Si of 30.0 to 39.0 wt %, O of 0.5 to 6.0 wt %, N of 26.0 to 32.0 wt %, and Eu of more than 0 to 3.5 wt % or less, wherein when the phosphor is irradiated with one or more kinds of monochromatic lights or continuous lights having the wavelength range from 350 nm to 550 nm as an excitation light, the peak wavelength of the emission spectrum is in the range from 550 to 650 nm, and x of the chromaticity of the emission spectrum (x, y) is in the range from 0.4500 to 0.6000, and y of the chromaticity of the emission spectrum (x, y) is in the range from 0.3500 to 0.5000.

In a fiftieth aspect, the phosphor according to the forty-ninth aspect is provided, wherein when the phosphor is irradiated with the monochromatic light having the wavelength range from 350 nm to 550 nm as an excitation light, the relation of $P_H$ and $P_L$ is given satisfying $(P_H-P_L)/P_H \leq 0.20$, when a peak intensity of a maximum peak in a spectrum of light emission that occurs by absorbing the excitation light that makes the peak intensity highest is defined as $P_H$, and the peak intensity of the maximum peak in the spectrum of light emission that occurs by absorbing the excitation light that makes the peak intensity smallest is defined as $P_L$.

In a fifty-first aspect, the phosphor according to any one of the fortieth to fiftieth aspects is provided, wherein in an X-ray powder diffraction pattern by CoKα ray, when the maximum peak is defined as a, b, and c, respectively, with Bragg angle (2θ) in a range from 28.5° to 29.5°, 35.5° to 36.5°, and 41.0° to 42.0°, and a peak intensity ratio of a to b is defined as I(a/b), and the peak intensity ratio of c to b is defined as I(c/b), the relation of a, b, c is given satisfying $0.20 < I(a/b), I(c/b) < 1.50$.

In a fifty-second aspect, the phosphor according to any one of the fortieth to fifty-first aspects is provided, wherein when the value of relative intensity of the maximum peak in the emission spectrum is defined as $P_{25}$ when the phosphor is irradiated with a specified monochromatic light in the wavelength range from 350 nm to 550 nm as the excitation light at 25° C., and the value of the relative intensity of the maximum peak is defined as $P_{200}$ when the phosphor is irradiated with the specified monochromatic light as the excitation light at 200° C., the relation of $P_{25}$ and $P_{200}$ is given satisfying $(P_{25}-P_{200})/P_{25} \times 100 \leq 35$.

In a fifty-third aspect, the phosphor according to any one of the fortieth to fifty-second aspects is provided, wherein the phosphor is a powdery form.

In a fifty-forth aspect, the phosphor according to the fifty-third aspect is provided, containing primary particles with particle size of 20 μm or less and aggregates in which the primary particles agglutinate, wherein an average particle size (D50) of the powdery phosphor containing the primary particles and the aggregates is 1.0 μm or more and 20.0 μm or less.

In a fifty-fifth aspect, a phosphor mixture is provided, a green phosphor given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is an element acting as an activator), satisfying $4.0 < (a+b)/m < 7.0$, $0.5 \leq a/m \leq 2.0$ m $3.0 \leq b/m \leq 7.0$, $0 < o/m \leq 5.0$, $n=2/3m+a+4/3b-2/3o$, and included therein are:

a green phosphor having an emission spectrum with a maximum peak in a wavelength range from 520 nm to 580 nm when the phosphor is irradiated with one or more kinds of monochromatic lights or continuous lights in the wavelength range from 300 nm to 420 nm as an excitation light;

one or more kinds of blue phosphors having an emission spectrum with a maximum peak in a wavelength range from 420 nm to 500 nm when the phosphor is irradiated with the excitation light in a wavelength range from 300 nm to 420 nm; and one or more kinds of red phosphors having an emission spectrum with a maximum peak in a wavelength range from 590 nm to 680 nm when being excited with the excitation light in the wavelength range from 300 nm to 420 nm.

In a fifty-sixth aspect, the phosphor mixture according to the fifty-fifth aspect is provided, wherein the green phosphor having the emission spectrum with a maximum peak in the wavelength range from 520 nm to 580 nm satisfies $0.5 \leq a/m \leq 2.0$, $4.0 \leq b/m \leq 6.0$, $0 < o/m \leq 3.0$.

In a fifty-seventh aspect, the phosphor mixture according to the fifty-fifth aspect or the fifty-sixth aspect is provided, wherein the element M is one or more kinds of elements selected from the group consisting of Ca, Mg, Sr, Ba, and Zn;

the element A is one or more kinds of elements selected from the group consisting of Al, Ga, and In;

the element B is one or more kinds of elements selected from the group consisting of Si, Ge, and Sn; and the element Z is one or more kinds of elements selected from rare earth elements and transition metal elements.

In a fifty-eighth aspect, the phosphor mixture according to any one of the fifty-fifth to fifty-seventh aspects is provided, wherein the element Z is Ce.

In a fifty-ninth aspect, the phosphor mixture is provided, wherein when emission intensity of each phosphor constituting a mixture at a temperature of 25° C. when being excited by a specified excitation light in the wavelength range from 300 nm to 420 nm is defined as $P_{25}$, and the emission intensity at a temperature of 200° C. when being excited by said specified excitation light is defined as $P_{200}$, $((P_{25}-P_{200})/P_{25}) \times 100 \leq 30$.

In a sixtieth aspect, the phosphor mixture according to any one of the fifty-fifth to fifty-ninth aspects is provided, wherein in the emission spectrum under excitation of the excitation light in a range from 300 nm to 420 nm, a correlated color temperature is in a range from 7000K to 2000K, with three or more emission peaks in the wavelength range from 420 nm to 780 nm and with a continuous spectrum without being interrupted in the wavelength range from 420 nm to 780 nm.

In a sixty-first aspect, the phosphor mixture according to any one of the fifty-fifth to sixtieth aspects is provided, wherein the red phosphor having an emission spectrum with a maximum peak in the wavelength range from 590 nm to 680 nm is expressed by a composition formula of MmAaBbOoNn:Z (where the element M is one or more kinds of elements selected from the group consisting of Ca, Mg, Sr, Ba, and Zn, the element A is one or more kinds of elements selected from the group consisting of Al, Ga, and In, the element B is one or more kinds of elements selected from the group consisting of Si, Ge, and Sn, and the element Z is one or more kinds of elements selected from rare earth elements and transition metal elements, satisfying n=2/3m+a+4/3b−2/o, m=1, a≧0, b≧m, n>0, o>0).

In a sixty-second aspect, the phosphor mixture according to any one of the fifty-fifth to sixty-first aspects is provided, wherein the red phosphor having an emission spectrum with a maximum peak in the wavelength range from 590 nm to 680 nm meets the equation of m=a=b=1, and n=3, having a composition formula of $CaAlSiN_3$:Eu.

In a sixty-third aspect, the phosphor mixture according to any one of the fifty-fifth to sixty-second aspects is provided, wherein the blue phosphor having an emission spectrum with a maximum peak in the wavelength range from 420 nm to 500 nm is one or more kinds of phosphor selected from BAM:Eu ($BaMgAl_{10}O_{17}$:Eu), $(Sr,Ca,Ea,Mg)_{10}(PO_4)_6Cl_2$:Eu.

In a sixty-forth aspect, the phosphor mixture according to any one of the fifty-fifth to sixty-third aspects is provided, wherein an average particle size (D50) of each phosphor containing the primary particle and the aggregates is 1.0 or more and 20.0 μm or less.

In a sixty-fifth aspect, a phosphor is provided, which is given as a general composition formula expressed by MmAaBbOoNn:Z, (where element M is one or more kinds of elements having bivalent valency, element A is one or more kinds of elements having tervalent valency, element B is one or more kinds of elements having tetravalent valency, O is oxygen, N is nitrogen, and element Z is one or more kinds of activators), satisfying 4.0<(a+b)/m<7.0, n>o, 1.2<a/m≦2.0, 3.0≦b/m≦4.5, 0<o/m≦1.5, n=2/3m+a+4/3b−2/3o, and when the phosphor is irradiated with light with a wavelength range form 300 nm to 500 nm, a peak wavelength in an emission spectrum is in a range from 500 nm to 600 nm.

In a sixty-sixth aspect, the phosphor according to the sixty-fifth aspect is provided, wherein the element M is one or more kinds of elements selected from the group consisting of Mg, Ca, Sr, Ba, and Zn, the element A is one or more kinds of elements selected from the group consisting of Al, Ga, and In, the element B is Si and/or Ge, and the element Z is one or more kinds of elements selected from the group consisting of Eu, Ce, Pr, Tb, Yb, and Mn.

In a sixty-seventh aspect, the phosphor according to the sixty-fifth or sixty-sixth aspect is provided, wherein the element M is Sr, the element A is Al, the element B is Si, and the element Z is Ce.

In a sixty-eighth aspect, the phosphor according to any one of the sixty-fifth to sixty-seventh aspect is provided, wherein when the general formula is expressed by MmAaBbOoNn:Zz, the value of z/(m+z), which is a molar ratio of the element M to the element Z, is not less than 0.0001 and not more than 0.5.

In a sixty-ninth aspect, the phosphor according to any one of the sixty-fifth to sixty-eighth aspects is provided, wherein when the value of relative intensity of the maximum peak in the emission spectrum is defined as $P_{25}$ when the phosphor is irradiated with a specified monochromatic light in the wavelength range from 300 nm to 500 nm as the excitation light at 25° C., and the value of the relative intensity of the maximum peak is defined as $P_{100}$ when the phosphor is irradiated with the specified monochromatic light as the excitation light at 100° C., the relation of $P_{25}$ and $P_{100}$ is given satisfying $(P_{25}-P_{100})/P_{25} \times 100 \leq 10$.

In a seventieth aspect, the phosphor according to any one of the sixty-fifth to sixty-ninth aspects is provided, containing primary particles with particle size of 50 μm or less and aggregates in which the primary particles agglutinate, wherein an average particle size (D50) of the powdery phosphor containing the primary particles and the aggregates is 1.0 or more and 50.0 μm or less.

Advantage of the Invention

The phosphor according to any one of the first to tenth aspects has emission spectra with a broad peak in the range from green color to yellow color, or yellow color to red color, has a broad flat excitation band in the range from the near ultraviolet/ultraviolet to blue color, and has an improved emission intensity and luminance, and also has an excellent durability against heat and water.

The phosphor according to the eleventh aspect has a flat excitation band in the wavelength range from 350 nm to 500 nm. Therefore, even if there is a slight variation in the emission wavelength of the near ultraviolet/ultraviolet LED and the blue LED used as an excitation light of the one chip type white LED, disruption of balance in the emission intensity of each color does not occur, thereby allowing stable manufacture of the white LED illumination of the same color tone. Therefore, the phosphor of the eleventh aspect has a merit not only in quality but also in manufacturing cost.

The phosphor according to the twelfth aspect has a high emission intensity and a high luminance even at a high temperature of 200° C. Therefore, even when coated on an LED chip, which is considered to become high temperature at light emitting, the emission intensity and the luminance are not lowered, thereby allowing high luminance one chip type white LED illumination to be obtained. In addition, there is little change in emission characteristics due to heat, and therefore the design of the emission color of the white LED illumination becomes easy.

According to the phosphor of the thirteenth aspect or the fourteenth aspect, the phosphor thus obtained is in a powdery state, thereby allowing the phosphor to be coated on various places as a paste. In addition, the phosphor has a particle size of 1.0 μm to 50.0 μm, and more preferably has a particle size of 1.0 μm to 20.0 μm thereby allowing the coating density to be increased, to make it possible to obtain a coated film with high emission intensity and luminance and less fluctuation of color.

According to a method of manufacturing the phosphor according to any one of the fifteenth aspect to twentieth aspect, the phosphor according to any one of the first aspect to twelfth aspect can be manufactured at inexpensive manufacturing cost.

According to the phosphor mixture of any one of the twenty-first aspect to twenty-eighth aspect, when being irradiated with a specified excitation light, the phosphor mixture can efficiently emit light such as a white color with excellent luminance and color rendering properties.

According to the phosphor sheet of the twenty-ninth aspect, by combining this phosphor sheet and various light emission parts, various light emission devices can be easily manufactured.

According to the light emission device of anyone of the thirtieth to thirty-ninth aspects, a high-efficiency light emission device having a desired emission color and high emission intensity and luminance can be obtained.

The phosphor according to any one of the fortieth to forty-ninth aspects has emission spectra with a broad peak in the range from green color to yellow color, or yellow color to red color, has a broad flat excitation band in the range from the near ultraviolet/ultraviolet to blue color, and has an improved emission intensity and luminance, and also has an excellent durability against heat and water.

The phosphor according to the fiftieth aspect has a flat excitation band in the wavelength range from 350 nm to 550 nm. Therefore, even if there is a slight variation in the emission wavelength of the near ultraviolet/ultraviolet LED and the blue LED used as an excitation light of the one chip type white LED, disruption of balance in the emission intensity of each color does not occur, thereby allowing stable manufacture of the white LED illumination of the same color tone. Therefore, the phosphor of the fiftieth aspect has a merit not only in quality but also in manufacturing cost.

The phosphor according to the fifty-second aspect has a high emission intensity and a high luminance even at a high temperature of 200° C. Therefore, even when coated on an LED chip, which is considered to become high temperature at light emitting, the emission intensity and the luminance are not lowered, thereby allowing high luminance one chip type white LED illumination to be obtained. In addition, there is little change in emission characteristics due to heat, and therefore the design of the emission color of the white LED illumination becomes easy.

According to the phosphor of the fifty-third or fifty-forth aspect, the phosphor thus obtained is in a powdery state, thereby allowing the phosphor to be coated on various places as a paste. In addition, the phosphor has a particle size of 1.0 μm to 20.0 μm, thereby allowing the coating density to be increased, to make it possible to obtain a coated film with high emission intensity and luminance.

According to the phosphor mixture of any one of the fifty-fifth to sixty-forth aspects, when being irradiated with a specified excitation light, the phosphor mixture efficiently emits light and emits light such as a white color having excellent luminance and color rendering properties.

The phosphor according to any one of the sixty-fifth to seventieth aspects is a green phosphor that has an excellent initial emission characteristics by having a flat excitation band in a range from the near-ultraviolet/ultraviolet to blue color, and a broad emission spectrum with an emission peak in the vicinity of the wavelength from 500 nm to 600 nm which can gain the luminance, and has an excellent heat resistance property and allows almost no deterioration to occur in emission characteristics even under a high temperature environment as compared to an environment of a room temperature (25° C.).

BEST MODE FOR CARRYING OUT THE INVENTION

Preferred embodiments of the present invention will be explained hereunder. However, the present invention is not limited thereto.

A phosphor of the present invention is the phosphor having a matrix composition given by a general formula expressed by $M_mA_aB_bO_oN_n$:Z. Here, element M is one or more kinds of elements selected from the elements having bivalent valency in the phosphor. Element A is one or more kinds of elements having tervalent valency in the phosphor, element B is one or more kinds of elements having tetravalent valency in the phosphor, O is oxygen, N is nitrogen, and element Z is an element acting as an activator in the phosphor and one or more kinds of elements selected from rare earth elements or transition metal elements.

Further, in the phosphor, $(a+b)/m$ is in a range satisfying $4.0 < (a+b)/m < 7.0$, $a/m$ is in a range satisfying $a/m \geq 0.5$, $b/a$ is in a range satisfying $b/a > 2.5$, oxygen and nitrogen has a relation satisfying $n > o$, and nitrogen is expressed by $n = 2/3m + a + 4/3b - 2/3o$, and when being excited by light with a wavelength range of from 300 nm to 500 nm, the phosphor has an emission spectrum with a peak wavelength from 500 nm to 650 nm.

The phosphor of the present invention having the aforementioned characteristics has an emission spectrum with a broad peak in a range from green color to yellow color, or yellow color to red color, and has a flat excitation band in the broad range from near ultraviolet/ultraviolet to blue color (wavelength range from 300 nm to 500 nm), and is capable of obtaining a high-efficiency emission. Therefore, by mixing a phosphor and the phosphor of suitable other color, and combining the phosphor thus mixed and an emission part such as the near ultraviolet/ultraviolet LED and the blue LED and so forth, a high-efficiency light emission device having an excellent color rendering property, a desired emission color and high emission intensity and luminance can be obtained.

The phosphor of the present invention has a stronger emission intensity, high luminance, and a broad peak of the emission spectrum, compared with a silicon nitride-based phosphor (for example see patent document 1) and a sialon-based phosphor (for example, see patent documents 2, 3, and 4), and oxynitride phosphor (for example, see patent documents 5 and 6). Therefore, the white LED illumination with further high luminance can be manufactured.

The phosphor of the present invention has the same constituent element as the sialon-based phosphor. However, when expressed by the general formula $M_mA_aB_bO_oN_n$:Z, the sialon-based phosphor meets the formula of $(a+b)/m > 12/1.5 = 8$. Moreover, as the element M that intrudes into a sialon matrix structure, only the element with small ionic radius such as Ca and Y enters therein, and Sr with larger ionic radius than Ca and Y does not enter the matrix structure, and therefore the sialon-based phosphor has a composition different from the phosphor of the present invention wherein Sr is indispensable as the element M.

The excitation band of the present invention has a broad range, and therefore it becomes possible to suppress change in color tone due to variation in emission elements (blue LED), differently from YAG:Ce phosphor. In addition, the phosphor of the present invention has a high-efficiency excitation band even in the vicinity of the wavelength from 300 nm to 420 nm, which is an emission wavelength of the near ultraviolet/ultraviolet LED. Accordingly, the phosphor of this embodiment can also be used as a green color phosphor of the white LED illumination by combining not only with the blue color emitting LED, but also with the red color, blue color, and other color phosphors and combining with the near ultraviolet/ultraviolet emitting LED. Particularly, when the phosphor is irradiated with the excitation light of monochromatic color in the wavelength range from 350 nm to 500 nm, the phosphor activated by Eu as an activator has a significantly flat excitation band, wherein the relation is expressed by $(P_H-P_L)/P_H \times 100 \leq 20$, more preferably expressed by $(P_H-_L)/P_H \times 100 \leq 10$, when the peak intensity of a maximum peak is defined as $P_H$ when the phosphor is irradiated with the excitation light whereby the peak intensity of the maximum peak in the spectrum of the light emission obtained by absorbing the excitation light is made to be largest, and the peak intensity of the maximum peak is defined as $P_L$ when the phosphor is irradiated with the excitation light whereby the peak intensity of the maximum peak in the spectrum of the light emission obtained by absorbing the excitation light is made to be smallest.

The emission wavelength is different depending on the activator, however when the phosphor is activated by Ce as a typical activator, the phosphor having the emission spectrum with a broad peak of a half value width of 100 nm or more in a wavelength range from 470 nm to 750 nm which is in the range of green color to yellow color, and when activated by Eu, the phosphor having the emission spectrum with a peak in the range from yellow color to red color can be obtained. Therefore, the phosphor thus activated by Ce can be used by replacing the YAG:Ce phosphor, or the ZnS:Cu, Al phosphors presently used as phosphors capable of overcoming problems thereof. Further, the phosphor activated by Eu can be used for the white LED illumination as a different substance from the red phosphors such as $Ca_2Si_5N_8$:Eu, $Sr_2Si_5N_8$:Eu, $Ba_2Si_5N_8$:Eu, $Ca_x(Al, Si)_{12}(O, N)_{16}$:Eu (However, satisfying $0<x \leq 1.5$), $CaAl_2Si_4N_8$:Eu, $CaSiN_2$:Eu, $CaAlSiN_3$:Eu, which have been developed in recent years for improving color rendering properties of the white LED illumination.

In addition, the phosphor of the present invention has an excellent durability against heat and water. Although the conventional ZnS:Cu,Al phosphor having the emission spectrum with a peak in the range from green color to yellow color has no problem in regard to the emission intensity and luminance, problems involved therein are that the ZnS:Cu,Al phosphor has no durability, particularly being weak in water, and further, the luminance are largely deteriorated by exposure to ultraviolet. Therefore, when the white LED illumination is manufactured by mixing the ZnS:Cu,Al phosphor and the phosphors of plural colors and by combining with the near ultraviolet/ultraviolet LED, such a white LED illumination has the problem that when used for a long period of time, particularly the emission intensity and luminance of the ZnS:Cu,Al phosphor are deteriorated, resulting in changing in color tone. In addition, when turning on the light of the white LED illumination, the emission intensity and luminance of the ZnS:Cu,Al phosphor are deteriorated due to the heat or ultraviolet generated from the emission element, thereby also deteriorating the luminance of the white LED illumination accordingly. As a result, the ZnS:Cu,Al phosphor is required to adjust phosphor mixed powder in consideration of the change in the emission intensity and luminance due to temperature, making it difficult to manufacture the white LED illumination with stable quality. However, the phosphor of this embodiment is the phosphor containing nitrogen, having durability, and strong against change in temperature and moisture in the same way as the silicon nitride phosphor and the sialon-based phosphor, and therefore the white LED illumination having high luminance and excellent durability can be manufactured.

Next, explanation will be given to a case in which the emission with high color rendering properties can be obtained by using the phosphor of this embodiment.

Preferably, the way of looks of the color is the same as in the case of using a reference light. However, the reference light has a white light source having uniform intensity of the light over the whole visible light region. Meanwhile, the existing white LED illumination lacks in uniformity in the intensity of the light. For example, the intensity of the light is high in a certain wavelength region of the visible light, and low in a certain wavelength region. Therefore, in the wavelength region where the intensity of the light is insufficient, color reproducing properties are deteriorated, and the color rendering properties are deteriorated.

After all, in order to obtain the emission with high color rendering properties, the phosphor used for the white LED illumination needs to have an emission spectrum with a broad peak, and the phosphor needs to have a sufficient emission intensity. With the phosphor of the present invention having the aforementioned matrix composition, the phosphor having a high emission intensity and luminance in the range from green color to yellow color, or from yellow color to red color, and having an emission spectrum with a broad peak of not less than 80 nm half value width can be obtained by changing the kind of the constituent element and the kind of the activator.

Detailed reason remains unknown for the fact that the phosphor of the present invention has the emission spectrum with a broad peak in the range from the green color to yellow color and from yellow color to red color, has the flat excitation band in the wavelength range from the near ultraviolet/ultraviolet to blue color, and is capable of emitting light with high efficiency. However, it can be considered as follows.

First, it can be considered that in the general formula MmAaBbOoNn:Z of the phosphor according to the present invention, when the values of m, a, b, o, and n are in the range of $4.0<(a+b)/m<7.0$, $a/m \geq 0.5$, $b/a>2.5$, $n>o$, $n=2/3m+a+4/3b-2/3o$, the activator can exist regularly in a crystal structure of the phosphor, an excitation energy used for emitting light can be efficiently transferred, and an emission efficiency is thereby improved.

Further, with the aforementioned constituent of the phosphor, it can be considered that the phosphor has chemically stable composition, therefore an impurity phase not contributing to emitting light is hardly generated in the phosphor, and the reduction in the emission intensity is thereby suppressed. Namely, it can be considered that when plural impurity phases are generated, a phosphor amount per unit area is reduced, and further the impurity phase thus generated absorbs the excitation light and the light generated from the phosphor, therefore the emission efficiency of the phosphor is deteriorated, and the high emission intensity can not be obtained.

The aforementioned consideration is supported by the fact that when the values of m, a, b, o, and n are in the aforementioned range in an X-ray diffraction measurement for the phosphor after firing, an X-ray diffraction peak due to the impurity phase of an unreacted raw material such as AlN, and $Si_3N_4$, and the X-ray diffraction peak due to the impurity phase different from the phase contributing to emitting light are not confirmed, or even when confirmed, a significantly low diffraction intensity is observed. Meanwhile, when the values of m, a, b, o, and n are outside the aforementioned range, a remarkable X-ray diffraction peak of the phase of the AlN Si$_3$N$_4$ and the phase different from the phase contributing to emitting light is confirmed. Therefore, it can be considered that the characteristic that the X-ray diffraction peak due to the aforementioned impurity phase is not observed in the X-ray diffraction pattern for the phosphor after firing, shows that the phosphor to be measured has a high emission intensity and a flat excitation band over the range from the near ultraviolet/ultraviolet color to blue color.

In the phosphor of the present invention, the general formula is given as M$_m$A$_a$B$_b$O$_o$N$_n$:Z, where preferably the values of m, a, b, o, and n are given satisfying $4.0<(a+b)/m<7.0$, $a/m \geq 0.5$, $b/a>2.5$, $n>o$, $n=2/3m+a+4/3b-2/3o$, further preferably satisfying $0.5 \leq a/m \leq 2.0$, $3.0<b/m<7.0$, $0<o/m \leq 4.0$, and still further preferably $0.8 \leq a/m \leq 1.5$, $3.0<b/m<6.0$, $0<o/m \leq 3.0$. This is because in a case of $a/m=0$, oxygen and Si contained in the raw material are excessively reacted during firing, resulting in being vitrified, thus making it impossible to obtain excellent emission characteristics and powdery phosphor.

Meanwhile, in a case of $a/m \neq 0$, Al is solid-solubilized and a melting point of a generated compound becomes extremely high. Therefore, even when firing is performed, a vitrification does not occur, and a powdery phosphor can be obtained after firing. Accordingly, it is preferable to set the value of a/m at 0.5 or more.

Further, in a case of $1.1<a/m$, the emission characteristics under an environment of a high temperature are hardly deteriorated, as compared to a case of the aforementioned range. Further, even when the emission intensity (25° C.) before increasing the temperature up to 300° C. and the emission intensity after holding for 5.0 minutes at 300° C. and cooling down to a room temperature (25° C.) again are compared, an excellent heat resistance property, i.e., that the emission intensity after the cooling is not deteriorated as compared to an emission intensity of before increasing the temperature, is expressed.

In a case of $a/m \leq 2.0$, a site of the element B to be replaced with the element A is prevented from being excessive, thus making it possible to prevent the emission efficiency from deteriorating due to a variation of manufacturing conditions, and suppress the deterioration of the emission characteristics even when this phosphor is placed under a high temperature environment. Further, with this constituent, an unreacted AlN generation can be suppressed, and the deterioration of an initial emission intensity due to this unreacted AlN can be prevented. In addition, if the value of "b" is larger than the value of "a", the sintering is suppressed and a powdery phosphor can be easily obtained after firing. Therefore, it is preferable to set the range of b/m in the range of $3.0 \leq b/m \leq 6.0$ which is larger than a/m, and is more preferable to set it in the range of $3.5 \leq b/m \leq 4.5$.

Preferably, the phosphor of the present invention contains oxygen, although satisfying $n>o$. An appropriate content of the oxygen is changed depending on the molar ratio of Al and Si in the phosphor. However, by optimizing this oxygen content, the initial emission characteristic (25° C.) of the phosphor is improved and also the phosphor, whose emission characteristic is hardly deteriorated even under a high temperature environment as compared to a case of a room temperature (25° C.), can be obtained. This is because even if trying to improve the temperature characteristic, a crystal structure is deviated from the structure suitable for light emission even when the Si site is simply replaced with Al, because the ionic radius of the Al is different from that of Si. Further, Si is tetravalent valency while Al is tervalent valency, thus involving a problem that the valency in a crystal becomes unstable. However, when a part of an N sites is replaced with O in accordance with an amount of Al for replacing the Si site, the crystal structure suitable for light emission can be obtained and further, the valency of an entire body of a matrix crystal structure can be set to stable zero, and therefore it can be considered that excellent emission characteristics can be exhibited. Here, a preferable range of an amount of oxygen is $0<o/m \leq 4.0$, and when oxygen content in the phosphor after firing is analyzed, a sufficiently practical phosphor with excellent emission characteristics and suppressing vitrification is realized, provided that the oxygen content is in a range of more than 0.5 wt % to less than 8.1 wt % relative to amass of the phosphor. Further, when the amount of the oxygen is in a range of $0<o/m \leq 3.0$ and more preferably in a range of $0<o/m \leq 1.5$, i.e. in a range of more than 0.5 wt % to less than 5.0 wt %, the emission intensity is further improved and this is preferable.

The reason for a slightly different value between the value of o calculated by a result of composition analysis, and the value of o calculated by the mixing ratio of the raw material to be used, which are compared with each other, is considered to be that the oxygen initially contained in the raw material and the oxygen adsorbed to the surface, the oxygen mixed therein by oxidization of the surface of the raw material at measuring, mixing, and firing the raw material, and further the oxygen adsorbed on the surface of the phosphor after firing, are not taken into consideration. In addition, the reason is considered in such a way that when firing is performed in an atmosphere containing nitrogen gas and/or ammonia gas, the raw material is nitrided during firing and deviation occurs in the amount of o and amount of n.

Further, in the phosphor having the composition expressed by the aforementioned general formula M$_m$A$_a$B$_b$O$_o$N$_n$:Z, element M is one or more kinds of elements having +II valency, element A is one or more kinds of elements having +III valency, element B is one or more kinds of elements having +IV valency, and nitrogen is one or more kinds of elements having −III valency. Therefore, the values of m, a, b, o, and n are the composition expressed by $n=2/3m+a+4/3b-2/3o$, and the value obtained by adding the valency of each element becomes zero, and preferably the phosphor thus described serves as a further stable compound. Particularly, in this phosphor, when a/m is in a range of $1.1<a/m \leq 1.5$, b/m is in a range of $3.5 \leq b/m \leq 4.5$, and o/m is in a range of $0<o/m \leq 1.5$, the emission characteristics and the heat resistance are further improved and this is preferable constituent. In any case, slight deviation in composition from a composition formula showing the composition of the phosphor is allowable.

Meanwhile, preferably the element M is one or more kinds of elements selected from a group consisting of Mg, Ca, Sr, Ba, Zn, and rare earth elements having bivalent valency, further preferably is one or more kinds of elements selected from a group consisting of Mg, Ca, Sr, Ba, and Zn, and most preferably is Sr. Further, 90% or more of Sr is contained as the element M, and a part of the element M may by replaced by the aforementioned other elements.

Preferably the element A is one or more kinds of elements selected from a group consisting of Al, Ga, In, Tl, Y, Sc, P, As, Sb, and Bi, further preferably is one or more kinds of elements selected from a group consisting of Al, Ga, and In, and most preferably is Al. Further, 90% or more of Al is contained as the element A, and a part of the element A may be replaced by the aforementioned other elements. In regard to the Al, preferably AlN, which is a nitride, is used as a general heat-transfer material and a structural material, and easily available at an inexpensive cost, and brings small environmental loading, and this is preferable.

Preferably the element B is one or more kinds of elements selected from a group consisting of Si, Ge, Sn, Ti, Hf, Mo, W, Cr, Pb, and Zr, further preferably is Si and/or Ge, and most preferably is Si. Further, 90% or more of Si is contained as the element B, and a part of the element B may be replaced by the aforementioned other element. In regard to the Si, preferably $Si_3N_4$, which is a nitride, is used as a general heat-transfer material and a structural material, and easily available at an inexpensive cost, and brings small environmental loading, and this is preferable.

The element Z is one or more kinds of elements selected from rare earth elements or transition elements mixed in the form of replacing a part of the element M in the matrix structure of the phosphor. From the viewpoint of exerting a sufficient color rendering property for various light sources including the white LED illumination using the phosphor of the present invention, it is preferable for the phosphor to have a broad half width value of the peak in the emission spectrum. From this viewpoint, preferably, the element Z is one or more kinds of elements selected from a group consisting of Eu, Mn, Ce, Tb, Pr, and Yb. Among these elements, when Ce is used as the element Z, the phosphor shows the emission spectrum with broad and high in emission intensity in the range from green color to yellow color, and therefore Ce is preferable as an activator of each kind of light source including the white LED illumination.

Although a silicon nitride-based phosphor, a sialon-based phosphor, and oxynitride phosphor of patent documents 1 to 6 proposed heretofore emit light from green color to yellow color by activating with Ce, the emission intensity is significantly deteriorated compared with a case in which the same matrix is activated by Eu, thus making it impossible to be practically used. However, the present invention provides the phosphor of a proper composition to obtain the emission spectrum with a peak in a broad range and high in emission intensity, and therefore is capable of obtaining the emission intensity of not less than 1.5 times that of the phosphor of each patent document, having the characteristic of sufficiently being put to practical use. Further, when the white LED illumination is manufactured by the near ultraviolet/ultraviolet LED, the phosphor of the present invention has a significantly broad peak in the emission spectrum compared to ZnS:Cu,Al used as a green phosphor, and therefore the white LED illumination improved in efficiency and excellent in color rendering property can be manufactured. Further, a noteworthy point is that even when the matrix is activated by Eu, the emission intensity is not deteriorated, showing the emission spectrum with a peak in a broad range and high in the emission intensity from yellow color to red color.

Moreover, by selecting the element Z, the peak wavelength of light emission performed by the phosphor of the present invention can be changed, and also by co-activating the different kind of element Z, the peak wavelength can be changed and further by a sensitization action, the emission intensity and the luminance can be improved.

An amount of the element Z to be added is preferably in the range of not less than 0.0001 and not more than 0.50 in a molar ratio $z/(m+z)$ of the element M and the element Z as an activator, when the general formula of the phosphor of the present invention is expressed by the general formula $M_mA_aB_bO_oN_n:Z_z$ (satisfying $4.0<(a+b)/m<7.0$, $a/m \geq 0.5$, $b/a>2.5$, $n>o$, $n=2/3m+a+4/3b-2/3o$). When the molar ratio $z/(m+z)$ of the element M and the element Z is in the aforementioned range, thereby preventing the deterioration in the emission efficiency by concentration quenching generated due to an excessive content of the activator (element Z), and meanwhile, the element contributing emitting light becomes deficient due to too small content of the activator (element Z), and the emission efficiency is thereby prevented from deteriorating. Further, it is preferable to set the value of the $z/(m+z)$ within the range of not less than 0.001 and not more than 0.30. However, an optimal value of the range of the value of $z/(m+z)$ is slightly fluctuated by the kind of the activator (element Z) and the kind of the element M. Further, by controlling the amount of the activator (element Z) to be added, the peak wavelength of the light emission of the phosphor can be shifted and set, which is useful for adjusting the luminance in the light source thus obtained.

In addition, when Sr was selected as the element M, and Al was selected as the element A, Si was selected as the element B, and Ce was selected as the element Z, satisfying $4.0<(a+b)/m<7.0$, $0.5 \leq a/m \leq 2.0$, $3.0<b/m \leq 7.0$, $0<o/m \leq 4.0$, $n=2/3m+a+4/3b-2/3o$, the weight ratio of the element constituting the aforementioned phosphor was obtained by elemental analysis, such as Sr of 19.5 wt % to 29.5 wt %, Al of 5.0 wt % to 16.8 wt %, o of 0.5 wt % to 8.1 wt %, N of 22.6 wt % to 32.0 wt %, and Ce of more than 0.0 to 3.5 wt % or less. However, error of ±1.0 wt % for Sr and Al is estimated and the remaining weights are Si and other elements. Note that from the viewpoint of preventing the deterioration in the emission intensity of the phosphor, the concentration of each element of Fe, Ni, and Co in the phosphor is preferably 100PPM or less.

When the phosphor is irradiated with one or more kinds of monochromatic lights or mixed light of the monochromatic lights having the wavelength range from 350 nm to 500 nm as an excitation light, the peak wavelength of the emission spectrum was in the range from 500 to 600 nm. At this time, the phosphor exhibited a sufficient emission intensity and exhibited a preferable emission characteristic of having a chromaticity (x, y) of the emission spectrum, with x in the range from 0.3000 to 0.4500, and y in the range from 0.5000 to 0.6000.

In addition, when Sr was selected as the element M, and Al was selected as the element A, Si was selected as the element B, and Eu was selected as the element Z, satisfying $4.0<(a+b)/m<7.0$, $0.5 \leq a/m \leq 2.0$, $3.0<b/m<7.0$, $0<o/m \leq 4.0$, $n=2/3m+a+4/3b-2/3o$, the weight ratio of the element constituting the aforementioned phosphor was obtained by elemental analysis, such as Sr of 19.5 wt % to 29.5 wt %, Al of 5.0 wt % to 16.8 wt %, 0 of 0.5 wt % to 8.1%, N of 22.6 wt % to 32.0 wt %, and Eu of more than 0.0 to 3.5 wt % or less. However, error of ±1.0 wt % for Sr and Al is estimated and the remaining weights are Si and other elements.

Note that from the viewpoint of preventing the deterioration of the emission intensity of the phosphor, the concentration of each element of Fe, Ni, and Co in the phosphor is preferably 100PPM or less. In addition, when the phosphor is irradiated with one or more kinds of monochromatic lights or mixed light of the monochromatic lights having the wavelength range from 350 nm to 500 nm as an excitation light, the peak wavelength of the emission spectrum was in the range from 550 to 650 nm. At this time, the phosphor exhibited a sufficient emission intensity and exhibited a preferable emission characteristic of having a chromaticity (x, y) of the emission spectrum, with x in the range from 0.4500 to 0.6000, and y in the range from 0.3500 to 0.5000.

When a powder X-ray diffraction pattern measurement by Co Kα ray is performed for the phosphor according to the present invention, the following characteristic is observed.

A product phase contained in the phosphor of the present invention has characteristic peaks in a Bragg angle (2θ) ranges of 12.5 to 13.5°, 17.0 to 18.0°, 21.0 to 22.0°, 22.5 to 23.5°, 26.5 to 27.5°, 28.5 to 29.5°, 34.0 to 35.0°, 35.5 to 36.5°, 36.5 to 37.5°, 41.0 to 42.0°, 42.0 to 43.0°, 56.5 to 57.5°, and 66.0 to 67.0°. From this diffraction pattern, it appears that the phosphor has a main production phase with a crystal system of a orthorhombic crystal or a monoclinic crystal. The crystal system with a sialon as a matrix is generally a hexagonal crystal, and therefore the phosphor according to the present invention is considered to have the crystal system different from a publicly known phosphor with sialon as the matrix.

Next, the temperature characteristic of the phosphor of the present invention will be explained. In some cases, the phosphor is used, not only as the white LED illumination, under high temperature environment. Accordingly, when the phosphor whose emission intensity is deteriorated in association with an increase of the temperature, and whose emission characteristic is deteriorated in association with thermal deterioration, such a phosphor is not preferable.

The phosphor according to the present invention exhibits excellent temperature characteristics and heat resistance, and when the value of relative intensity of the maximum peak in the emission spectrum is defined as $P_{25}$ when the phosphor is irradiated with a specified monochromatic light or mixed light of the monochromatic lights in the wavelength range from 300 nm to 500 nm as the excitation light at 25° C., and the value of the relative intensity of the maximum peak is defined as $P_{200}$ when the phosphor is irradiated with the excitation light at 200° C., the relation of $P_{25}$ and $P_{200}$ is given satisfying $(P_{25}-P_{200})/P_{25} \times 100 \leqq 35$, thus showing excellent emission characteristics even under a high temperature environment. Further preferably, when the value of the relative intensity of the maximum peak at 100° C. is defined to be $P_{100}$, the relation of $P_{25}$ and $P_{100}$ is expressed by $(P_{25}-P_{100})/P_{25} \times 100 \leqq 10.0$.

In addition, when a heat generation temperature of the LED was examined by the inventors of the present invention, it was found that although the temperature was about 50° C. in a small-sized and small current type chip, heat generation occurs up to 80° C. when a large-sized and large current type chip is used to obtain further strong emission. Further, in a case of the white LED, it was found that the generated heat was accumulated by sealing of the chip by resin and a lead frame structure, and the temperature of the resin or the phosphor mixture part became about 100° C. and 200° C. at maximum. Namely, when the relation of $P_{25}$ and $P_{200}$ satisfies $(P_{25}-P_{200})/P_{25} \times 100 \leqq 35$, further preferably $(P_{25}-P_{100})/P_{25} \times 100 \leqq 10.0$, a color shift of the emission due to this heat generation can be suppressed to a level not involving problem as the white LED illumination, even if the heat generation that occurs with lighting the LED, being an emission light source, for a long period of time, is accumulated.

The phosphor according to the present invention has high temperature materials, as a matrix, such as nitride and oxynitride with excellent durability at high temperature generated from AlN and $Si_3N_4$, and a tetrahedral ($SiN_4$) is assembled into a network, thus producing a different structure from the conventional nitride and oxynitride phosphor, and an Al replacement amount of the Si site and an O replacement amount of the N site are optimized. Therefore, an extremely stable structure against heat is realized, thus exhibiting an excellent temperature characteristic. Further, in the phosphor according to the conventional technique, when used once at a high temperature environment, there is a problem that the emission intensity becomes lower than the emission intensity before being used under a high temperature environment even when being returned to a room temperature. However, the phosphor of the present invention can solve this problem.

In addition, since the light emission device of the present invention has excellent temperature characteristics, the phosphor hardly allowing the color shift to occur even when the temperature of the light emission device is increased, can be manufactured. The phosphor of the present invention has the emission spectrum with a peak in the range from green color to yellow color, having a broad peak form, and therefore it is preferable as phosphor for the white LED illumination from the viewpoint of color rendering properties. Further, the excitation band is flat in the broad range of near ultraviolet/ultraviolet to blue green color (wavelength range from 300 to 500 nm). Therefore, the phosphor of the present invention provides a state close to a maximum emission intensity even incase of the white LED illumination of a system to obtain white color by utilizing a complementary relation between a blue light emission of the high luminance blue LED (in the vicinity of the wavelength from 420 to 480 nm) and yellow light emission of the phosphor proposed as the one chip type white LED illumination, or the case of the white LED illumination of the system obtaining white color by utilizing the mixed state of colors of the light obtained from the phosphors of R, G, and B, and other colors by combining the LED emitting light of near ultraviolet/ultraviolet (in the vicinity of the wavelength of 300 to 420 nm), red color (R) emitting phosphor excited by the near ultraviolet/ultraviolet light generated from the LED, green color (G) emitting phosphor, and blue color (B) emitting phosphor. Namely, by combining the emission part emitting light from the near ultraviolet/ultraviolet to blue color and the phosphor, the white light source and the white LED illumination with high output and improved color rendering properties, and further an illumination unit using the same can be obtained.

By forming the phosphor of the present invention in a powdery state, the phosphor can be easily applied to various light sources including the white LED illumination. Here, when the phosphor is used in a powdery state, preferably the phosphor contains primary particles with particle size of 50 μm or less and aggregates in which the primary particles agglutinate, wherein the an average particle size (D50) of the powdery phosphor containing the primary particles and the aggregates is not less than 1.0 μm and not more than 50.0 μm and more preferably is not less than 1.0 μm and not more than 20.0 μm. The reason is considered as follows:

when the average particle size is 50 μm or less, it can be easily pulverized thereafter;

since the emission occurs mainly on the surface of a particle in the phosphor powder, a surface area per unit weight of powder can be secured and the deterioration of the luminance is thereby prevented when the average particle size is not more than 50.0 μm and more preferably not less than 20.0 μm; and when the powder is formed into a paste, which is then applied on a light emitter element, density of the powder can be increased, thus making it possible to prevent fluctuation of color and deterioration of luminance. Also, according to the study of the present inventors, although detailed reason was unknown, it was found that preferably the average particle size is larger than 1.0 μm from the viewpoint of the emission efficiency of the phosphor powder. As described above, the average particle size of the powder in the phosphor of the present invention is not less than 1.0 μm and not more than 50 μm, and further preferably is not more than 20 μm. The average particle size (D50) specified here is the value measured by a LS230 (laser diffraction dispersion method) by Beckman Coulter, Inc. The value of a specific surface area (BET) is also changed with the change of the particle size, and therefore from this viewpoint, the value of the specific surface area is preferably not less than 0.05 $m^2/g$ and not more than 5.00 $m^2/g$.

Next, in regard to the manufacturing method of the phosphor of the present invention, manufacture of $Sr_2Al_2Si_9O_2N_{14}$:Ce (wherein Ce/(Sr+Ce)=0.030) will be explained as an example. Note that the z/(m+z) and Ce/(Sr+Ce) are the same meaning.

Generally, in many cases, the phosphors are manufactured by a solid-phase reaction, and the phosphor of the present invention can be also obtained by the solid-phase reaction. However, the manufacturing method is not limited thereto. Each raw material of the element M, the element A, the element B may be obtained by the raw material commercially available, such as nitride, oxide, carbonate, hydroxide, and basic carbonate. However, higher purity is more preferable, and preferably, the raw material of 2N or more, further preferably the raw material of 3N or more is prepared. The particle size of each particle of the raw material is preferably a fine particle, in terms of accelerating the reaction. However, the particle size and a form of the phosphor obtained are changed, depending on the particle size and the form of the raw material. Therefore, the raw material of the nitride and so forth having an approximate particle size in accordance with the particle size and the form required for the phosphor finally obtained may be prepared. However, preferably the raw material with particle size of 50 μm or less, further preferably 0.1 μm or more and 10.0 μm or less may be used. As the raw material of the element Z also, the commercially available nitride, oxide, carbonate, hydroxide, basic carbonate, or simple metal is preferable. Of course, the higher purity of each raw material is more preferable, and the raw material of 2N or more, and further preferably the raw material of 3N or more are prepared. Particularly, using the carbonate as the raw material of the element M is preferable because an effect of flux (reaction accelerator) can be obtained without adding a compound as flux composed of the element not contained in the composition element of the phosphor of this embodiment.

When manufacturing $Sr_2Al_2Si_9O_2N_{14}$:Ce (where Ce/(Sr+Ce)=0.030), for example, preferably $SrCO_3$(3N), AlN(3N), $Si_3N_4$(3N) are respectively prepared as the raw materials of the element M, the element A, the element B, and $CeO_2$(3N) is prepared as the element Z. Then, several points are examined in consideration of a deviation generated between a mixing (charging) composition of raw materials and the composition after firing, and a mixing charging composition, whereby a target composition can be obtained after firing, is obtained. In a raw material mixing step, 0.970 mol of $SrCO_3$, 1.0 mol of AlN, 4.5/3 mol of $Si_3N_4$, and 0.030 mol of $CeO_2$ of the raw materials are weighed and mixed so that a molar ratio of each element after firing in this case is Sr:Al:Si:Ce=0.970:1:4.5:0.030. The carbonate is used as a Sr raw material. This is because when the raw material with low melting point such as carbonate is used, the raw material itself serves as flux to accelerate the reaction and improve the emission characteristic, while an oxide raw material has a high melting point and the effect of flux cannot be expected. In addition, when the oxide is used as the raw material, another substance may be added as the flux. However, in this case, it must be careful that the flux becomes impurity, and there is a possibility that the characteristic of the phosphor is deteriorated. Therefore, it must be careful to select the flux. For example, chloride, fluoride, oxide, and nitride are preferable, and $SrF_2$, $BaF_2$, $AlF_3$, $SrCl_2$, $BaCl_2$, $AlCl_3$, $Al_2O_3$, $Ga_2O_3$, $In_2O_3$, $SiO_2$, $GeO_2$, SrO, BaO, $Ga_3N_2$, $Sr_3N_2$, $Ba_3N_2$, GaN, InN, and BN, etc., are exemplified.

The weighing and mixing may be performed in an atmospheric air. However, the nitrides in each raw material element are easy to be influenced by humidity, and therefore it is convenient to operate in a glove box under an inactive atmosphere where humidity is sufficiently removed. Either of a dry system or a wet system may be used as a mixing system. However, the raw material is decomposed when pure water is used as a solvent of the wet mixing. Therefore, a suitable organic solvent must be selected. A usual device such as a ball mill and a mortar may be used.

The raw material thus completed in mixing is put in a crucible, and retained and fired, while distributing an atmosphere gas into a firing furnace at 1400° C. or more, preferably 1500° C. or more or 1600° C. or more, further preferably not less than 1700° C. and not more than 2000° C. for 30 minutes or more. If a firing temperature is 1400° C. or more, it is difficult to generate the impurity phase emitting blue light when being excited by ultraviolet rays, and further, the solid-phase reaction is preferably advanced and the phosphor excellent in emission characteristic can be obtained. Moreover, if the firing temperature is 2000° C. or less, preferably 1850° C. or less, excessive sintering and melting can be prevented from occurring. Note that higher firing temperature allows the solid-phase reaction to be rapidly advanced, and a retaining time can thereby be shortened. Meanwhile, even when the firing temperature is low, a target emission characteristic can be obtained by firing at the temperature for a long time. However, longer firing time allows a particle growth to be advanced, and a particle form becomes large. Therefore, the firing time may be set in accordance with a target particle size.

As an atmosphere gas to be distributed into a firing furnace, any one of the inactive gas such as rare gas, ammonia, mixed gas of ammonia and nitrogen, or mixed gas of nitrogen and hydrogen may be used. However, when the oxygen is contained in this atmosphere gas, oxidation reaction of a phosphor particle occurs. Therefore, the oxygen contained as the impurity is preferably as little as possible and for example, is preferably 100 PPM or less. Further, when the humidity is contained in the atmosphere gas, in the same way as the oxygen, the oxidation reaction of the phosphor particle occurs during firing. Therefore, the humidity contained as the impurity is preferably as little as possible and for example, is preferably 100 PPM or less. Here, when a single gas is used as the atmosphere gas, nitrogen gas is preferable. Although firing by a single use of the ammonia gas is also possible, the ammonia gas is expensive in terms of cost, and is a corrosive gas, and therefore a special processing is needed in devices and an exhaustion method during a low temperature. Accordingly, when the ammonia is used, the ammonia is preferably used at a low concentration, for example, by using the mixed gas of ammonia and nitrogen. For example, when the mixed gas of nitrogen gas and ammonia is used, it is preferable to prepare 80% or more of nitrogen and 20% or less of ammonia. In addition, when the mixed gas of nitrogen and other gas is used, a partial pressure of the nitrogen in the atmosphere gas is decreased when a gas concentration other than nitrogen is increased. Therefore, from the viewpoint of accelerating the nitridation reaction of the phosphor, the inactive or reduction gas containing 80% or more of nitrogen is preferably used.

In addition, preferably during firing, preferably the aforementioned gas atmosphere flows with a flow rate of 0.1 ml/min, for example. This is because although during firing the raw material of phosphors, a gas generates from the raw material, by flowing the atmosphere containing one or more kinds of gases selected from the aforementioned nitrogen, inactive gas such as rare gas, ammonia gas, a mixed gas of ammonia gas and nitrogen, and a mixed gas of nitrogen and hydrogen, it is prevented that the gas generated from the raw material is filled in the furnace to have influence on the reaction, resulting in the deterioration in the emission characteristic of the phosphor. Particularly, when the raw material decomposing to the oxide at high temperature such as the carbonate, the hydroxide, and the basic carbonate are used for the raw material, a large amount of gas is generated. Therefore, it is preferable to make the gas flow in a firing furnace and exhaust the gas thus generated.

Meanwhile, in a step of firing raw materials of phosphor in manufacturing the phosphor, pressure in the firing furnace is set in a pressurized state so as not to allow the oxygen in the atmospheric air to mix in the furnace. However, when this pressurized state exceeds 1.0 MPa (in the present invention, in-furnace pressure means a pressurized amount from the atmospheric pressure), a special pressure resistant design is required for designing a furnace facility. Therefore, in consideration of productivity, 1.0 MPa or less of pressurization is preferable. In addition, when this pressurization is increased, sintering between particles may be excessively advanced, thus making it difficult to pulverize after firing. Therefore, in-furnace pressure during firing is preferably 1.0 MPa or less, more preferably 0.5 MPa or less, and further preferably 0.001 MPa or more and 0.1 MPa or less.

Note that an $Al_2O_3$ crucible, a $Si_3N_4$ crucible, an AlN crucible, a sialon crucible, a C (carbon) crucible, and a BN (boron nitride) crucible or the like which can be used in the aforementioned gas atmosphere may be used as a crucible. Preferably the BN crucible is used, since intrusion of impurities can be averted.

In the present invention, preferably the raw material is fired in a state of powder. In a general solid-phase reaction, by dispersion of atoms in contact points of the raw materials, the reaction is promoted. This is taken into consideration, and in many cases, the raw material is formed into a pellet and fired, to accelerate the reaction uniformly over the entire raw materials. However, in a case of the raw material of the phosphor of the present invention, the raw material is fired in a powder state, easy to pulverize after firing, and a primary particle is formed in an ideal spherical shape. Thus, the fired product is easy to be treated as a powder. Further, when carbonate, hydroxide, and basic carbonate are used as raw materials, $CO_2$ gas is generated by the decomposition of the raw material during firing. However, in case of the raw material in a powder state, the gas would fully come out, and therefore from the viewpoint of not having a negative influence on the emission characteristic, this is a preferable constituent.

After completing the firing, an object thus fired is taken out from the crucible, pulverizing means such as the mortar and the ball mill is used to pulverize the raw material to a predetermined average size, and the phosphor of the composition expressed by $Sr_2Al_2Si_9O_2N_{14}$:Ce (where Ce/(Sr+Ce)=0.030) can be manufactured. The phosphor thus obtained is then subjected to washing, classifying, surface treatment, and heat treatment as needed. As a washing method, washing in an acidic solution using hydrofluoric acid, hydrochloric acid, sulfuric acid, and nitric acid is preferable, because metal atoms such as Fe adhered to the surface of particles and raw material particles remained in an unreacted state are dissolved. An amount of Fe, Ni, and Co contained in the obtained phosphor is preferably 100PPM or less.

When other element is used as the element M, the element A, the element B, and the element Z, and when an amount of activation of Ce, which is the activator, is changed, by adjusting a blending amount of each raw material at mixing to a predetermined composition ratio, the phosphor can be manufactured by the same manufacturing method as the aforementioned method.

Next, the phosphor mixture according to the present invention will be explained. The phosphor mixture of the present invention includes the aforementioned green phosphor, one or more kinds of blue phosphors having the emission spectrum with a maximum peak in the wavelength range from 420 nm to 500 nm when being excited by the excitation light, being one or more kinds of monochromatic lights or continuous lights having the wavelength range from 300 nm to 500 nm, and/or one or more kinds of red phosphors having the emission spectrum with a maximum peak in the wavelength range from 590 nm to 680 nm when being excited by the excitation light, being one or more kinds of monochromatic lights or continuous lights having the wavelength range from 300 nm to 500 nm. The phosphor mixture having this constituent has a spectrum with a uniform light density over the whole visible light region, by mixing lights of various wavelengths, which is the phosphor mixture having excellent color rendering properties during emitting light, whereby the emission device particularly excellent in emission efficiency with high luminance can be obtained.

Explanation will be given to the red phosphor having the emission spectrum with a maximum peak in the wavelength range from 590 nm to 680 nm, included in the phosphor mixture of the present invention.

A publicly-known red phosphor having excitation characteristics and emission characteristics can be used for this red phosphor.

First, there is provided the red phosphor performing red color emission with high luminance having the emission spectrum with a maximum peak in the wavelength range from 590 nm to 680 nm, with high efficiency when being irradiated with the light in the wavelength range from 250 nm to 500 nm and further preferably the wavelength range from 300 nm to 500 nm as the excitation light. Further, a half value width of this emission spectrum is preferably 50 nm or more.

As an example of this red phosphor, there is a phosphor which is given by a general composition formula expressed by MmAaBbOoNn:Z, (where the element M is one or more kinds of elements selected from the group consisting of Ca, Mg, Sr, Ba, and Zn, the element A is one or more kinds of elements selected from the group consisting of Al, Ga, and In, the element B is one or more kinds of elements selected from the group consisting of Si, Ge and Sn, and the element Z is one or more kinds of elements selected from rare earth elements and transition metal elements, satisfying n=2/3m+a+4/3b−2/3o, m=1, a≧0, b≧m, n>o, o≧0). For example, the red phosphor such as $(Ca,Sr,Ba)_2Si_5N_8$:Eu disclosed in the patent document 1, and $2.75SrO.Si_3N_4$:Eu disclosed in JP patent application No. 2004-145718 can be used. Further preferably, from this viewpoint, the red phosphor expressed by the composition formula of $CaAlSiN_3$:Eu is preferable.

Next, explanation will be given to the blue phosphor having the emission spectrum with a maximum peak in the wavelength range from 420 nm to 500 nm, included in the phosphor mixture of the present invention.

A publicly-known blue phosphor having excitation characteristics and emission characteristics as will be explained hereunder can be used for this blue phosphor.

First, there is provided the blue phosphor performing blue color emission with high luminance having the emission spectrum with a maximum peak in the wavelength range from 420 nm to 500 nm, with high efficiency when being irradiated with the light in the wavelength range from 250 nm to 420 nm and further preferably the wavelength range from 300 nm to 420 nm as the excitation light. Further, a half value width of this emission spectrum is preferably 30 nm or more, and further preferably 50 nm or more BAM:Eu($BaMgAl_{10}O_{17}$:Eu), $(Sr,Ca,Ba,Mg)_{10}(PO_4)_6Cl_2$:Eu, or $SrAl_xSi_{6-x}O_{1+x}N_{8-x}$:Eu (0≦x≦2), etc., can be given as an example of the blue phosphor having the excitation characteristics and emission characteristics.

Next, a method of obtaining the phosphor mixture of the present invention will be explained.

The green phosphor, the red phosphor and/or the blue phosphor manufactured by the aforementioned method are mixed, and the phosphor mixture according to the present invention is manufactured. By setting a mixing ratio of each phosphor, the correlated color temperature of the obtained emission spectrum can be set at a desired value between 10000K to 2000K, when this phosphor mixture is irradiated with the excitation light in the wavelength range from 300 nm to 500 nm. Here, from the viewpoint of an illumination light source, the correlated color temperature is preferably set at a desired value between 7000K to 2500K. Specifically, each emission spectrum for a target excitation light of the phosphor of each color is measured, the obtained emission spectrum is synthesized by simulation, and the mixing ratio for obtaining a desired correlated color temperature may be obtained.

Regarding an evaluation method of the emission efficiency of the obtained phosphor mixture, the phosphor mixture is actually applied on the emission element together with resin and the emission efficiency may be compared in a state that the element is allowed to emit light. However, this is not a uniform evaluation, because the variation of efficiency of the light emitting element itself or the variation by an application state is totally evaluated. Therefore, when this phosphor mixture is irradiated with any of the excitation light with the wavelength range from 300 nm to 500 nm and the emission characteristics are measured, the value of luminance (Y) is obtained based on a calculation method in a XYZ color system defined by JISZ8701. In addition, the color rendering properties can also be evaluated similarly by using the evaluation method of JISZ8726. However, the color rendering properties are not so much affected by the variation of the light emitting elements, and therefore the color rendering properties may be evaluated by the emission device incorporating the phosphor mixture of the present invention.

The aforementioned each phosphor has a preferable half value width of 50 nm or more. Therefore, in the emission of this phosphor mixture, emission spectra are overlapped one another, and a so-called broad spectrum, which is continuous without being interrupted in the wavelength range from 420 nm to 750 nm, can be obtained. In addition, each phosphor has the excitation band in the same range, and therefore an adjustment of the mixing ratio is easy.

Further preferably, the emission from the phosphor mixture of the present invention has three or more emission peaks in the wavelength range from 420 nm to 680 nm in the emission spectrum in which the correlated color temperature is 7000K to 2500K, and has a continuous spectrum without interrupting the emission. As a result, the luminance whereby brightness is sensed for human being's vision as an illumination can be gained, and simultaneously the emission has a broad emission spectrum in the wavelength range from 420 nm to 750 nm, thus exhibiting the emission with excellent color rendering properties.

The phosphor mixture of the present invention without lowering the emission intensity with the increase of the temperature is preferable, and therefore the phosphors with hardly deteriorated emission characteristics by heating are preferably mixed. Particularly, it is preferable to select the phosphor showing the temperature characteristic that when the value of the emission intensity of the maximum peak of the emission spectrum at a temperature of 25° C. when the phosphor is irradiated with a specified excitation light in the wavelength range from 300 nm to 500 nm is selected to be $P_{25}$, and the value of the emission intensity of the maximum peak of the emission spectrum at a temperature of 200° C. when the phosphor is irradiated with the specified excitation light is selected to be $P_{200}$, $(P_{25}-P_{200})/P_{25} \leq 30\%$. For example, in addition to the phosphor of the present invention, the aforementioned BAM:Eu, $(Sr,Ca,Ba,Mg)_{10}(PO_4)_6Cl_2$:Eu, BAM:Eu,Mn, ZnS:Cu,Al, $CaAl_2Si_4N_8$:Eu, $CaAlSiN_3$:Eu, etc, are given as examples. The temperature characteristics of these phosphors are shown in table 1-1. Note that this can not be limited as far as the aforementioned conditions are satisfied.

TABLE 1-1

| PHOSPHOR | 25° C. (REFERENCE VALUE) | 50° C. | 100° C. | 150° C. | 200° C. |
|---|---|---|---|---|---|
| BAM:Eu | 1.00 | 1.01 | 1.01 | 1.04 | 1.08 |
| $(Sr,Ca,Ba,Mg)_{10}(PC_4)_6Cl_2$:Eu | 1.00 | 0.96 | 0.89 | 0.83 | 0.76 |
| ZnS:Cu,Al | 1.00 | 0.98 | 0.94 | 0.88 | 0.76 |
| $CaAl_2Si_4N_8$:Eu | 1.00 | 0.96 | 0.91 | 0.86 | 0.80 |
| $CaAlSiN_3$:Eu | 1.00 | 0.98 | 0.98 | 0.93 | 0.87 |

When the phosphor mixture of the present invention is used in a powdery state, the average particle size of each mixing phosphor powder is preferably set at 50 μm or less and further preferably set at 20 μm. This is because the emission in the phosphor powder is considered to occur mainly on the surface of a powder particle, and therefore when the average particle size (D50) is 50 μm or less, the surface area per powder unit weight can be secured, and the deterioration of luminance can be prevented. Further, in manufacturing the illumination device using this phosphor mixture, when the powder is formed into a paste, which is then applied on a light emitter element, density of the powder can be increased and fluctuation of color and deterioration of luminance can be prevented.

Meanwhile, it is preferable to form a phosphor sheet, with the phosphor mixture of the present invention dispersed in the resin.

As a material becoming a medium used in manufacturing this phosphor sheet, various kinds of resin such as epoxy resin and silicone resin or glass can be exemplified. As a use example of this phosphor sheet, a specified emission can be performed by combining this phosphor sheet and a light source whereby a suitable emission occurs. Note that as the excitation light for exciting this phosphor sheet, the light with the wavelength range from 250 nm to 500 nm may be selected, the light source may be selected to be an ultraviolet ray light source using Hg discharge and a light source by laser, in addition to the light emitting elements such as an LED.

By combining the phosphor mixture of the present invention in a powdery state with the emission part for emitting light with the wavelength range from 250 nm to 500 nm and preferably wavelength range from 300 nm to 500 nm, each kind of illumination device and mainly a backlight for a display device can be manufactured.

As the emission part, for example, an LED light emitting element for emitting light in a range from ultraviolet to blue color and a discharge lamp for generating an ultraviolet light can be used. Then, when the phosphor mixture of the present invention is combined with this LED light emitting element, each kind of illumination unit and the backlight for a display device can be manufactured, and when the phosphor mixture of the present invention is combined with this discharge lamp, each kind of fluorescent lamp, an illumination unit, and a backlight for a display device, etc, can be manufactured.

A method of combining the phosphor mixture of the present invention and the emission part may be performed by a publicly-known method. However, in a case of the emission device using the LED in the emission part, the emission device can be manufactured as follows. The emission device using the LED in the emission part will be explained hereunder, with reference to the drawings.

FIGS. 26(A) to (C) are schematic sectional views of a bullet type LED emission device, and FIGS. 27(A) to (E) are schematic sectional views of a reflective type LED emission device. Note that in each figure, the same signs and numerals are assigned to the corresponding parts, and explanation therefore is omitted in some cases.

First, by using FIG. 26(A), explanation is given to an example of the emission device combined with the phosphor mixture by using the LED in the emission part. In the bullet-type LED emission device, an LED light emitting element 2 is set in a cup-shaped container 5 provided on the tip end of a lead frame 3, and they are molded by a translucent resin 4. In this embodiment, the phosphor mixture or a mixture with the phosphor mixture dispersed in a translucent resin such as silicone and epoxy (described as mixture 1 hereunder) is embedded entirely in the cup-shaped container 5. Also, the mixture 1 may be used in an entire body of a lens or may cover an upper part of the lens.

Next, by using FIG. 26(B), an example of a different emission device will be explained. In this embodiment, the mixture 1 is applied on the cup-shaped container 5 and the upper surface of the LED light emitting element 2.

Next, by using FIG. 26(C), an example of further different emission device will be explained. In this embodiment, the phosphor mixture 1 is set on the upper part of the LED light emitting element 2.

As described above, in the bullet-type LED light emission device explained by using FIGS. 26(A) to (C), a direction of light emission from the LED light emitting element 2 is upward. However, even if the direction of light emission is downward, the emission device can be prepared in the same way. For example, the reflective type LED emission device is constituted in such a manner that a reflective face and a reflective plate are provided in the direction of light emission of the LED light emitting element 2, and the light emitted from this light emitting element 2 is reflected by the reflective face so as to be emitted outside. Therefore, by using FIGS. 27(A) to (E), the emission device in which the reflective type LED emission device and the phosphor mixture of this embodiment are combined, will be explained as an example.

First, by using FIG. 27(A), explanation is given to an example of the emission device in which the reflective type LED emission device is used in the emission part and the reflective type LED emission device is combined with the phosphor mixture of this embodiment. In the reflective type LED emission device, the LED light emitting element 2 is set on one tip end of the lead frame 3, and the light emission from this LED light emitting element 2 occurs so as to be directed downward and reflected by the reflective face 8 and is emitted from upward. In this embodiment, the mixture 1 is applied onto the reflective face 8. Note that a transparent mold material 9 is sometimes filled in a recessed portion formed by the reflective face 8 so as to protect the LED light emitting element 2.

Next, by using FIG. 27(B), an example of a different emission device will be explained. In this embodiment, the mixture 1 is set in a lower part of the LED light emitting element 2.

Next, by using FIG. 27(C), an example of a different emission device will be explained. In this embodiment, the mixture 1 is filled in the recessed portion formed by the reflective face 8.

Next, by using FIG. 27(D), an example of a different emission device will be explained. In this embodiment, the mixture 1 is applied onto the transparent mold material 9 for protecting the LED light emitting element 2.

Next, by using FIG. 27(E), an example of a different emission device will be explained. In this embodiment, the mixture 1 is applied on the surface of the LED light emitting element 2.

The bullet-type LED emission device and the reflective type LED emission device may be appropriately used in accordance with application. However, the reflective type LED emission device has a merit that it can be made thin, a light emission area can be made large, and use efficiency of light can be enhanced, and so forth.

When the emission device as described above is used as a high color rendering illuminating light source, it is necessary to have the emission spectrum excellent in color rendering properties. Therefore, by using the evaluation method of JISZ8726, the color rendering properties of the emission device incorporating the phosphor mixture including the phosphor of the present invention were evaluated. In the evaluation of JISZ8726, when the general color rendering index Ra of this light source is 80 or more, this is an excellent emission device. Then, preferably when a special color rendering index R15, being an index showing a skin color component of Japanese women is 80 or more and further preferably when a special color rendering index R9, being an index showing a red color component is 60 or more, this is an extremely excellent emission device. However, the aforementioned index may not be satisfied, depending on the purpose of use not requiring color rendering properties and a different object.

Therefore, the emission device was manufactured, wherein the phosphor mixture including the phosphor of the present invention was irradiated with the light from the emission part for emitting light in the wavelength range from 300 nm to 500 nm, so as to emit light by this phosphor mixture. Note that as the emission part, the blue LED for emitting light having the wavelength of 460 nm and the ultraviolet LED for emitting light having the wavelength of 405 nm were used. Then, the color rendering properties of the emission spectrum of this emission device was evaluated. As a result, the color rendering properties of the emission device incorporating the phosphor mixture including the phosphor of the present invention shows high color rendering properties of 80 or more of Ra, 80 or more of R15, and further 60 or more of R9 in a correlated color temperature range from 10000K to 2000K, and preferably in a range from 7000K to 2500K, and it is found that this emission device is the light source with high luminance and having extremely excellent color rendering properties.

EXAMPLE

Example 1

Commercially available $SrCO_3(3N)$, $AlN(3N)$, $Si_3N_4(3N)$, and $CeO_2(3N)$ were prepared, and among the raw materials, 0.970 mol of $SrCO_3$, 1.0 mol of AlN, 4.5/3 mol of $Si_3N_4$, and 0.030 mol of $CeO_2$ were weighed and mixed by using a mortar in an atmospheric air so that the molar ratio of each element is set at Sr:Al:Si:Ce=0.970:1:4.5:0.030. The raw material thus mixed was put in a BN crucible, then, under a nitrogen atmosphere (flow state), temperature is increased to 1800° C. with an in-furnace pressure of 0.05 MPa set at 15° C./min, retained and fired at 1800° C. for three hours, and then cooled from 1800° C. to 200° C. for one hour. Thereafter, the firing sample thus fired was crushed to a proper particle size by using the mortar in the atmospheric air, and the phosphor of the example 1 of the composition formula expressed by $Sr_2Al_2Si_9O_2N_{14}$:Ce (where Ce/(Sr+Ce)=0.030) was obtained. A result of a composition analysis of the powdery phosphor thus obtained is shown in table 1-2, and an SEM photograph of the powdery phosphor (magnification of 250 times) is shown in FIG. 1.

The result of the composition analysis of the phosphor thus obtained was close to a theoretical value obtained from atomic weight and a molar ratio of constituent elements. A slight deviation is considered to be caused by a measurement error or impurities mixed in during manufacturing the phosphor. Specific surface area was 0.285 $m^2$/g. Also, as clarified from FIG. 1, the powdery phosphor thus obtained was aggregates in which primary particles of 20 μm or less agglutinates. When the average particle size (D50) was measured by a Laser Doppler measuring method, it was found that the D50 was 17.5 μm, and the size of the primary particle observed by an SEM diameter was 13.0 μm, which was in a range from 1.0 μm to 20.0 μm, and the specific surface area was in a range from 0.05 $m^2$/g to 5.0 $m^2$/g, preferable as the phosphor.

Next, the emission spectrum of the phosphor of the example 1 was measured. This measurement result is shown in table 2, and further described in FIG. 2 and FIG. 3.

FIG. 2 and FIG. 3 are graphs where the emission intensity of the phosphor of the example 1 is taken on the ordinate axis as an relative intensity, and the wavelength of light is taken on the abscissa axis. Here, the emission spectrum is a spectrum of the light released from the phosphor when the phosphor is irradiated with the light of a certain wavelength or energy. FIG. 2 and FIG. 3 show the spectrum of the light emitted from the phosphor is shown by using a solid line, when the phosphor is irradiated with the monochromatic light having the wavelength of 460 nm as the excitation light, and when the phosphor is irradiated with the monochromatic light having the wavelength of 405 nm as the excitation light in the same way, respectively. Note that the emission spectrum and the excitation spectrum were measured by using a spectrofluorometer FP-6500 by Japanese JASCO International Co., Ltd.

First, by using FIG. 2, the emission spectrum of this phosphor will be explained.

As obvious from the solid line of FIG. 2, the phosphor had the emission spectrum with a broad peak over the broad wavelength region from 470 nm to 750 nm, and the peak wavelength thereof was 559.3 nm. (the relative intensity of the emission intensity and the luminance at this time were set at 100%). In addition, the half value width obtained was 117.2 nm, and the chromaticity (x, y) of the emission spectrum obtained was x=0.4156, and y=0.5434. The powder had a yellow fluorescent color, and a yellow emission color could be visually confirmed. The phosphor of the example 1 had a peak with extremely broad half value width over the broad wavelength region, and therefore when used as the phosphor for the one chip type white LED illumination, the white LED illumination having excellent color rendering properties can be manufactured, compared with the white LED illumination using the phosphor having a sharp peak. In the case of the phosphor having the sharp peak, in order to realize the spectrum close to solar light several kinds of phosphors are required to be mixed. However, such a phosphor has a broad peak, and therefore the number of the kinds of the phosphors to be mixed can be decreased, and the white LED illumination can be manufactured at a low cost.

Table 2 and the solid line of FIG. 3 show a measurement result of the emission spectrum when the phosphor is irradiated with the monochromatic light having the wavelength of 405 nm as an excitation light. In this case, the phosphor had a broad peak in the broad wavelength range from 470 nm to 750 nm in the excitation wavelength of 405 nm also, and the peak wavelength was 552.3 nm. (in regards to the emission intensity and the luminance, a peak value of the emission spectrum is defined as the relative intensity 100%, when the phosphor of the example is irradiated with the monochromatic light having the wavelength of 460 nm as the excitation light.) In addition, the half value width obtained was 119.5 nm. The chromaticity (x, y) of the emission spectrum was expressed by x=0.3730 and y=0.5377. Note that the yellow emission color could be visually confirmed.

Next, an excitation spectrum of the phosphor of the example 1 will be explained, by using FIG. 4. FIG. 4 is a graph in which the emission intensity of the phosphor is taken on the ordinate axis, and the wavelength of the excitation light is taken on the abscissa axis. Here, the excitation spectrum is obtained by exciting the phosphor to be measured by using a monochromatic light with various wavelengths as an excitation light, measuring the emission intensity of the light with a fixed wavelength emitted by the phosphor, and measuring the dependency of the emission intensity on the excitation wavelength was measured. In this measurement, the phosphor of the example 1 was irradiated with the monochromatic light with the wavelength from 300 nm to 570 nm, and the dependency of the emission intensity of the light having the wavelength of 559.3 nm emitted by the phosphor, on the excitation wavelength was measured.

The solid line of FIG. 4 shows the excitation spectrum of the phosphor of the example 1. As obvious from the solid line of FIG. 4, it was found that the excitation spectrum of the phosphor of present invention showed the light emission of yellow color with high intensity, by the excitation light of a broad wavelength range from 300 nm or around to 500 nm. Particularly, the phosphor has a particularly excellent excitation band in the vicinity of 460 nm and 405 nm, which are emission wavelengths of the blue LED and the near ultraviolet/ultraviolet LED used as the excitation light for the one chip type white LED illumination at present.

Similarly, in regards to the emission intensity and the luminance of example 2, example 3, comparative example 1, comparative example 2, and comparative example 3 as will be explained hereafter, the peak value of the emission spectrum is defined as the relative intensity 100%, when the phosphor of the example 1 is irradiated with the monochromatic light having the wavelength of 460 nm as the excitation light.

Example 2

In the example 2, the phosphor of the example 2 is manufactured in the same way as the example 1, other than the molar ratio of each element of the example 1 is set at Sr:Al:Si:Ce=0.970:1:5:0.030.

The commercially available $SrCO_3$(3N), AlN(3N), $Si_3N_4$ (3N), $CeO_2$(3N) were prepared, and each raw material was measured in 0.970 mol of $SrCO_3$, 1.0 mol of AlN, 5.0/3 mol of $Si_3N_4$, and 0.030 mol of $CeO_2$, so that the molar ratio of each element was set at Sr:Al:Si:Ce=0.970:1:5:0.030, and the raw materials thus measured was mixed in an atmospheric air by using the mortar. The raw materials thus mixed was put in a BN crucible, and the temperature was increased to 1800° C. at 15° C./min, with in-furnace pressure of 0.05 MPa, in a nitrogen atmosphere (flow state), and in this condition, the raw materials were retained and fired for 3 hours at 1800° C., then cooled from 1800° C. to 200° C. for 1 hour. Thereafter, a fired sample was pulverized in an atmospheric air to obtain a suitable particle size by using the mortar, and thus the phosphor of the example 2 expressed by the composition formula $Sr_3Al_3Si_{15}O_3N_{23}$:Ce (where Ce/(Sr+Ce)=0.030) was obtained. Analysis results of the powdery phosphor thus obtained are shown in table 1-2.

The analysis result of the composition of the phosphor thus obtained was close to the theoretical value obtained from the atomic weight and the molar ratio of the constituent elements in the same way as the example 1. The slight deviation is considered to be caused by the measurement error or the impurities mixed in during manufacturing the phosphor. The specific surface area was 0.302 m$^2$/g, and the primary particle chain line of FIG. 4, the excitation spectrum of the phosphor also, in the same way as the example 1, exhibits the yellow emission with high intensity by the excitation light with the broad wavelength region from 300 nm or around to 500 nm.

The example 2 shows the composition with a large molar ratio of Si and N, compared with that of the example 1, and shows an excellent emission characteristic in the same way as that of the example 1.

Example 3

In the example 3, the phosphor of the example 3 was manufactured in the same way as the example 1, other than replacing Ce with Eu, as the activator, in the phosphor expressed by the composition formula $Sr_2Al_2Si_9O_2N_{14}$:Ce (where Ce/(Sr+Ce)=0.030) of the phosphor of the example 1. The molar ratio of each element was expressed by Sr:Al:Si:Eu=0.970:1:4.5:0.030, and each raw material was measured in 0.970 mol of $SrCO_3$, 1.0 mol of AlN, 4.5/3 mol of $Si_3N_4$, and 0.030/2 mol of $Eu_2O_3$. In the same way as the example 1, the analysis result of the powdery phosphor thus obtained is shown in table 1-2.

TABLE 1-2

| | COMPOSITION FORMULA | Sr (wt %) | Al (wt %) | Si (wt %) | O (wt %) | N (wt %) | Ce (wt %) | Eu (wt %) | OTHERS (wt %) | AVERAGE PARTICLE SIZE D50 (μm) | SPECIFIC SURFACE AREA (m$^2$/g) |
|---|---|---|---|---|---|---|---|---|---|---|---|
| EXAMPLE 1 | $Sr_2Al_2Si_9O_2N_{14}$:Ce | 24.8 | 7.07 | 32.2 | 2.25 | 30.5 | 1.23 | | 1.98 | 17.50 | 0.285 |
| EXAMPLE 2 | $Sr_3Al_3Si_{15}O_3N_{23}$:Ce | 23.7 | 6.11 | 33.6 | 2.11 | 30.5 | 1.10 | | 2.88 | 16.85 | 0.302 |
| EXAMPLE 3 | $Sr_2Al_2Si_9O_2N_{14}$:Eu | 24.5 | 7.13 | 32.3 | 1.83 | 28.1 | | 1.32 | 4.82 | 17.27 | 0.291 | size observed by the SEM diameter was about 12.3 μm, and the average particle size (D50) obtained by the laser Doppler measuring method was 16.85 μm, satisfying the range of not less than 1.0 μm and not more than 20.0 μm and the range of the surface area of not more than 0.05 m$^2$/g and not less than 5.0 m$^2$/g, which are preferable as the phosphor.

Next, the emission spectrum of the phosphor of the example 2 was measured. The measurement result was shown in table 2, and further described in FIG. 2 and FIG. 3.

One dot chain line of FIG. 2 shows the measurement result of the emission spectrum, when the phosphor is irradiated with the monochromatic light having the wavelength of 460 nm as the excitation light. The phosphor has the spectrum with a broad peak in the broad wavelength region from 470 nm to 750 nm, and the peak wavelength was 559.2 nm. In addition, the half value width obtained was 116.4 nm, and the chromaticity (x, y) of the emission spectrum obtained was x=0.4171 and y=0.5427, and a yellow emission color could be visually confirmed.

The measurement result of the emission spectrum when the phosphor was irradiated with the monochromatic light having the wavelength of 405 nm as the excitation light was shown in table 2 and by using the one dot chain line in FIG. 3. The phosphor of the example 2 has a broad peak over the broad wavelength region from 470 nm to 750 nm in the excitation wavelength of 405 nm also, and the peak wavelength was 552.5 nm. Also, the half value width obtained was 118.0 nm, and the chromaticity (x, y) of the emission spectrum was x=0.3783 and y=0.5389. Note that the yellow fluorescent color could be visually confirmed.

The one dot chain line of FIG. 4 shows the excitation spectrum of the phosphor of the example 2. In this measurement, the phosphor of the example 2 was irradiated with the monochromatic light with the wavelength from 300 nm to 570 nm, and an excitation dependency of the emission intensity of the light having the wavelength of 559.2 nm emitted by the phosphor was measured. As obvious from the one dot The analysis result of the composition of the phosphor thus obtained was close to the theoretical value obtained by a molecular weight and the molar ratio of the constituent elements. The specific surface area was 0.291 m$^2$/g, the primary particle size observed by the SEM diameter was about 13.1 μm, and the average particle size (D50) obtained by the Laser Doppler measuring method was 17.27 μm. Thus, in the case of using Eu as the activator, almost the same result as the case of using Ce as the activator could be obtained for the composition, the specific surface area, and the SEM diameter.

Next, the emission spectrum of the phosphor of the example 3 was measured. The measurement result is shown in table 2, and the emission spectra when the phosphor is irradiated with the light of the excitation wavelength Ex 460 nm and Ex 405 nm are further shown in FIG. 2 and FIG. 3, respectively.

Table 2 and two dot-chain line of FIG. 2 show the measurement result of the emission spectrum when the phosphor is irradiated with the monochromatic light having the wavelength of 460 nm as the excitation light. It was found from the table 2 and the two dot-line of FIG. 2, that the phosphor at the excitation wavelength Ex 460 nm had a broad peak in the broad wavelength region from 470 nm to 750 nm, and the peak wavelength was 613.8 nm. In addition, the half value width obtained was 115.6 nm, and the chromaticity (x, y) of the emission spectrum obtained was x=0.5573, and y=0.4330. Further, the powder had an orange color and an orange emission color could be visually confirmed.

In addition, table 2 and two dot-chain line of FIG. 3 show the measurement result of the emission spectrum when the phosphor is irradiated with the monochromatic light having the wavelength of 405 nm as the excitation light. It was found from the table 2 and the two dot-chain line of FIG. 3, that the phosphor had the broad peak in the broad wavelength range from 470 nm to 750 nm, and the peak wavelength was 607.9 nm. In addition, the half value width obtained was 114.2 nm, and the chromaticity (x, y) of the emission spectrum obtained was x=0.5083, and y=0.4172. Further, an orange emission color could be visually confirmed.

The phosphor of the example 3 has the same matrix as the phosphor of the example 1. However, by replacing the activator Ce with Eu, the peak of the emission spectrum could be shifted (the peak wavelength is shifted from about 560 nm of Ce to about 610 nm of Eu) to the longer wavelength side, while substantially maintaining the emission intensity. In the silicon nitride-based phosphor and the sialon phosphor proposed heretofore, when the activator is replaced, although the peak wavelength is shifted, a problem involved therein is that the emission intensity is drastically decreased. However, the matrix of the example 3 is characterized by showing an excellent emission intensity in either activator Ce or Eu. Further, the phosphor of the example 3, with the peak wavelength being about 610 nm, exhibits an orange emission, and therefore offers promising prospects as the phosphor for the white LED illumination of bulb color. Further, the orange emitting phosphor proposed heretofore, in which the oxynitride and nitride are activated by Eu, does not exceed 100 nm in the half value width of the emission spectrum. However, the phosphor of the example 3 has a significantly broad emission spectrum, with half value width exceeding about 120 nm.

FIG. 5 shows an excitation spectrum of the phosphor of the example 3. Note that FIG. 5 shows the graph similar to that of FIG. 4. In this measurement, the phosphor of the example 3 is irradiated with the monochromatic light in the wavelength range from 300 nm to 570 nm, and the dependency of the emission intensity of the light having the wavelength of 613.8 nm emitted by the phosphor on the wavelength of the excitation light was measured. Then, it was found from the excitation spectrum of the phosphor, that this phosphor emitted light of an orange color with high intensity by an excitation with the excitation light with a broad wavelength range from 300 nm or around to 550 nm. Further, as a result of measuring the emission intensity when the phosphor was irradiated with the excitation light of monochromatic color in the wavelength range from 350 nm to 500 nm, when the emission intensity in the excitation wavelength, in which the intensity of the spectrum emitted by absorbing the excitation light having the aforementioned wavelength became largest, was set at $P_H$, and the emission intensity in the excitation wavelength, in which the emission intensity became smallest, was set at $P_L$, $(P_H-P_L)/P_H \leq 0.10$ was satisfied. Namely, variation in the emission intensity when using the monochromatic light in the wavelength range from 350 nm to 500 nm was 10.0% or less, thereby showing a flat excitation band.

At present, although the yellow phosphor (YAG:Ce) used as the phosphor for the white LED illumination has the excitation band with highest efficiency near the wavelength of 460 nm, it does not have the excitation band with good efficiency over the broad range. Therefore, by deviation of emission wavelengths due to the deviation of emission elements on manufacturing the blue LED, the emission wavelength of the blue LED is out of an optimal excitation range of a YAG:Ce based yellow phosphor. This causes a lost of balance in the emission intensity of blue color and yellow color, and the color tone of the white light is changed. Meanwhile, the phosphor of the example 3 has a flat excitation band, and therefore an approximately constant emission intensity is obtained, even when the dispersion of the emission wavelengths of the emission elements occurs. This makes it possible to stably manufacture the white LED illumination having a same color tone, and therefore the phosphor of the example 3 has an advantage in both quality and manufacturing cost.

Comparative Example 1

The phosphor expressed by the composition formula $Sr_2Si_5N_8$:Ce (where Ce/(Sr+Ce)=0.030) was manufactured and defined as a comparative example 1.

The phosphor of the comparative example 1 was manufactured in the following way.

The commercially available samples $Sr_3N_2$(2N), $Si_3N_4$ (3N), $CeO_2$(3N) were prepared as raw materials, and each raw material, 1.94/3 mol of $Sr_3N_2$, 5.0/3 mold $Si_3N_4$, and 0.060 mol of $CeO_2$ were weighed and mixed in a glove box under a nitrogen atmosphere by using the mortar, so that the molar ratio of each element was expressed, satisfying Sr:Si:Ce=1.94:5.0:0.06. As per the manufacturing method as will be described hereunder, other than the firing temperature which was set at 1600° C., a phosphor sample was manufactured in the same way as the example 1.

Next, in the same way as the example 1, the emission spectrum of the phosphor of the comparative example 1 was measured. The measurement result is shown in table 2 and FIG. 2 and FIG. 3 (long broken line). As clearly shown from the long broken line of FIG. 2 and FIG. 3, the phosphor of the comparative example 1 showed a broad emission spectrum. Also, as shown in the long broken line of FIG. 2, when the phosphor was excited by the light having the wavelength of 460 nm, it showed the emission spectrum with a peak in the wavelength of 557.2 nm, the relative intensity of the emission intensity was 28.5% when the relative intensity of the example 1 was defined as 100%, and the relative intensity of the luminance was 32.6%. In the chromaticity of the emission spectrum (x, y), x=0.3716 and y=0.5080. In addition, as shown by the long broken line of FIG. 3, the phosphor of the comparative example 1 showed the emission spectrum with a peak in the wavelength of 562.0 nm when excited by the light of the excitation wavelength of 405 nm, the relative intensity of the emission intensity was 56.4% when the relative intensity of the example 1 was defined as 100%, and the relative intensity of the luminance was 62.1%. In the chromaticity (x, y) of the emission spectrum, x=0.3901 and y=0.4985. In addition, a green color emission could be visually confirmed.

Comparative Example 2

The phosphor expressed by the composition formula $Sr_{1.5}Al_3Si_9N_{16}$:Ce (where Ce/(Sr+Ce)=0.030) was manufactured and defined as a comparative example 2.

The comparative example 2 was manufactured in the following way.

The commercially available samples $Sr_3N_2$(2N), AlN(3N), $Si_3N_4$(3N), and $CeO_2$(3N) were prepared as raw materials, the molar ratio of each element is expressed by Sr:Al:Si:Ce=1.455:3.0:9.0:0.045, and each raw material was weighed in 1.455/3 mol of $Sr_3N_2$, 3.0 mol of AlN, 9.0/3 mol of $Si_3N_4$, and 0.045 mol of $CeO_2$ and mixed in a glove box by using a mortar under the nitrogen atmosphere. Other than the firing temperature which was set at 1700° C., a phosphor sample was manufactured in the same way as the example 1.

Next, in the same way as the example 1, the emission spectrum of the phosphor of the comparative example 2 was measured. The measurement result is shown by a short broken line in table 2, FIG. 2, and FIG. 3. As clearly shown from the short broken line of FIG. 2 and FIG. 3, the phosphor of the comparative example 2 showed a broad emission spectrum.

In addition, as shown by a short broken line of FIG. 2, the emission spectrum with a peak in the wavelength of 560.8 nm was exhibited when the phosphor was excited by the light having the wavelength of 460 nm, the relative intensity of the emission intensity was 16.0% when the relative intensity of the example 1 was set to 100%, and the relative intensity of the luminance was 16.7%. The chromaticity (x, y) of the emission spectrum was x=0.3992, and y=0.5116. Further, as shown by a short broken line in FIG. 3, the phosphor of the comparative example 2 showed the emission spectrum with a peak in the wavelength of 527.5 nm when excited by the monochromatic light of 405 nm, and when the relative intensity of the example 1 was set to 100%, the relative intensity of the emission intensity was 20.9%, and the relative intensity of the luminance was 22.2%. The chromaticity (x, y) of the emission spectrum was x=0.3316 and y=0.4958. In addition, the emission of yellow color was visually confirmed when the phosphor was excited by the light of the wavelength of 460 nm, and the emission of green color was confirmed when the phosphor was excited by the light of the wavelength of 405 nm.

Comparative Example 3

The phosphor expressed by the composition formula $SrAl_2SiO_3N_2$:Ce (Where Ce/(Sr+Ce)=0.030) described in the patent document 3 was manufactured and defined as a comparative example 3.

The phosphor of the comparative example 3 was manufactured as follows.

The commercially available samples $SrCO_3$(3N), AlN (3N), $SiO_2$(3N), $CeO_2$(3N) were prepared as the raw materials, and each raw material was weighed in 0.970 mol of $SrCO_3$, 2.0 mol of AlN, 1.0 mol of $SiO_2$, and 0.030 mol of $CeO_2$, so that the molar ratio of each element was Sr:Al:Si:Ce=0.970:2.0:1.0:0.030, and mixed in the atmospheric air by using the mortar. As for the manufacturing method, the phosphor was manufactured in the same way as the example 1, except that the firing temperature was set at 1400° C.

Next, in the same way as the example 1, the emission spectrum of the phosphor of the comparative example 3 was measured, and it was found that the phosphor did not emit light when excited by the lights having the wavelength of 460 nm and 405 nm, thus making it impossible to measure. However, when the phosphor was irradiated with the excitation light having the wavelength of 254 nm and 366 nm, the light emission of blue color could be visually confirmed.

Further, when fired at the firing temperature of 1800° C., the raw material was melted.

<Study on the Examples 1, 2, 3, and the Comparative Examples 1, 2, 3>

As clearly shown in the composition formula of table 2, the phosphors of the example 1, example 2, and example 3 having new compositions are different from the comparative example and include Al in the constituent element, have the composition formula different from that of the sialon phosphor of the comparative example 2 (sialon composition formula $M_x(Al, Si)_{12}(O,N)_{16}$, $0<x\leq1.5$), and are different from the comparative example 3 and take a larger molar ratio of nitrogen than that of oxygen.

As clearly shown from the result of table 2, FIG. 2 and FIG. 3, compared with the phosphors of the comparative examples 1 to 3, the phosphors of the example 1, example 2, and example 3 show not less than 3 times emission intensity and not less than 2.5 times luminance, when excited by the light having the wavelength of 460 nm, and when excited by the light having the wavelength of 405 nm, show not less than 1.5 times emission intensity and luminance. Thus, it was found that the aforementioned phosphors were high-efficiency phosphors showing higher emission intensity and luminance compared with the conventional phosphors.

TABLE 2

| | COMPOSITION FORMULA | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|
| EXAMPLE 1 | $Sr_2Al_2Si_9O_2N_{14}$:Ce | 460 | 100.0 | 100.0 | 559.3 | 0.416 | 0.543 |
| EXAMPLE 2 | $Sr_3Al_3Si_{15}O_3N_{23}$:Ce | 460 | 96.3 | 95.7 | 559.2 | 0.417 | 0.543 |
| EXAMPLE 3 | $Sr_2Al_2Si_9O_2N_{14}$:Eu | 460 | 96.9 | 77.2 | 613.8 | 0.557 | 0.433 |
| COMPARATIVE EXAMPLE 1 | $Sr_2Si_5N_8$:Ce | 460 | 28.5 | 32.6 | 557.2 | 0.372 | 0.508 |
| COMPARATIVE EXAMPLE 2 | $Sr_{1.5}Al_3Si_9N_{16}$:Ce | 460 | 16.0 | 16.7 | 560.8 | 0.399 | 0.512 |
| COMPARATIVE EXAMPLE 3 | $SrAl_2SiO_3N_2$:Ce | 460 | MEASUREMENT IMPOSSIBILITY | | | | |
| EXAMPLE 1 | SAME AS ABOVE | 405 | 108.1 | 111.8 | 552.3 | 0.373 | 0.538 |
| EXAMPLE 2 | | 405 | 103.7 | 106.5 | 552.5 | 0.378 | 0.539 |
| EXAMPLE 3 | | 405 | 98.9 | 88.6 | 607.9 | 0.508 | 0.417 |
| COMPARATIVE EXAMPLE 1 | | 405 | 56.4 | 62.1 | 562.0 | 0.390 | 0.499 |
| COMPARATIVE EXAMPLE 2 | | 405 | 20.9 | 22.2 | 527.5 | 0.332 | 0.496 |
| COMPARATIVE EXAMPLE 3 | | 405 | MEASUREMENT IMPOSSIBILITY | | | | |

Example 4 to Example 13

Study on Amount of Activator Ce

In the example 4 to the example 13, change in the emission intensity and luminance of the phosphors expressed by the composition formula $Sr_2Al_2Si_9O_2N_{14}$:Ce were measured when the concentration of the element Z (Ce), which is an activator, was changed. Here, in manufacturing a measurement sample, the mixing ratio of the raw materials was adjusted, so that the relation between Ce and Sr, which are activators, is m+z=1. Then, as explained in the example 1, the mixing ratio of each raw material of $SrCO_3$(3N), AlN(3N), $Si_3N_4$(3N), $CeO_2$(3N) was adjusted, and a phosphor sample was manufactured in the same way as the example 1, excepting that concentration of activator Ce was changed, and the emission intensity and luminance thus manufactured were measured. Wherein the Ce-activated concentration: Ce/(Sr+Ce) was selected to be 0.001 (example 4), 0.005 (example 5), 0.010 (example 6), 0.020 (example 7), 0.025 (example 8), 0.030 (example 9), 0.035 (example 10), 0.040 (example 11), 0.050 (example 12), and 0.100 (example 13).

The results thus measured are shown in table 3 and FIG. 6. FIG. 6 is a graph in which the relative intensity of the emission intensity of each of the phosphor samples is taken on the ordinate axis, and the value of the mixing ratio: Ce/(Sr+Ce) of Sr and Ce is taken on the abscissa axis. As for the emission intensity and luminance, the value of the emission intensity in the peak wavelength of Ce/(Sr+Ce)=0.040 (example 11) was set at 100%. The light having the wavelength of 460 nm was used as the excitation light.

As clearly shown in the result of table 3 and FIG. 6, in the region where the value of Ce/(Sr+Ce) is small, the emission intensity and luminance are increased in association with the increase in the value of Ce/(Sr+Ce). However, the emission intensity and luminance are decreased in association with the increase in the value of Ce/(Sr+Ce), with the vicinity of Ce/(Sr+Ce)=0.040 as a peak. This is because an activator element is insufficient in a part where the value is smaller than Ce/(Sr+Ce)=0.040, and concentration quenching due to the activator element is observed in a part where the value is larger than Ce/(Sr+Ce)=0.040.

Meanwhile, as clearly shown in the result of table 3, in association with the increase in the value of Ce/(Sr+Ce), it was confirmed that the value of the peak wavelength was shifted to the longer wavelength side, except for the data of Ce/(Sr+Ce)=0.001 (example 4).

Along with the measurement of the emission intensity and luminance, the chromaticity (x, y) of the emission spectrum was measured, and the result is shown in table 3.

the example 3 was adjusted, and in the same way as the example 3, the phosphor sample were manufactured excepting that the Eu activator concentration was changed, and the emission intensity and luminance of the phosphor thus manufactured were measured. Wherein, the Eu activator concentration Eu/(Sr+Eu) was set at 0.001 (example 14), 0.005 (example 15), 0.010 (example 16), 0.020 (example 17), 0.025 (example 18), 0.030 (example 19), 0.035 (example 20), 0.040 (example 21), 0.050 (example 22), 0.100 (example 23).

The measurement result is shown in table 4 and FIG. 7. Here, FIG. 7 is a graph showing the relative intensity of the emission intensity of each phosphor sample taken on the ordinate axis, and the value of the blending ratio Eu/(Sr+Eu) of Sr and Eu taken on the abscissa axis. Wherein, as for the emission intensity and luminance, the value of the emission intensity in the peak wavelength of Eu/(Sr+Eu)=0.050 (example 22) was defined as 100%. The light having the wavelength of 460 nm was used as the excitation light.

As clearly shown in table 4 and FIG. 7, in the region where the value of Eu/(Sr+Eu) is small, the emission intensity and luminance are increased along with the increase of the value of Eu/(Sr+Eu). However, the emission intensity and luminance are decreased, along with the increase of the value of Eu/(Sr+Eu), with a peak in the vicinity of Eu/(Sr+Eu)=0.050. This is because the activator element is insufficient in a part where the value of the Eu/(Sr+Eu) is smaller than Eu/(Sr+Eu)=0.050, thereby causing the concentration quenching due to the activator element to occur in a part where the value of the Eu/(Sr+Eu) is larger than Eu/(Sr+Eu)=0.050. However, gradual decrease of the emission intensity due to the concentration quenching is observed in a region where the activator concentration is high, compared with the case of the Ce activator concentration of the

TABLE 3

| COMPOSITION | | | EMISSION INTENSITY | LUMINANCE | PEAK WAVELENGTH | CHROMATICITY | |
|---|---|---|---|---|---|---|---|
| | FORMULA | Z/(m + Z) | (%) | (%) | (nm) | x | y |
| EXAMPLE 4 | $Sr_2Al_2Si_9O_2N_{14}$:Ce | 0.001 | 24.5 | 25.7 | 564.9 | 0.417 | 0.530 |
| EXAMPLE 5 | | 0.005 | 60.1 | 61.8 | 557.7 | 0.406 | 0.545 |
| EXAMPLE 6 | | 0.010 | 77.4 | 79.0 | 559.2 | 0.408 | 0.546 |
| EXAMPLE 7 | | 0.020 | 93.2 | 94.3 | 559.2 | 0.413 | 0.546 |
| EXAMPLE 8 | | 0.025 | 93.7 | 94.9 | 559.7 | 0.414 | 0.546 |
| EXAMPLE 9 | | 0.030 | 97.2 | 98.2 | 559.7 | 0.416 | 0.545 |
| EXAMPLE 10 | | 0.035 | 99.4 | 100.4 | 561.4 | 0.416 | 0.542 |
| EXAMPLE 11 | | 0.040 | 100.0 | 100.0 | 561.2 | 0.423 | 0.543 |
| EXAMPLE 12 | | 0.050 | 95.6 | 95.6 | 561.6 | 0.427 | 0.540 |
| EXAMPLE 13 | | 0.100 | 38.1 | 38.9 | 564.8 | 0.441 | 0.528 |

Example 14 to Example 23

Study on the Amount of Activator Eu

In the examples 14 to example 23, the emission intensity and luminance when the concentration of the activator element Z (Eu) was changed was measured, in the phosphor expressed by the composition formula $Sr_2Al_2Si_9O_2N_{14}$:Eu. Here, in the manufacture of the measurement sample, in the same way as the examples 4 to 13, the mixing ratio of the raw materials was adjusted, so that the relation between Eu and Sr, which are activators, was m+z=1. Then, each raw material of $SrCO_3$(3N), AlN(3N), $Si_3N_4$(3N), $Eu_2O_3$(3N) explained in examples 4 to 13. It appears that this is caused by a difference of the ionic radius and the difference of the valency between Eu and Ce.

Meanwhile, as clearly shown from the result of the table 4, it was confirmed that the value of the peak wavelength was shifted toward the longer wavelength side along with the increase of the value of Eu/(Sr+Eu), except for the data of Eu/(Sr+Eu)=0.001 (example 14) and Eu/(Sr+Eu)=0.050 (example 22).

In addition, in parallel to the measurement of the emission intensity and luminance, the chromaticity (x, y) of the emission spectra were measured. The results are shown in table 4.

TABLE 4

|  | COMPOSITION FORMULA | Z/(m + Z) | EMISSION INTENSITY (%) | LUMINANCE (%) | PEAK WAVELENGTH (nm) | CHROMATICITY x | y |
|---|---|---|---|---|---|---|---|
| EXAMPLE 14 | $Sr_2Al_2Si_9O_2N_{14}$: Eu | 0.001 | 31.0 | 44.3 | 588.3 | 0.485 | 0.475 |
| EXAMPLE 15 |  | 0.005 | 70.2 | 85.1 | 604.6 | 0.526 | 0.456 |
| EXAMPLE 16 |  | 0.010 | 79.8 | 93.6 | 605.2 | 0.534 | 0.451 |
| EXAMPLE 17 |  | 0.020 | 93.2 | 99.0 | 611.3 | 0.551 | 0.438 |
| EXAMPLE 18 |  | 0.025 | 95.5 | 100.4 | 611.1 | 0.554 | 0.437 |
| EXAMPLE 19 |  | 0.030 | 97.2 | 96.7 | 615.2 | 0.561 | 0.430 |
| EXAMPLE 20 |  | 0.035 | 99.6 | 96.6 | 615.2 | 0.566 | 0.426 |
| EXAMPLE 21 |  | 0.040 | 99.7 | 94.2 | 615.3 | 0.569 | 0.423 |
| EXAMPLE 22 |  | 0.050 | 100.0 | 100.0 | 610.7 | 0.562 | 0.430 |
| EXAMPLE 23 |  | 0.100 | 94.7 | 69.9 | 626.5 | 0.599 | 0.395 |

Example 24 to Example 32)

Change of Al/Sr Ratio

In the example 24 to example 32, in regards to the phosphor expressed by the composition formula $Sr_2Al_aSi_9O_oN_n$:Ce (Ce/(Sr+Ce)=0.030, n=2/3 m+a+4/3b−2/3o, m=2.0, b=9.0, O≦2.0), the molar ratio of Sr, Si is fixed to 2, 9, respectively, and the change of the emission intensity and luminance was measured when the a/m ratio (here, a/m and Al/Sr have the same meaning) was changed. Here, in the manufacture of the measurement samples, the phosphor samples were manufactured in the same way as the example 1, excepting that the mixing ratio of only AlN(3N) out of each raw material of $SrCO_3$(3N), AlN(3N), $Si_3N_4$(3N), $CeO_2$(3N) explained in the example 1 was adjusted, and the emission intensity and luminance of the phosphor thus manufactured were measured. Wherein, the blending ratio of Al and Sr thus adjusted was set at Al/Sr=0.50 (example 24), Al/Sr=0.75 (example 25), Al/Sr=0.90 (example 26), Al/Sr=1.00 (example 27), Al/Sr=1.10 (example 28), Al/Sr=1.25 (example 29), Al/Sr=1.50 (example 30), Al/Sr=2.00 (example 31), and Al/Sr=3.00 (example 32).

The measurement results are shown in table 5 and FIG. 8. Here, FIG. 8 is a graph showing the relative intensity of the emission intensity of each phosphor sample taken on the ordinate axis, and the value of the blending ratio: Al/Sr of Sr and Al taken on the abscissa axis. In regards to the emission intensity and luminance, the value of the emission intensity in the peak wavelength of Al/Sr=1.0 (example 27) was defined as 100%. The value of Al/Sr was adjusted at 0.50 to 3.00, and the results are shown. The light having the wavelength of 460 nm was used as the excitation light.

As being clarified from the results of table 5 and FIG. 8, the emission intensity and luminance are increased along with the increase of the value of Al/Sr in the region where the value is small. However the emission intensity and luminance are decreased, with a peak in the vicinity of Al/Sr=1.0 (example 27).

This is because when the value of Al/Sr is largely deviated from Al/Sr=1.0, an unreacted raw material is remained in the phosphor after firing, the phase different from a light emitting phase is generated, and the crystallinity of the matrix structure of the phosphor is deteriorated because the X-ray diffraction peak intensity is reduced when Al/Sr is not less than 1.5, and further the structure suitable for light emission is collapsed, to generate the impurity phase not contributing to the light emission. Thus, when the value of Al/Sr is deviated from Al/Sr=1.0, the emission intensity and luminance are deteriorated. However, a suitable Al content changes a little depending upon deviation of Si and O composition, if such a deviation is small, the influence is also small, and when the Al/Sr is in the range of 0.75≦Al/Sr<1.5, 80% or more value of the emission intensity and luminance of Al/Sr=1.0 is exhibited.

TABLE 5

|  | COMPOSITION FORMULA | Al/Sr | EMISSION INTENSITY (%) | LUMINANCE (%) | PEAK WAVELENGTH (nm) | CHROMATICITY x | y |
|---|---|---|---|---|---|---|---|
| EXAMPLE 24 | $Sr_2Al_{1.0}Si_9O_2N_{13.0}$: Ce | 0.50 | 43.8 | 44.4 | 562.4 | 0.421 | 0.529 |
| EXAMPLE 25 | $Sr_2Al_{1.5}Si_9O_2N_{13.5}$: Ce | 0.75 | 82.9 | 83.3 | 562.1 | 0.421 | 0.537 |
| EXAMPLE 26 | $Sr_2Al_{1.8}Si_9O_2N_{13.8}$: Ce | 0.90 | 95.4 | 95.4 | 561.6 | 0.418 | 0.541 |
| EXAMPLE 27 | $Sr_2Al_{2.0}Si_9O_2N_{14.0}$: Ce | 1.00 | 100.0 | 100.0 | 559.3 | 0.416 | 0.543 |
| EXAMPLE 28 | $Sr_2Al_{2.2}Si_9O_2N_{14.2}$: Ce | 1.10 | 94.8 | 102.4 | 559.2 | 0.413 | 0.545 |
| EXAMPLE 29 | $Sr_2Al_{2.5}Si_9O_2N_{14.5}$: Ce | 1.25 | 87.2 | 94.6 | 559.2 | 0.411 | 0.545 |
| EXAMPLE 30 | $Sr_2Al_{3.0}Si_9O_2N_{15.0}$: Ce | 1.50 | 70.9 | 76.9 | 559.7 | 0.411 | 0.542 |
| EXAMPLE 31 | $Sr_2Al_{4.0}Si_9O_2N_{16.0}$: Ce | 2.00 | 61.0 | 66.3 | 559.7 | 0.411 | 0.540 |
| EXAMPLE 32 | $Sr_2Al_{6.0}Si_9O_2N_{18.0}$: Ce | 3.00 | 53.1 | 53.3 | 557.5 | 0.404 | 0.538 |

Examples 33 to 42

Change of Si/Sr

In the examples 33 to 42, the molar ratio of Sr, Al, is fixed to 2, 2, respectively in the phosphor expressed by the composition formula $Sr_2Al_2Si_bO_2N_n$:$Ce_{0.060}$ (Ce/(Sr+Ce)=0.030, n=2/3m+a+4/3b−2/3o, wherein m=2.0, a=2.0), and the change of the emission intensity and luminance were measured when the b/m ratio (here, b/m and Si/Sr have the same meaning.) was changed. Here, in the manufacture of the measurement samples, the phosphor sample was manufactured in the same way as the example 1, excepting that the mixing ratio of only $Si_3N_4$(3N) out of each raw material of $SrCO_3(3N)$, $AlN(3N)$, $Si_3N_4(3N)$, $CeO_2(3N)$ explained in the example 1 was adjusted, and the emission intensity and luminance of the phosphors thus manufactured were measured. Wherein the blending ratio of Si and Sr was set at Si/Sr=1.0 (example 33), Si/Sr=1.5 (example 34), Si/Sr=2.0 (example 35), Si/Sr=3.0 (example 36), Si/Sr=4.0 (example 37), Si/Sr=4.5 (example 38), Si/Sr=5.0 (example 39), Si/Sr=5.5 (example 40), Si/Sr=6.0 (example 41), Si/Sr=7.0 (example 42).

The measurement results will be explained with reference to table 6 and FIG. 9. Here, FIG. 9 shows the relative intensity of the emission intensity of the phosphor samples taken on the ordinate axis, and the value of the blending ratio Si/Sr of Sr and Si taken on the abscissa axis. In regards to the emission intensity and luminance, the value of the emission intensity in the peak wavelength of Si/Sr=4.5 (example 38) was defined as 100%. The value of Si/Sr is adjusted to 1.0 to 7.0, and the results are shown. The light having the wavelength of 460 nm was used as the excitation light.

not contributing to the light emission is generated. However, if the deviation is small, the influence is also small, and when the value of Si/Sr is in the range of 3.5 Si/Sr 6.0, 80% or more value of the emission intensity and luminance of Si/Sr=4.5 is exhibited.

Example 43 to Example 50

Change of Sr Molar Ratio

In regards to the phosphor expressed by the composition formula $Sr_mAl_2Si_9O_2N_n$:Ce (Ce/(Sr+Ce)=0.030, n=2/3 m+a+4/3b−2/3o, wherein a=2.0, b=9.0, o=2.0), the molar ratio of Al, Si, is fixed to 2, 9, respectively, and the change of the emission intensity and luminance was measured when the molar ratio of Sr (here, m and Sr have the same meaning, i.e. m=Sr) was changed. Here, in the manufacture of the measurement sample, the phosphor samples were manufactured in the same way as the example 1, excepting that the mixing

TABLE 6

| | COMPOSITION FORMULA | Si/Sr | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|---|
| EXAMPLE 33 | $Sr_2Al_2Si_2O_2N_{4.67}$: Ce | 1.00 | 460 | 12.2 | 13.2 | 568.1 | 0.413 | 0.495 |
| EXAMPLE 34 | $Sr_2Al_2Si_3O_2N_{6.00}$: Ce | 1.50 | 460 | 34.2 | 36.6 | 566.2 | 0.423 | 0.516 |
| EXAMPLE 35 | $Sr_2Al_2Si_4O_2N_{7.33}$: Ce | 2.00 | 460 | 45.8 | 49.4 | 564.8 | 0.416 | 0.524 |
| EXAMPLE 36 | $Sr_2Al_2Si_6O_2N_{10.00}$: Ce | 3.00 | 460 | 69.8 | 74.8 | 560.7 | 0.405 | 0.535 |
| EXAMPLE 37 | $Sr_2Al_2Si_8O_2N_{12.67}$: Ce | 4.00 | 460 | 94.7 | 96.2 | 559.0 | 0.409 | 0.543 |
| EXAMPLE 38 | $Sr_2Al_2Si_9O_2N_{14.00}$: Ce | 4.50 | 460 | 100.0 | 100.0 | 559.3 | 0.416 | 0.543 |
| EXAMPLE 39 | $Sr_2Al_2Si_{10}O_2N_{15.33}$: Ce | 5.00 | 460 | 96.3 | 95.7 | 559.2 | 0.417 | 0.543 |
| EXAMPLE 40 | $Sr_2Al_2Si_{11}O_2N_{16.67}$: Ce | 5.50 | 460 | 80.2 | 86.2 | 559.7 | 0.419 | 0.541 |
| EXAMPLE 41 | $Sr_2Al_2Si_{12}O_2N_{18.00}$: Ce | 6.00 | 460 | 61.6 | 61.0 | 562.3 | 0.424 | 0.534 |
| EXAMPLE 42 | $Sr_2Al_2Si_{14}O_2N_{20.67}$: Ce | 7.00 | 460 | MEASUREMENT IMPOSSIBILITY | | | | |

As being clarified from the result of FIG. 9, the emission intensity was increased along with the increase of the value of Si/Sr in the region where the value of Si/Sr was small, with a peak at Si/Sr=4.5 (example 38), and when the value of Si/Sr exceeds Si/Sr=4.5, the emission intensity was deteriorated. This is because, in the same way as explained for Al/Sr in the examples 24 to 32, when the value of Si/Sr is largely deviated from Si/Sr=4.5, an unreacted raw material is remained in the phosphor after firing, the impurity phase is generated, and the crystallinity of the matrix structure of the phosphor is deteriorated because the X-ray diffraction peak intensity is reduced, and further the structure suitable for light emission is collapsed. Particularly, when the value of Si/Sr is selected to be smaller than 4.5, the peak observed on the lower angle side disappears, and a new peak is confirmed to appear. Meanwhile, when the value of Si/Sr is selected to be larger than 4.5, the peak observed on the lower angle side is confirmed to disappear. This reveals that when the value of Si/Sr is largely deviated from the relation of Si/Sr=4.5, the impurity phase ratio was adjusted by adding $Al_2O_3(3N)$ raw material to always obtain the value of O as o=2.0 in addition to $SrCO_3$ (3N), $AlN(3N)$, $Si_3N_4(3N)$, and $CeO_2(3N)$ explained in the example 1, and the emission intensity and luminance of the phosphor thus manufactured were measured. Wherein, the molar ratios of Sr thus adjusted were set at Sr=0.50 (example 43), Sr=1.00 (example 44), Sr=1.50 (example 45), Sr=2.00 (example 46), Sr=2.50 (example 47), Sr=3.0 (example 48), Sr=4.0 (example 49), and Sr=6.0 (example 50).

The measurement result will be explained with reference to table 7 and FIG. 10. Here, FIG. 10 is a graph showing the relative intensity of the emission intensity of the phosphor sample taken on the ordinate axis, and the value of Sr molar ratio taken on the abscissa axis. In regards to the emission intensity and luminance, the value of the emission intensity in the peak wavelength of Sr=2.00 (example 46) was defined as 100%. The value of the Sr molar ratios is adjusted to 0.50 to 6.00, and the results are shown. The light having the wavelength of 460 nm was used as the excitation light.

TABLE 7

| | COMPOSITION FORMULA | Sr MOLAR RATIO | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|---|
| EXAMPLE 43 | $Sr_{0.25}Al_2Si_9O_2N_{12.83}$: Ce | 0.50 | 460 | MEASUREMENT IMPOSSIBILITY | | | | |
| EXAMPLE 44 | $Sr_{0.50}Al_2Si_9O_2N_{13.00}$: Ce | 1.00 | 460 | MEASUREMENT IMPOSSIBILITY | | | | |
| EXAMPLE 45 | $Sr_{0.75}Al_2Si_9O_2N_{13.17}$: Ce | 1.50 | 460 | 64.1 | 63.7 | 559.1 | 0.411 | 0.538 |
| EXAMPLE 46 | $Sr_{1.00}Al_2Si_9O_2N_{13.33}$: Ce | 2.00 | 460 | 100.0 | 100.0 | 559.7 | 0.410 | 0.542 |
| EXAMPLE 47 | $Sr_{1.25}Al_2Si_9O_2N_{13.50}$: Ce | 2.50 | 460 | 96.5 | 98.7 | 561.6 | 0.407 | 0.536 |

TABLE 7-continued

| | COMPOSITION FORMULA | Sr MOLAR RATIO | EXCITATION WAVELENGTH (nm) | EMISSION INTENSITY (%) | LUMINANCE (%) | PEAK WAVELENGTH (nm) | CHROMATICITY x | y |
|---|---|---|---|---|---|---|---|---|
| EXAMPLE 48 | $Sr_{1.50}Al_2Si_9O_2N_{13.67}$: Ce | 3.00 | 460 | 85.9 | 89.6 | 561.6 | 0.400 | 0.536 |
| EXAMPLE 49 | $Sr_{2.00}Al_2Si_9O_2N_{14.00}$: Ce | 4.00 | 460 | 68.5 | 72.6 | 561.6 | 0.398 | 0.532 |
| EXAMPLE 50 | $Sr_{3.00}Al_2Si_9O_2N_{14.67}$: Ce | 6.00 | 460 | 61.8 | 64.1 | 565.6 | 0.425 | 0.520 |

As being clarified from the result of FIG. 10, with smaller molar ratio of 0.50 (example 43) and 1.00 (example 44), the light emission was not obtained when the phosphor samples were irradiated with the light having the wavelength of 460 nm and 405 nm. Further, as an easy evaluation, when the phosphor samples were irradiated with the light of an ultraviolet lamp having the wavelength of 366 nm, blue emission color could be visually confirmed. This is because with smaller molar ratio of 0.50 and 1.00, the proportion of $SrCO_3$ as a Sr raw material in the mixed powder is small, and the $SrCO_3$ does not excellently act as flux, not to generate the phase emitting yellow light but to generate other phase, thus exhibiting blue light emission under the excitation light of short wavelength. In addition, when the Sr molar ratio is gradually increased from 1.00, the emission intensity and luminance are increased along with the increase of the Sr molar ratio, with a peak at Sr=2.00 (example 46). However, the emission intensity is decreased when the value of Sr becomes beyond 2.00.

Example 51 to Example 60

Change of Oxygen Content

In the example 51 to example 60, in regards to the phosphor expressed by the composition formula $Sr_2Al_2Si_9O_oN_n$:Ce (Ce/(Sr+Ce)=0.030, n=2/3 m+a+4/3b−2/3o, m=2.0, a=2.0, b=9.0), the molar ratio of Sr, Al, Si is fixed to 2, 2, 9, respectively, and the change of the emission intensity and luminance was measured when the o/m ratio (oxygen content) was changed. Here, in the manufacture of the measurement samples, the phosphor samples were manufactured in the same way as the example 1, excepting that the oxygen content was changed by mixing each raw material of $Sr_3N_2$(2N), $SrCO_3$(3N), AlN(3N), $Al_2O_3$(3N), $Si_3N_4$(3N), $SiO_2$(3N), and $CeO_2$(3N) at a predetermined molar ratio, and the emission intensity and luminance were measured.

As for the example in which the o/m ratio adjusted at weighing raw materials is o/m=0.0 (example 51), o/m=0.2 (example 52), and o/m=0.50 (example 53), $Sr_3N_2$, $Al_2O_3$, AlN, $Si_3N_4$ were used as raw materials, and as for the example in which the adjusted o/m ratio was o/m=1.00 (example 54), o/m=1.25 (example 55), o/m=1.5 (example 56), o/m=2.0 (example 57), and o/m=3.0 (example 58), $SrCO_3$, $Al_2O_3$, AlN, $SiO_2$, and $Si_3N_4$ were used as the raw materials, and as for the example in which the adjusted o/m ratio was o/m=5.0 (example 59), o/m=10.0 (example 60), $Sr_3N_2$, $Al_2O_3$, $SiO_2$, and $Si_3N_4$ were used as the raw materials.

The measurement result will be explained with reference to table 8 and FIG. 11. Here, FIG. 11 is a graph showing the relative intensity of the emission intensity of the phosphor sample taken on the ordinate axis, and the value of the oxygen content (weight %) in the phosphor taken on the abscissa axis. In the emission intensity and luminance, the value of the emission intensity in the peak wavelength of o/m=1.0 (example 54) was defined as 100%. The light having the wavelength of 460 nm was used as the excitation light.

As being clarified from the result of table 8 and FIG. 11, the emission intensity and luminance of each phosphor are decreased in both cases of increasing or decreasing the oxygen content with a peak between 2.5 and 3.5 wt %, and are extremely decreased in case of the oxygen content of 4.0 wt % or more. Further, when the oxygen content becomes 10.0 wt % or more, each phosphor is melted and vitrified.

TABLE 8

| | COMPOSITION FORMULA | o/m | EMISSION INTENSITY (%) | LUMINANCE (%) | PEAK WAVELENGTH (nm) | CHROMATICITY x | y | O (wt %) | N (wt %) |
|---|---|---|---|---|---|---|---|---|---|
| EXAMPLE 51 | $Sr_2Al_2Si_9O_{0.00}N_{15.33}$: Ce | 0.00 | 63.7 | 60.5 | 561.7 | 0.424 | 0.532 | 1.44 | 29.1 |
| EXAMPLE 52 | $Sr_2Al_2Si_9O_{0.40}N_{15.07}$: Ce | 0.20 | 42.6 | 41.0 | 561.2 | 0.413 | 0.532 | 2.08 | 29.6 |
| EXAMPLE 53 | $Sr_2Al_2Si_9O_{1.00}N_{14.67}$: Ce | 0.50 | 47.6 | 45.8 | 561.2 | 0.411 | 0.530 | 2.10 | 28.1 |
| EXAMPLE 54 | $Sr_2Al_2Si_9O_{2.00}N_{14.00}$: Ce | 1.00 | 100.0 | 100.0 | 559.7 | 0.410 | 0.541 | 2.68 | 27.2 |
| EXAMPLE 55 | $Sr_2Al_2Si_9O_{2.50}N_{13.67}$: Ce | 1.25 | 96.3 | 96.4 | 558.1 | 0.404 | 0.542 | 3.56 | 26.9 |
| EXAMPLE 56 | $Sr_2Al_2Si_9O_{3.00}N_{13.33}$: Ce | 1.50 | 80.2 | 80.5 | 558.1 | 0.404 | 0.540 | 4.12 | 26.4 |
| EXAMPLE 57 | $Sr_2Al_2Si_9O_{4.00}N_{12.67}$: Ce | 2.00 | 53.8 | 53.9 | 559.1 | 0.394 | 0.532 | 5.22 | 25.1 |
| EXAMPLE 58 | $Sr_2Al_2Si_9O_{6.00}N_{11.33}$: Ce | 3.00 | 28.2 | 25.4 | 554.6 | 0.367 | 0.505 | 9.42 | 21.7 |
| EXAMPLE 59 | $Sr_2Al_2Si_9O_{10.0}N_{8.67}$: Ce | 5.00 | | | MEASUREMENT IMPOSSIBILITY | | | | |
| EXAMPLE 60 | $Sr_2Al_2Si_9O_{20.0}N_{2.00}$: Ce | 10.00 | | | MEASUREMENT IMPOSSIBILITY | | | | |

This is because when the oxygen content becomes not less than 4.0 wt %, the matrix structure of the phosphor begins to gradually vitrified, and completely vitrified at 10.0 wt % or more, thereby collapsing the crystal structure and deteriorating the crystallinity. Actually, when the X-ray diffraction measurement was performed for the samples having different oxygen content, it was confirmed that the peak intensity of diffraction was significantly lowered along with the increase of the oxygen content, and the half value width of the peak was gradually enlarged, and each phosphor was vitrified along with the increase of the oxygen content. When the matrix structure of the phosphor was vitrified, the structure around Ce ion as the center of light emission becomes irregular, to cause a variance in the interval between each center of light emission, or efficient light emission is obtained at some place but no light emission is obtained at another place because an energy from the excitation light absorbed by the matrix body can not be efficiently transferred to the center of the light emission, and therefore the emission intensity as an entire body of the phosphor is deteriorated. Accordingly, preferably 10 wt % or less of the oxygen content in the phosphor is preferable. When the emission characteristic and powder characteristics after firing are taken into consideration, 0.5 wt % or more and 8.1 wt % or less (in the range of 0.0<o/m≦4.0 when defined in terms of molar ratio) is preferable. More preferably, when the oxygen content is in the range from 0.5 wt % to 5.0 wt % (in the range of 0.0<o/m≦3.0), it appears that sufficient emission intensity and luminance can be obtained.

Next, in examples 61 to 82, samples were manufactured by increasing amounts of Al and oxygen in the composition during mixing the raw materials and the emission characteristics and the temperature characteristics were compared.

Example 61

In the example 61, the phosphor having a target composition after firing expressed by $SrAl_{1.43}Si_{3.81}O_{0.59}N_{6.79}:Ce$ (wherein Ce/(Sr+Ce)=0.030) was manufactured.

The commercially available $SrCO_3(3N)$, $AlN(3N)$, $Al_2O_3$ (3N), $Al_2O_3(3N)$, $Si_3N_4(3N)$, $CeO_2(3N)$ were prepared as the raw materials, and each raw material, $SrCO_3$ of 0.970 mol, $Al_2O_3$ of (1.31−0.976)/3 mol, AlN of 1.3−((1.31−0.976)/3)×2 mol, $Si_3N_4$ of 4.5/3 mol, and 0.030 mol of $CeO_2$, were weighed so that the molar ratio of each element was Sr:Al:Si:O:Ce=0.970:1.3:4.5:1.31:0.030, and mixed in the atmospheric air by using the mortar. Note that the phosphor thus manufactured is expressed by a mixed composition formula of $SrAl_{1.3}Si_{4.5}O_{1.21}N_{7.1}:Ce$. The examples 61 to 82 are not shown by the mixed composition formula but shown by the target composition.

In the same way as the example 1, the raw material thus mixed was put in a BN crucible, then after vacuuming inside the furnace, temperature is increased to 1800° C. with an in-furnace pressure of 0.05 MPa set at 15° C./min, retained and fired at 1800° C. for three hours in a nitrogen atmosphere (flow state 20.0 l/min), and then cooled from 1800° C. to 50° C. for one hour and half. Thereafter, the firing sample thus fired was crushed to a proper particle size by using the mortar in the atmospheric air, and the phosphor of the example 61 of the composition formula expressed by $SrAl_{1.43}Si_{3.81}O_{0.59}N_{6.79}:Ce$ (where Ce/(Sr+Ce)=0.030) was obtained.

A result of analysis, the average particle size (D50) and the specific surface area (BET) of the obtained phosphor powder, are shown in table 9. Note that Si was measured by a weight method (an absorptionmetry), the other elements were measured by ICP, the average particle size (D50) was measured by a laser diffraction scattering method, and the specific surface area was measured by a BET method. The obtained phosphor powder showed the average particle size (D50) of 24.40 μm and the specific surface area of 0.225 m²/g, and it was found that these values were in a range from 1.0 μm to 50.0 μm, which was a preferable size as the phosphor powder.

Next, the emission spectrum of the phosphor of the example 61 was measured. This measurement result is shown in table 10, and is further shown in FIG. 12. FIG. 12 is a graph showing the emission intensity of the phosphor taken on the ordinate axis as the relative intensity, and the wavelength of the light taken on the abscissa axis. Here, the emission spectrum is the spectrum of the light released from the phosphor, when the phosphor is irradiated with the light of a certain wavelength or energy. The spectrum of the light emitted from the phosphor is shown by solid line of FIG. 12, when the phosphor of the example 61 is irradiated with the monochromatic light having the wavelength of 460 nm as the excitation light.

As is obvious from FIG. 12, the phosphor had the emission spectrum with a broad peak over the broad wavelength region from 470 nm to 750 nm, and the peak wavelength thereof was 556.0 nm. (relative intensity of the emission intensity at this time were set at 100%). In addition, the half value width obtained was 117.1 nm, and the chromaticity (x, y) of the emission spectrum obtained was x=0.4045, and y=0.5481. Powder had a yellow fluorescent color, and a yellow-green emission color could be visually confirmed. The phosphor of the example 61 had a peak with extremely broad half value width such as 100 nm or more over the broad wavelength region, and therefore when used as a white LED illuminating phosphor, the white LED illumination having excellent luminance and color rendering properties can be manufactured, compared with one using the phosphor having a sharp peak. In the case of the phosphor having the sharp peak, several kinds of phosphors are required to be mixed to improve the color rendering properties. However, the phosphor of the example 61 has a broad peak, and therefore the number of the kinds of the phosphors to be mixed can be decreased, and the white LED illumination can be manufactured at a low cost.

Further, when the phosphor of the example 61 is irradiated with the monochromatic light having the wavelength of 405 nm as the excitation light, the spectrum of the light emitted from the phosphor is shown in table 10, and is further shown by broken line in FIG. 12. When the phosphor is irradiated with Ex405 nm, the emission intensity is improved by about 20% as compared to a case of Ex460 nm. The peak wavelength was 531.5 nm and the half value width was 118.1 nm, and the half value width of the emission spectrum was 80 nm or more. The chromaticity (x, y) was x=0.3476, and y=0.5305.

Next, by using FIG. 13, the excitation spectrum of the phosphor of the example 61 will be explained. FIG. 13 is a graph showing the emission intensity of the phosphor taken on the ordinate axis, and the wavelength of the excitation light taken on the abscissa axis. Here, the excitation spectrum is obtained by measuring the emission intensity with a fixed wavelength emitted from the phosphor and measuring an excitation wavelength dependency of the emission intensity, when the phosphor to be measured is excited using the monochromatic light of various wavelengths as the excitation light. In this measurement, the phosphor of the example 61 was irradiated with the monochromatic light with the wavelength range from 250 nm to 550 nm, and the excitation dependency of the emission intensity of the light having the wavelength of 556.0 nm (green light) emitted form the phosphor was measured.

As is obvious from FIG. 13, it was found that green color emission with high intensity was shown by the excitation light in a broad wavelength range from about 300 nm to about 500 nm. Particularly, highest emission efficiency is shown by the excitation light in the wavelength range from 400 nm to 480 nm, and at present, the emission device having high luminance can be manufactured by combining the phosphor with the blue LED with the emission wavelength of 460 nm and the near-ultraviolet/ultraviolet LED having the wavelength of 405 nm used as the excitation light for the one-chip type white LED illumination.

Next, the temperature characteristics of the emission intensity of the phosphor obtained by the example 61 were measured. This measurement result is shown in table 10 and is further shown in FIG. 14.

The temperature of this phosphor was increased to 25° C., 50° C., 100° C., 150° C., 200° C., 250° C., 300° C., and after it reaches a measurement temperature, the temperature was retained for 5 minutes so that the temperature of an overall samples becomes uniform, and thereafter the emission intensity was measured. Also, the emission intensity at each measurement temperature was measured as the relative intensity, with a value of the emission intensity at a room temperature (25° C.) before increasing the temperature set at 100%. Note that after measuring the emission intensity during increasing the temperature, the phosphor was cooled, and the emission intensity was measured again at 25° C. Further, the same measurement was performed when the phosphor was irradiated with the monochromatic light having the wavelength of 405 nm as the excitation light.

FIGS. 14A and 14B are graphs showing the relative emission intensity taken on the ordinate axis, with the emission intensity before increasing the temperature (25° C.) set at 100%, and showing a measurement temperature taken on the abscissa axis at which the emission intensity of the phosphor is measured, wherein FIG. 14A shows a case that the phosphor is irradiated with the monochromatic light having the wavelength of 460 nm as the excitation light, and FIG. 14B shows a case that the phosphor is irradiated with the monochromatic light having the wavelength of 405 nm as the excitation light. The measurement results of the phosphor of the example 61 are shown by thick solid lines in the FIGS. 14A and 14B.

From the result of FIG. 14A, when the phosphor of the example 61 was irradiated with the monochromatic light having the wavelength of 460 nm as the excitation light, the emission intensity showed the values of 94.4% at the measurement temperature of 100° C., 85.8% at 200° C., and 73.4% at 300° C., when the value of the emission intensity at the room temperature (25° C.) before increasing the measurement temperature was set at 100%. After increasing the temperature, the phosphor was cooled, and the measurement at 25° C. again showed 98.8%, and almost no decrease of emission intensity was observed, and even if it was observed, it was within a measurement error.

When the phosphor of the example 61 was irradiated with the monochromatic light having the wavelength of 405 nm as the excitation light (25° C.), the emission intensity of 119.9% was shown, with the value of the emission intensity set at 100% when the phosphor of the example 61 was irradiated with the monochromatic light having the wavelength of 460 nm as the excitation light. Next, from the result of FIG. 14B, when the value of the emission intensity at the room temperature (25° C.) before increasing the measurement temperature was set at 100%, the emission intensity showed the values of 92.0% at the measurement temperature of 100° C., 80.9% at 200° C., 66.5% at 300° C. After increasing the temperature, the phosphor was cooled, and the emission intensity was measured again at 25° C., and it showed 98.9%. Almost no decrease of emission intensity was observed, and even if it was observed, it was within a measurement error.

Example 62

In an example 62, the phosphor having a target composition after firing expressed by $SrAl_{1.33}Si_{4.09}O_{0.65}N_{7.02}$:Ce (wherein Ce/(Sr+Ce)=0.030) was manufactured. The phosphor of the example 62 expressed by the composition formula $SrAl_{1.33}Si_{4.09}O_{0.65}N_{7.02}$:Ce (wherein Ce/(Sr+Ce)=0.030) was obtained in the same way as the example 61, other than that during mixing the raw materials, each raw material was weighed in $SrCO_3$ of 0.970 mol, $Al_2O_3$ of (1.31−0.976)/3 mol, AlN of 1.25−((1.31−0.976)/3)×2 mol, $Si_3N_4$ of 4.75/3 mol, and $CeO_2$ of 0.030 mol, so that the molar ratio of each element is Sr:Al:Si:O:Ce=0.970:1.25:4.75:1.31:0.030. As analysis results, the average particle size (D50) and the specific surface area (BET) of the obtained phosphor powder are shown in table 9. The specific surface area of the obtained phosphor was 0.264 m²/g. It was found that the average particle size (D50) was not less than 1.0 μm and not more than 50.0 μm which was preferable as the phosphor powder.

Next, in the same ways as the example 61, the emission spectrum of the phosphor of the example 62 was measured. The measurement result is shown in table 10. As shown in the table 10, when the phosphor was irradiated with the monochromatic light having the wavelength of 460 nm as the excitation light, the emission spectrum of this phosphor had a broad peak in a broad wavelength range from 470 nm to 750 nm in the same way as the phosphor of the example 61, and the peak wavelength was 555.6 nm. Also, the half value width was 115.6 nm and the chromaticity (x, y) of the emission spectrum was x=0.4040, y=0.5481. Note that the powder showed the fluorescent color of yellow, and a green emission color could be visually confirmed. When the relative intensity of the phosphor of the example 61 was set at 100%, the relative intensity of the emission intensity of the phosphor of the example 62 was 94.0%.

Next, as shown in table 10, when the phosphor was irradiated with the monochromatic light having the wavelength of 405 nm as the excitation light, the emission spectrum of this phosphor had a broad peak in a broad wavelength range from 470 nm to 750 nm in the same way as the phosphor of the example 61, and the peak wavelength was 533.5 nm. Also, the half value width was 116.2 nm and the chromaticity (x, y) of the emission spectrum was x=0.3508, y=0.5340. Note that the powder showed the fluorescent color of yellow and a green emission could be visually confirmed. When the relative intensity of the phosphor of the example 61 was set at 100%, the relative intensity of the emission intensity of the phosphor of the example 62 was 110.9.

Next, when the phosphor of the example 62 was irradiated with the monochromatic light in the wavelength range from 250 nm to 550 nm, and the excitation dependency of the emission intensity having the wavelength of 555.6 nm emitted from this phosphor was measured, it was found that in the same way as the phosphor of the example 61, the excitation spectrum of this phosphor showed green color emission with high intensity by the excitation light in a broad wavelength range from about 300 nm to 500 nm.

Next, the temperature characteristics of the emission intensity of the obtained phosphor in the example 62 were measured in the same way as the example 61. This measurement result is shown in table 10, and further is shown in FIGS. 14A and 14B in the same way as the example 61 by using a thick one dot chain line.

From the result of FIG. 14A, when the phosphor of the example 62 was irradiated with the monochromatic light having the wavelength of 460 nm as the excitation light, the emission intensity showed 93.0% at the measurement temperature of 100° C., 83.8% at 200° C., and 70.8% at 300° C., when the value of the emission intensity at the room temperature (25° C.) before increasing the measurement temperature was set at 100%. After increasing the temperature, the phosphor was cooled and the emission intensity was measured again at 25° C., it showed 98.4%, and almost no decrease of emission intensity was observed, and even if it was observed, it was within the measurement error.

The phosphor of the example 62 has a slightly different molar ratio of Al, Si, N, O from the phosphor of the example 61, but showed excellent emission characteristics in the same way as the example 61.

From the result of FIG. 14B, when the phosphor of the example 62 was irradiated with the monochromatic light having the wavelength of 405 nm as the excitation light, the emission intensity showed 90.9% at the measurement temperature of 100° C., 78.8% at 200° C., and 64.6% at 300° C., when the value of the emission intensity at the room temperature (25° C.) before increasing the measurement temperature was set at 100%. After increasing the temperature, the phosphor was cooled and when the emission intensity was measured again at 25° C., it showed 98.6%, and almost no decrease of emission intensity could be observed, and even if it was observed, it was within the measurement error.

The phosphor of the example 62 has a slightly different molar ratio of Al, Si, N, O from the phosphor of the example 61, but showed excellent emission characteristics in the same way as the example 61.

Example 63

In the example 63, the phosphor having a target composition after firing expressed by $SrAl_{1.28}Si_{3.40}O_{0.72}N_{5.99}$:Ce (wherein Ce/(Sr+Ce)=0.030) was manufactured.

The phosphor of the example 63 expressed by the composition formula $SrAl_{1.28}Si_{3.40}O_{0.72}N_{5.99}$:Ce (wherein Ce/(Sr+Ce)=0.030) was obtained in the same way as the example 61, other than that each raw material was weighed in $SrCO_3$ of 0.970 mol, $Al_2O_3$ of (1.56−0.976)/3 mol, AlN of 1.25−((1.56−0.976)/3)×2 mol, $Si_3N_4$ of 4.25/3 mol, and $CeO_2$ of 0.030 mol, so that the molar ratio of each element becomes Sr:Al:Si:O:Ce=0.970:1.25:4.25:1.56:0.030. As analysis results, the average particle size (D50) and the specific surface area (BET) of the obtained phosphor powder are shown in table 9. It was found that the specific surface area of the obtained phosphor was 0.231 $m^2/g$ and the average particle size (D50) was not less than 1.0 μm and not more than 50.0 μm which were preferable as the phosphor powder.

Next, in the same way as the example 61, the emission spectrum of the phosphor of the example 63 was measured. This measurement result is shown in table 10. Table 10 shows the measurement results of the emission spectra when the phosphor is irradiated with the monochromatic light having the wavelengths of 460 nm and 405 nm. And when the phosphor was irradiated with the monochromatic light having the wavelength of 460 nm as the excitation light, this phosphor had a broad peak in a broad wavelength range form 470 nm to 750 nm in the same way as the phosphor of the example 61, and the peak wavelength was 555.6 nm. Also, the half value width was 116.0 nm, and the chromaticity (x, y) of the emission spectrum was x=0.3996, y=0.5498. Note that the powder showed the fluorescent color of yellow and the green emission color could be visually confirmed. Then, the relative intensity of the emission intensity of the phosphor according to the example 63 was 93.5%, when the relative intensity of the phosphor of the example 61 was set at 1000.

Next, as shown in table 10, when the phosphor was irradiated with the monochromatic light having the wavelength of 405 nm as the excitation light, the emission spectrum of this phosphor had a broad peak in a broad wavelength range form 470 nm to 750 nm in the same way as the phosphor of the example 61, and the peak wavelength was 530.4 nm. Also, the half value width was 115.9 nm and the chromaticity (x, y) of the emission spectrum was x=0.3434, y=0.5302. Note that the powder showed the fluorescent color of yellow, and the green emission color could be visually confirmed. When the relative intensity of the phosphor of the example 61 was set at 100%, the relative intensity of the emission intensity of the phosphor according to the example 63 was 111.4%.

Next, when the phosphor of the example 63 was irradiated with the monochromatic light in the wavelength range from 250 nm to 550 nm, and the excitation dependency of the emission intensity having the wavelength of 555.6 nm emitted from this phosphor was measured, it was found that, in the same way as the example 61, the excitation spectrum of this phosphor showed a green color emission with high intensity by the excitation light in a broad wavelength range from about 300 nm to 500 nm.

Next, the temperature characteristics of the emission intensity of the phosphor obtained by the example 63 were measured in the same way as the example 61. This measurement result is shown in table 10, and further is shown in the same way as the example 61 by using a thick two dot chain line in FIGS. 14A and 14B.

From the result of FIG. 14A, when the phosphor of the example 63 was irradiated with the monochromatic light having the wavelength of 460 nm as the excitation light, it was found that the emission intensity showed 93.7% at the measurement temperature of 100° C., 84.1% at 200° C., and 69.6% at 300° C., when the value of the emission intensity at the room temperature (25° C.) before increasing the measurement temperature was set at 100%. After increasing the temperature, the phosphor was cooled, and the measurement at 25° C. again showed 97.1%, and almost no decrease of emission intensity was observed, and even if it was observed, it was within a measurement error.

From the result of FIG. 14B, when the phosphor of the example 63 was irradiated with the monochromatic light having the wavelength of 405 nm as the excitation light, the emission intensity showed 91.0% at the measurement temperature of 100° C., 77.9% at 200° C., and 62.3% at 300° C., when the value of the emission intensity at the room temperature (25° C.) before increasing the measurement temperature was set at 100%. After increasing the temperature, the phosphor was cooled, and the measurement at 25° C. again showed 97.5%, and almost no decrease of emission intensity was observed, and even if it was observed, it was within a measurement error.

In the phosphor of the example 63, the molar ratio of Al, Si, N, and O was slightly different from that of the phosphor of the examples 61 and 62. However, the phosphor of the example 63 showed the excellent emission characteristics in the same way as the phosphor of the example 61.

Example 64

In an example 64, the phosphor with a target composition after firing having the composition formula of $SrAl_{1.13}Si_{4.32}O_{0.64}N_{7.13}$:Ce (wherein Ce/(Sr+Ce)=0.030) was manufactured.

The phosphor of the example 64 having the composition formula expressed by $SrAl_{1.13}Si_{4.32}O_{0.64}N_{7.13}$:Ce (wherein Ce/(Sr+Ce)=0.030) was manufactured in the same way as the example 61, other than each raw material, $SrCO_3$ of 0.970 mol, $Al_2O_3$ of (1.06−0.976)/3 mol, AlN of 1.00−((1.06−0.976)/3)×2 mol, $Si_3N_4$ of 4.5/3 mol, and $CeO_2$ of 0.030 mol, were weighed so that the molar ratio of each element was Sr:Al:Si:O:Ce=0.970:1.0:4.5:1.06:0.030. The analysis result, the average particle size (D50) and the specific surface area (BET) of the manufactured phosphor are shown in table 9. The specific surface area of the phosphor of the example 64 thus obtained was 0.254 m²/g. The average particle size (D50) was 24.08 μm. Note that although the example 64 had the same composition as that of the example 1, the example 64 has a mixing composition in which an oxygen amount is increased by 0.06 mol as compared to a mixing amount of the raw materials of the example 1.

Next, in the same way as the example 61, the emission spectrum of the phosphor of the example 64 was measured. This measurement result is shown in table 10. As shown in the table 10, when the phosphor was irradiated with the monochromatic light having the wavelength of 460 nm as the excitation light, the emission spectrum of this phosphor had a broad peak in a broad wavelength range from 470 nm to 750 nm in the same way as the phosphor of the example 61, and the peak wavelength was 559.2 nm. The half value width was 118.8 nm, and the chromaticity (x, y) of this emission spectrum was x=0.4125 and y=0.5431. Note that this phosphor powder had yellow fluorescent color and the green emission color could be visually confirmed. When the relative intensity of the emission intensity in the phosphor of the example 61 was set at 100%, the relative intensity of the phosphor of the example 64 was 94.6%.

Next, as shown in the table 10, when the phosphor was irradiated with the monochromatic light having the wavelength of 405 nm as the excitation light, this phosphor had a broad peak in a broad wavelength range from 470 nm to 750 nm in the same way as the phosphor of the example 61, and the peak wavelength was 551.0 nm. The half value width was 121.5 nm, and the chromaticity (x, y) of this emission spectrum was x=0.3699 and y=0.5343. Note that this phosphor powder had yellow fluorescent color, and the green emission color could be visually confirmed. When the relative intensity of the emission intensity in the phosphor of the example 61 was set at 100%, the relative intensity of the phosphor of the example 64 was 105.3%.

Next, the phosphor of the example 64 was irradiated with the monochromatic light in the wavelength range from 250 nm to 550 nm, and the excitation dependency of the emission intensity of the light having the wavelength of 559.2 nm emitted from this phosphor was measured. Then, it was found that in the same way as the phosphor of the example 61, the excitation spectrum of this phosphor also showed the green color emission with high intensity by the excitation light in a broad wavelength range form about 300 nm to 500 nm.

Next, in the same way as the example 61, the temperature characteristics of the emission intensity of the phosphor thus obtained in the example 64 were measured. These measurement results are shown in the table 10, and further shown in FIGS. 14A and 14B by using broken lines in the same way as the example 1.

From the result of FIG. 14A, when the phosphor of the example 64 was irradiated with the monochromatic light having the wavelength of 460 nm as the excitation light, the emission intensity showed 90.5% at the measurement temperature of 100° C., 75.0% at 200° C., and 54.3% at 300° C., when the value of the emission intensity at the room temperature (25° C.) before increasing the measurement temperature was set at 100%. After increasing the temperature, the phosphor was cooled, and the measurement at 25° C. again showed 81.8%, and the emission intensity was deteriorated by about 20%, as compared to an initial emission intensity.

From the result of FIG. 14B, when the phosphor of the example 64 was irradiated with the monochromatic light having the wavelength of 405 nm as the excitation light, the emission intensity showed 89.3% at the measurement temperature of 100° C., 72.3% at 200° C., and 51.9% at 300° C., when the value of the emission intensity at the room temperature (25° C.) before increasing the measurement temperature was set at 100%. After increasing the temperature, the phosphor was cooled, and the measurement at 25° C. again showed 84.6%, and the emission intensity was deteriorated by about 20%, as compared to the initial emission intensity.

Example 65

In an example 65, the phosphor having a target composition after firing expressed by $SrAl_{1.07}Si_{4.46}O_{0.70}N_{7.22}$:Ce (wherein Ce/(Sr+Ce)=0.030) was manufactured. The phosphor of the example 65 expressed by the composition formula $SrAl_{1.07}Si_{4.46}O_{0.70}N_{7.22}$:Ce (wherein Ce/(Sr+Ce)=0.030) was obtained in the same way as the example 61, other than that during mixing the raw materials, each raw material, $SrCO_3$ of 0.970 mol, $Al_2O_3$ of (1.06−0.976)/3 mol, AlN of 1.00−((1.06−0.976)/3)×2 mol, $Si_3N_4$ of 4.75/3 mol, and $CeO_2$ of 0.030 mol, were weighed so that the molar ratio of each element is Sr:Al:Si:O:Ce=0.970:1.0:4.75:1.06:0.030. An analysis result, the average particle size (D50) and the specific surface area (BET) of the obtained phosphor powder are shown in table 9. The specific surface area of the obtained phosphor was 0.212 m²/g. The average particle size (D50) was 25.44 μm.

Next, in the same way as the example 61, the emission spectrum of the phosphor of the example 65 was measured. This measurement result is shown in the table 10. As shown in the table 10, when the phosphor was irradiated with the monochromatic light having the wavelength of 460 nm as the excitation light, the emission spectrum had a broad peak in a broad wavelength range from 470 nm to 750 nm in the same way as the example 61, and the peak wavelength was 558.1 nm. Also, the half value width was 117.2 nm, and the chromaticity (x, y) of the emission spectrum was x=0.4114 and y=0.5445. Note that this phosphor powder had yellow fluorescent color and the green emission color could be visually confirmed. When the relative intensity of the phosphor of the example 61 was set at 100%, the relative intensity of the emission intensity of the phosphor of the example 65 was 93.4%.

Next, as shown in the table 10, when the phosphor was irradiated with the monochromatic light having the wavelength of 405 nm as the excitation light, the emission spectrum had a broad peak in a broad wavelength range from 470 nm to 750 nm in the same way as the example 61, and the peak wavelength was 551.0 nm. Also, the half value width was 119.4 nm, and the chromaticity (x, y) of the emission spectrum was x=0.3728, and y=0.5384. Note that this phosphor powder had yellow fluorescent color and the green emission color could be visually confirmed. When the relative intensity of the phosphor of the example 61 was set at 100%, the relative intensity of the emission intensity of the phosphor of the example 65 was 104.6%.

Next, when the phosphor of the example 65 was irradiated with the monochromatic light in the wavelength range from 250 nm to 550 nm and the excitation dependency of the emission intensity of the light having the wavelength of 558.1 nm emitted from this phosphor was measured, it was found that in the same way as the example 61, the excitation spectrum of this phosphor also showed the green color emission with high intensity by the excitation light in a broad wavelength range from about 300 nm to 500 nm.

Next, the temperature characteristics of the emission intensity of the phosphor of the example 65 were measured in the same way as the example 61. This measurement result is shown in the table 10, and is further shown in FIGS. 14A and 14B by using a thin one dot chain line in the same way as the example 1.

From the result of FIG. 14A, when the phosphor of the example 65 was irradiated with the monochromatic light having the wavelength of 460 nm as the excitation light, the emission intensity showed 90.4% at the measurement temperature of 100° C., 73.4% at 200° C., and 51.7% at 300° C., when the value of the emission intensity at the room temperature (25° C.) before increasing the measurement temperature was set at 100%. After increasing the temperature, the phosphor was cooled, and the measurement at 25° C. again showed 81.9%, and the emission intensity was deteriorated by about 15%, as compared to the initial emission intensity.

From the result of FIG. 14B, when the phosphor of the example 65 was irradiated with the monochromatic light having the wavelength of 405 nm as the excitation light, the emission intensity showed 88.7% at the measurement temperature of 100° C., 70.4% at 200° C., and 48.9% at 300° C., when the value of the emission intensity at the room temperature (25° C.) before increasing the measurement temperature was set at 100%. After increasing the temperature, the phosphor was cooled, and the measurement at 25° C. again showed 85.4%, and the emission intensity was deteriorated by about 15%, as compared to the initial emission intensity.

Example 66

In an example 66, the phosphor having a target composition after firing expressed by $SrAl_{1.01}Si_{4.70}O_{0.65}N_{7.52}$:Ce (wherein Ce/(Sr+Ce)=0.030) was manufactured. The phosphor of the example 66 expressed by the composition formula $SrAl_{1.01}Si_{4.70}O_{0.65}N_{7.52}$:Ce (wherein Ce/(Sr+Ce)=0.030) was obtained in the same way as the example 61, other than that during mixing the raw materials, each raw material, $SrCO_3$ of 0.970 mol, $Al_2O_3$ of (1.06−0.976)/3 mol, AlN of 1.00−((1.06−0.976)/3)×2 mol, $Si_3N_4$ of 5.00/3 mol, and $CeO_2$ of 0.030 mol, were weighed so that the molar ratio of each element is Sr:Al:Si:O:Ce=0.970:1.0:5.00:1.06:0.030. A analysis result, the average particle size (D50) and the specific surface area (BET) of the obtained phosphor powder are shown in the table 9. The specific surface area of the obtained phosphor was 0.256 $m^2/g$. The average particle size (D50) was 27.14 μm. Note that the example 66 shows the mixing composition in which an amount of oxygen is increased by 0.06 mol than the mixing amount of the raw materials of the example 2 previously shown.

Next, in the same way as the example 61, the emission spectrum of the phosphor of the example 66 was measured. This measurement result is shown in the table 10. As shown in the table 10, when the phosphor was irradiated with the monochromatic light having the wavelength of 460 nm as the excitation light, the emission spectrum of this phosphor had a broad peak in a broad wavelength range from 470 nm to 750 nm in the same way as the phosphor of the example 61, and the peak wavelength was 559.2 nm. Also, the half value width was 116.6 nm and the chromaticity (x, y) of the emission spectrum was x=0.4141, y=0.5444. Note that the powder showed the fluorescent color of yellow, and the green emission color could be visually confirmed. When the relative intensity of the phosphor of the example 61 was set at 100%, the relative intensity of the emission intensity of the phosphor of the example 66 was 95.0%.

Next, as shown in the table 10, when the phosphor was irradiated with the monochromatic light having the wavelength of 405 nm as the excitation light, the emission spectrum had a broad peak in a broad wavelength range from 470 nm to 750 nm in the same way as the example 61, and the peak wavelength was 550.9 nm. Also, the half value width was 118.5 nm, and the chromaticity (x, y) of the emission spectrum was x=0.3753, and y=0.5396. Note that this phosphor powder had yellow fluorescent color and the green emission color could be visually confirmed. When the relative intensity of the phosphor of the example 61 was set at 100%, the relative intensity of the emission intensity of the phosphor of the example 66 was 105.3%.

Next, when the phosphor of the example 66 was irradiated with the monochromatic light in the wavelength range from 250 nm to 550 nm and the excitation dependency of the emission intensity of the light having the wavelength of 559.2 nm emitted from this phosphor was measured, it was found that, in the same way as the phosphor of the example 61, the excitation spectrum of this phosphor also showed green color emission with high intensity by the excitation light in a broad wavelength range from about 300 nm to 500 nm.

Next, the temperature characteristics of the emission intensity of the phosphor thus obtained in the example 66 was measured in the same way as the example 61. This measurement result is shown in the table 10, and is further shown in FIG. 14A and FIG. 14B by using thin two dot chain lines in the same way as the example 61.

From the result of FIG. 14A, when the phosphor of the example 66 was irradiated with the monochromatic light having the wavelength of 460 nm as the excitation light, the emission intensity showed the values of 90.4% at the measurement temperature of 100° C., 76.9% at 200° C., and 60.1% at 300° C., when the value of the emission intensity at the room temperature (25° C.) before increasing the measurement temperature was set at 100%. After increasing the temperature, the phosphor was cooled, and the measurement at 25° C. again showed 98.2%, and almost no decrease of emission intensity was observed, and even if it was observed, it was within a measurement error.

From the result of FIG. 14B, when the phosphor of the example 66 was irradiated with the monochromatic light having the wavelength of 405 nm as the excitation light, the emission intensity showed 89.0% at the measurement temperature of 100° C., 73.2% at 200° C., and 55.5% at 300° C., when the value of the emission intensity at the room temperature (25° C.) before increasing the measurement temperature was set at 100%. After increasing the temperature, the phosphor was cooled, and the measurement at 25° C. again showed 98.6%, and almost no decrease of emission intensity was observed, and even if it was observed, it was within a measurement error.

As is obvious from the result of the table 10 and FIGS. 14A and 14B, samples of the examples 61 to 63 with Al/Sr being in a range of 1.1<Al/Sr≦2.0 have excellent emission characteristics compared to the samples of the examples 64 to 66 with Al/Sr being 1.0. The example 61 had an excellent initial emission intensity by about 5.0% as compared to the samples of the examples 64 to 66, and particularly the temperature characteristics were significantly improved and the deterioration of the emission intensity could be more suppressed by about 4.0% at the measurement temperature of 100° C. and 10.0% or more at 300° C. than the samples of the examples 64 to 66, under the excitation wavelength of 460 nm. Further, when these phosphors were cooled after increasing the temperature and the emission intensity was measured again at 25° C., the emission intensity of the samples of the examples 64 to 65 with Al/Sr being 1.0 were deteriorated by about 20% as compared to the emission intensity before increasing the temperature. Meanwhile, the deterioration of emission intensities of the phosphors of the examples 61 to 63 were about 3.0%, and it was found that almost no deterioration was observed and the phosphor was excellent against heat. In the same way as the phosphor of the examples 61 to 63, the emission intensity of the phosphor of the example 66 after being cooled is hardly deteriorated. Meanwhile, the emission intensity during adding heat is significantly deteriorated, and in the same way as the phosphor of the example 64 and the example 65, the phosphor is deteriorated as compared to the samples of the examples 61 to 63, and the same thing can be said under the excitation wavelength of 405 nm. In the phosphors of the examples 61 to 63, optimization of Al concentration is performed over oxygen/nitrogen concentration of a production phase and therefore reduction of impurity phase is advanced and the emission characteristics and the temperature characteristics are improved, as compared to the phosphors of the examples 64 to 66.

range of 35.5° to 36.5° is deteriorated as compared to a case of $1.1<a/m\leq2.0$ (examples 61 to 63). Meanwhile, in a case of $1.1<a/m\leq2.0$, the intensities of the diffraction peaks observed in Bragg angle (2e) ranges of 36.5° to 37.5°, 41.0° to 42.0°, and 42.0° to 43.0° are enhanced as compared to a case of $a/m\leq1.1$. This reveals that by increasing an amount of substitution of Al of the Si site, orientation properties of a crystal are changed, and by reducing the impurity phase not contributing to light emission, an excellent emission efficiency can be exhibited even under a high temperature environment. Thus, the phosphor having the excellent emission efficiency and showing the excellent emission efficiency even under the high temperature environment can be obtained.

Here, the measurement method of the X-ray diffraction pattern by this powder method will be explained.

TABLE 9

|  | Sr (wt %) | Al (wt %) | Si (wt %) | O (wt %) | N (wt %) | Ce (wt %) | OTHERS (wt %) | AVERAGE PARTICLE SIZE D50 (μm) | SPECIFIC SURFACE AREA (m²/g) |
| --- | --- | --- | --- | --- | --- | --- | --- | --- | --- |
| EXAMPLE 61 | 23.6 | 10.8 | 29.9 | 2.63 | 27.8 | 1.36 | 3.91 | 24.40 | 0.225 |
| EXAMPLE 62 | 22.8 | 9.66 | 30.9 | 2.79 | 29.8 | 1.21 | 2.84 | 24.21 | 0.264 |
| EXAMPLE 63 | 24.6 | 10.1 | 27.8 | 3.36 | 28.6 | 1.50 | 4.07 | 25.77 | 0.231 |
| EXAMPLE 64 | 22.6 | 8.06 | 32.2 | 2.72 | 28.8 | 1.04 | 4.58 | 24.08 | 0.254 |
| EXAMPLE 65 | 22.4 | 7.58 | 33.0 | 2.93 | 28.8 | 1.06 | 4.23 | 25.44 | 0.212 |
| EXAMPLE 66 | 21.7 | 6.98 | 33.8 | 2.64 | 29.8 | 1.14 | 3.94 | 27.14 | 0.256 |

TABLE 10

| | EXCITATION WAVE-LENGTH (nm) | PEAK WAVE-LENGTH (nm) | CHROMA-TICITY | | RELATIVE EMISSION INTENSITY (25° C.) (%) | CHANGE RATE OF EMISSION INTENSITY AT EACH MEASUREMENT TEMPERATURE | | | | | | | (AFTER COOLING) |
| --- | --- | --- | --- | --- | --- | --- | --- | --- | --- | --- | --- | --- | --- |
| | | | | | | (TEMPERATURE INCREASING PROCESS) | | | | | | | |
| | | | x | y | | 25° C. | 50° C. | 100° C. | 150° C. | 200° C. | 250° C. | 300° C. | 25° C. |
| EXAMPLE 61 | 460 | 556.0 | 0.404 | 0.548 | 100.0 | 100.0 | 96.8 | 94.4 | 91.0 | 85.8 | 80.1 | 73.4 | 98.8 |
| EXAMPLE 62 | 460 | 555.6 | 0.404 | 0.548 | 94.0 | 100.0 | 96.3 | 93.0 | 89.0 | 83.8 | 77.7 | 70.8 | 98.4 |
| EXAMPLE 63 | 460 | 555.6 | 0.400 | 0.550 | 93.5 | 100.0 | 96.5 | 93.7 | 89.5 | 84.1 | 77.4 | 69.6 | 97.1 |
| EXAMPLE 64 | 460 | 559.2 | 0.412 | 0.543 | 94.6 | 100.0 | 95.8 | 90.5 | 83.5 | 75.0 | 65.0 | 54.3 | 81.0 |
| EXAMPLE 65 | 460 | 558.1 | 0.411 | 0.545 | 93.4 | 100.0 | 95.9 | 90.4 | 82.9 | 73.4 | 62.9 | 51.7 | 81.9 |
| EXAMPLE 66 | 460 | 559.2 | 0.414 | 0.544 | 95.0 | 100.0 | 95.6 | 90.4 | 84.0 | 76.9 | 68.4 | 60.1 | 98.2 |
| EXAMPLE 61 | 405 | 531.5 | 0.348 | 0.530 | 119.9 | 100.0 | 96.0 | 92.0 | 87.0 | 80.9 | 74.0 | 66.5 | 98.9 |
| EXAMPLE 62 | 405 | 533.5 | 0.351 | 0.534 | 110.9 | 100.0 | 95.7 | 90.9 | 85.4 | 78.8 | 72.0 | 64.6 | 98.6 |
| EXAMPLE 63 | 405 | 530.4 | 0.343 | 0.530 | 111.4 | 100.0 | 95.9 | 91.0 | 84.8 | 77.9 | 70.2 | 62.3 | 97.5 |
| EXAMPLE 64 | 405 | 551.0 | 0.370 | 0.534 | 105.3 | 100.0 | 95.5 | 89.3 | 81.5 | 72.3 | 62.4 | 51.9 | 84.6 |
| EXAMPLE 65 | 405 | 551.0 | 0.373 | 0.538 | 104.6 | 100.0 | 95.6 | 88.7 | 80.3 | 70.4 | 59.8 | 48.9 | 85.4 |
| EXAMPLE 66 | 405 | 550.9 | 0.375 | 0.540 | 105.3 | 100.0 | 95.5 | 89.0 | 81.4 | 73.2 | 64.3 | 55.5 | 98.6 |

(Powder X-Ray Diffraction Pattern)

In the examples 61 to 66, diffraction patterns obtained by a powder X-ray method are shown in FIG. 15.

From the results shown in FIG. 15, a product phase contained in the phosphor of the present invention has characteristic peaks in a Bragg angle (2θ) ranges of 12.5 to 13.5°, 17.0 to 18.0°, 21.0 to 22.0°, 22.5 to 23.5°, 26.5 to 27.5°, 28.5 to 29.5°, 34.0 to 35.0°, 35.5 to 36.5°, 36.5 to 37.5°, 41.0 to 42.0°, 42.0 to 43.0°, 56.5 to 57.5°, 66.0 to 67.0°. From this diffraction pattern, a crystal system of a main product phase of this phosphor is considered to be an orthorhombic system or a monoclinic system.

In a case of $a/m\leq1.1$ (examples 64 to 66), the intensity of a strongest diffraction peak observed in Bragg angle (2e)

The phosphor to be measured was pulverized after firing up to a prescribed (preferably 1.0 μm to 50.0 μm) average particle size by using pulverizing means such as a mortar and a ball mill, and a holder of titanium was filled with the phosphor thus pulverized so that its surface becomes flat, and the X-ray diffraction pattern of the phosphor was measured by using an XRD device by RIGAKU DENKI INC., "RINT 2000". Measurement conditions are as follows.

Measuring instrument: "RINT 2000" by RIGAKU DENKI INC.

X-ray tube: CoKα

Tube voltage: 40 kV

Tube current: 30 mA

Scan method: 2θ/θ

Scan speed: 0.3°/min
Sampling interval: 0.01°
Start angle (2θ): 10°
Stop angle (2θ): 90°

The deviation of the Bragg angle (2θ) is possibly caused by an uneven sample surface to be irradiated with X-ray, measurement conditions of X-ray, and particularly the difference in scan speed. Therefore, a slight deviation would be allowable in the range where a characteristic diffraction peak is observed. In order to suppress the deviation as much as possible, Si is mixed in the phosphor sample, with the scan speed set at 0.3°/min, and the deviation of Si peak is corrected after X-ray measurement, to thereby obtain the Bragg angle (Measurement of True Density)

Further, a true density measurement was performed for the samples of the examples 61 to 63, and it was found that all of the samples show the values in the vicinity of 3.45 g/cc such as 3.43 g/cc, 3.45 g/cc, and 3.46 g/cc. Note that an Ultrapycnometer 1000 by QUANTACHROME Inc., was used for measuring the true density. When the impurity phase in the product phase is increased, the true density is increased or decreased than the aforementioned values, and therefore the true density of the phosphor of the present invention may be in a range of 3.45 g/cc±3% to obtain excellent emission characteristics and temperature characteristics.

Examples 67 to 72

In the examples 67 to 72, the samples (examples 67 to 72), with a/m ratio (here, a/m and Al/Sr have the same meaning) changed, were manufactured, in the phosphor having composition formula of a target composition after firing expressed by $SrAl_aSi_{3.81}O_{0.59}N_n$:Ce(Ce/(Sr+Ce)=0.030, n=2/3 m+a+4/3b−2/3o, m=1.0, b=3.81, o=0.59), and the peak wavelength, the chromaticity (x, y), the relative emission intensity at 25° C., and the temperature characteristics were measured, as the emission characteristics in each sample.

Here, in the manufacture of the phosphors of the examples 67 to 72, each sample was manufactured in the same way as the example 61, other than that the mixing ratio of only AlN(3N) of each raw material of $SrCO_3$(3N), $Al_2O_3$(3N), AlN(3N), $Si_3N_4$(3N), $CeO_2$(3N) was adapted, and the emission intensity and the temperature characteristics of each sample thus manufactured were measured. The blending ratio of Al and Sr adjusted was set at Al/Sr=1.10 (example 67), Al/Sr=1.21 (example 68), Al/Sr=1.38 (example 69), Al/Sr=1.43 (example 70), Al/Sr=1.66 (example 71), Al/Sr=2.21 (example 72).

The results of the emission characteristics and the temperature characteristics of each sample manufactured in the examples 67 to 72 are shown in table 11 and FIG. 16.

In the measurement of the emission intensity shown in the table 11, the values of the emission intensity of the samples (25° C.) of the examples 67 to 72 were shown by the relative emission intensity, when the value of the emission intensity at the time of irradiating the phosphor of the example 70 with the monochromatic light having the wavelength of 460 nm as the excitation light was set at 100%. Next, the value of the emission intensity at the room temperature (25° C.) before increasing the measurement temperature was standardized as 100% for each sample, and the measurement results of the change of the emission intensity at the time of increasing the measurement temperature from 25° C. to 300° C. are shown. In addition, the table 11 shows the values of the emission intensities when the samples are cooled again to 25° C. after increasing the temperature of the samples up to 300° C. Note that the light having the wavelength of 460 nm was used as the excitation light.

FIG. 16 shows the measurement results of the temperature characteristics, wherein the value of the relative emission intensity is taken on the ordinate axis, and the value of the measurement temperature, at which the measurement of the emission intensity is performed, is taken on the abscissa axis, and the example 67 is shown by a solid line, the example 68 is shown by a thick one dot chain line, the example 69 is shown by a thick two dot chain line, the example 70 is shown by a thin one dot chain line, the example 71 is shown by a short broken line, and the example 72 is shown by a long broken line.

As is obvious from the results of the table 11 and FIG. 16, the phosphor, with Al/Sr being 1.43, shows most excellent emission characteristics. Incidentally, the emission intensity was excellent by about 8.0% at 25° C. before increasing the temperature as compared to the case that Al/Sr was 1.10, and the deterioration of the emission intensity was small in all temperature regions even when the temperature was increased, and the excellent temperature characteristics were shown. At the measurement temperature of 100° C., the deterioration of the emission intensity could be suppressed by about 4.5% as compared to the case that Al/Sr was 1.10, and at the measurement temperature of 300° C., the deterioration of the emission intensity could be suppressed by about 20.0% as compared to the case that Al/Sr is 1.10.

In a region in which the value of Al/Sr is smaller than 1.43, the deterioration of the emission intensity during increasing the temperature can be suppressed with increase of this value. However, when the value of Al/Sr is made further larger, with a peak in the vicinity of Al/Sr=1.43 (example 70), the deterioration of the emission intensity becomes large again, such as $(P_{25}-P_{100})/P_{25} \times 100 > 10.0$ at the measurement temperature of 100° C., when the value of Al/Sr is Al/Sr=2.21 (example 72). In addition, in a region in which the value of Al/Sr is small, the emission intensity at 25° C. after increasing the temperature and cooling is significantly deteriorated after cooling as compared to before increasing the temperature. Meanwhile, in a region in which the value of Al/Sr is large, there is a problem that the initial emission intensity is low even before increasing the temperature. Accordingly, in order to obtain a sufficiently practical phosphor, the value of the Al/Sr is preferably in a range of $1.1 < a/m \leq 2.0$.

This is because the phosphor of the present invention is a nitride, oxynitride phosphor having a structure Sr with large ionic radius enters in a gap of an assembled network, being a structure in which a part of Si of a tetrahedron structure of $(SiN_4)$ is substituted with Al, and a part of N thereof is substituted with O, which is different structure from conventional nitride and oxynitride phosphors. Namely, the reason is that by having the network structure of $(SiN_4)$ different from a case of allowing Ca to enter, because Sr of the phosphor of the present invention has a larger ionic radius than Ca of $Ca_x(Al, Si)_{12}(O,N)_{16}$:Eu (wherein $0 < x \leq 1.5$), having the same tetrahedron structure of $(SiN_4)$ as that of the phosphor of the present invention, and by having different Al substitution amount of Si and O substitution amount of N, the optimization is performed into a structure of the phosphor having the excellent emission characteristics. Then, it can be considered that by the optimization of the crystal structure, the activator can be regularly present in this phosphor, and transfer of excitation energy used for light emission is efficiently performed, and therefore the emission efficiency is improved. Further, this crystal structure is nitride or oxynitride having high temperature resistance, generated by reaction of AlN and $Si_3N_4$. Therefore, it can be considered that almost no structure change occurs even when the temperature is increased, and the deterioration of the emission intensity caused by the increase of the temperature of the phosphor itself is suppressed.

TABLE 11

| | Al/Sr | PEAK WAVE-LENGTH (nm) | CHROMATICITY x | CHROMATICITY y | RELATIVE EMISSION INTENSITY (25° C.) (%) | CHANGE RATE OF EMISSION INTENSITY AT EACH MEASUREMENT TEMPERATURE (TEMPERATURE INCREASING PROCESS) | | | | | | | (AFTER COOLING) |
|---|---|---|---|---|---|---|---|---|---|---|---|---|---|
| | | | | | | 25° C. | 50° C. | 100° C. | 150° C. | 200° C. | 250° C. | 300° C. | 25° C. |
| EXAMPLE 67 | 1.000 | 559.7 | 0.413 | 0.542 | 91.3 | 100.0 | 95.7 | 90.0 | 82.6 | 74.1 | 64.6 | 53.3 | 81.3 |
| EXAMPLE 68 | 1.100 | 558.2 | 0.410 | 0.545 | 94.3 | 100.0 | 96.2 | 91.5 | 85.8 | 79.0 | 71.2 | 62.6 | 92.7 |
| EXAMPLE 69 | 1.250 | 558.1 | 0.405 | 0.548 | 98.6 | 100.0 | 96.7 | 93.9 | 90.1 | 85.4 | 79.4 | 72.2 | 98.5 |
| EXAMPLE 70 | 1.300 | 556.0 | 0.404 | 0.548 | 100.0 | 100.0 | 96.8 | 94.4 | 91.0 | 85.8 | 80.1 | 73.4 | 98.8 |
| EXAMPLE 71 | 1.500 | 556.2 | 0.400 | 0.546 | 72.4 | 100.0 | 95.6 | 92.0 | 87.4 | 82.1 | 75.9 | 69.3 | 97.6 |
| EXAMPLE 72 | 2.000 | 558.1 | 0.405 | 0.543 | 64.9 | 100.0 | 93.9 | 87.9 | 81.2 | 74.6 | 67.5 | 60.6 | 96.8 |

Examples 73 to 75

In examples 73 to 75, samples of the example 73 to the example 75 were manufactured, with a/m ratio (here, a/m and Al/Sr have the same meaning) changed in the phosphor with the composition formula of a target composition after firing expressed by $SrA_aSi_{4.09}O_{0.65}N_n$:Ce(Ce/(Sr+Ce)=0.030, n=2/3m+a+4/3b−2/3o, m=1.0, b=4.09, o=0.65), and the peak wavelength, the relative emission intensity at 25° C., the temperature characteristics and the chromaticity (x, y) were measured as the emission characteristics in each sample.

Here, in the manufacture of the phosphors of the examples 73 to 75, the phosphor samples were manufactured in the same way as the example 62, other than adapting, as was explained in the example 62, the mixing ratio of only AlN (3N) out of each raw material of $SrCO_3$(3N), $Al_2O_3$(3N), AlN(3N), $Si_3N_4$(3N), and $CeO_2$(3N), and the emission intensity and the temperature characteristics of each sample thus manufactured were measured. The mixing ratio of the adjusted Al and Sr was set at Al/Sr=1.07 (example 73), Al/Sr=1.33 (example 74), and Al/Sr=1.60 (example 75).

The emission characteristics and the temperature characteristics of each sample manufactured in the examples 73 to 75 are shown in table 12 and FIG. 17.

As shown in the table 12, the values of the emission intensities of the examples 73 to 75 (25° C.) are shown by the relative emission intensity, when the value of the emission intensity at the time of irradiating the phosphor of the example 75 with the monochromatic light having the wavelength of 460 nm as the excitation light (25° C.). Next, the values of the emission intensities at the room temperature (25° C.) before increasing the measurement temperature are standardized as 100% for each sample, and the measurement results of the change of emission intensities at the time of increasing the measurement temperature from 25° C. to 300° C. are shown. In addition, the table 12 also shows the values of the emission intensities when the temperature of the samples are increased up to 300° C. and thereafter the samples are cooled again to 25° C. Note that the light having the wavelength of 460 nm was used as the excitation light.

FIG. 17 shows the measurement result of the temperature characteristics, wherein the value of the relative emission intensity is taken on the ordinate axis and the emission intensity is taken on the abscissa axis, and the example 73 is shown by solid line, the example 74 is shown by one dot chain line, and the example 75 is shown by two dot chain line.

As is obvious from the result of the table 12 and FIG. 17, the phosphor exhibited most excellent emission characteristics, with Al/Sr being in the vicinity of 1.33 to 1.60. Incidentally, Al/Sr is more excellent than a case of 1.07 by about 9.0% at 25° C. before increasing the temperature, and even when the temperature is increased, the deterioration of the emission intensity is small in all of the temperature range at the time of increasing the temperature, thereby exhibiting the excellent temperature characteristics. At the measurement temperature of 100° C., the deterioration of the emission intensity could be suppressed by about 4.0%, compared to the case that Al/Sr is 1.07, and at the measurement temperature of 300° C., the deterioration of the emission intensity could be suppressed by about 20% compared to the case that Al/Sr is 1.07. Moreover, when Al/Sr is 1.07, the emission intensity at 25° C. after increasing/decreasing the temperature is more deteriorated by about 17% than a case before increasing the temperature. Meanwhile, almost no deterioration of the emission intensity occurs when Al/Sr is 1.33 and 1.60, and even if it occurs, it is within a level of measurement error.

As described above, in the same way as the examples 67 to 72, it was found that a sufficiently practicable phosphor could also be obtained in the examples 73 to 75, provided that Al/Sr was within a range of 1.1<a/m≦2.0. In the examples 73 to 75, since the molar ratios of Si are larger than those of the examples 67 to 72, optimal range of Al/Sr is slightly different.

TABLE 12

| | PEAK WAVE-LENGTH (nm) | CHROMATICITY x | CHROMATICITY y | RELATIVE EMISSION INTENSITY (25° C.) (%) | CHANGE RATE OF EMISSION INTENSITY AT EACH MEASUREMENT TEMPERATURE (TEMPERATURE INCREASING PROCESS) | | | | | | | (AFTER COOLING) |
|---|---|---|---|---|---|---|---|---|---|---|---|---|
| | | | | | 25° C. | 50° C. | 100° C. | 150° C. | 200° C. | 250° C. | 300° C. | 25° C. |
| EXAMPLE 73 | 558.2 | 0.412 | 0.544 | 91.0 | 100.0 | 95.3 | 89.3 | 81.7 | 72.0 | 61.5 | 50.7 | 82.6 |
| EXAMPLE 74 | 555.6 | 0.404 | 0.548 | 100.0 | 100.0 | 96.3 | 93.0 | 89.0 | 83.8 | 77.7 | 70.8 | 98.4 |
| EXAMPLE 75 | 555.8 | 0.398 | 0.549 | 97.2 | 100.0 | 96.0 | 93.2 | 89.9 | 85.5 | 79.9 | 73.2 | 96.5 |

Examples 76 to 79

In examples 76 to 79, samples of the example 76 to the example 79 were manufactured, with o/m ratio (here, o/m and O/Sr have the same meaning) changed in the phosphor with the composition formula of a target composition after firing expressed by $SrAl_{1.43}Si_{3.81}O_oN_n$:Ce (Ce/(Sr+Ce)=0.030, n=2/3m+a+4/3b−2/3o, m=1.0, a=1.43, b=3.81), and the peak wavelength, the relative emission intensity at 25° C., the temperature characteristics and the chromaticity (x, y) were measured as the emission characteristics in each sample.

Here, in the manufacture of the phosphors of the examples 76 to 79, the phosphor sample was manufactured in the same way as the example 61, other than adapting, as was explained in the example 61, the mixing ratios of $Al_2O_3$(3N) and AlN (3N) out of each raw materials of $SrCO_3$(3N), $Al_2O_3$(3N), AlN(3N), $Si_3N_4$(3N), and $CeO_2$(3N) were adjusted and the emission intensity and the temperature characteristics of each sample thus manufactured were measured. The mixing ratio of the adjusted O and Sr was set at O/Sr=0.48 (example 76), O/Sr=0.59 (example 77), O/Sr=0.70 (example 78), and O/Sr=0.81 (example 79).

The results of the emission characteristics and the temperature characteristics of each sample manufactured in the examples 76 to 79 are shown in table 13 and FIG. 18A.

In the measurement of the emission intensity shown in the table 13, the value of the emission intensity (25° C.) of the examples 76 to 79 was shown by the relative emission intensity, when the value of the emission intensity at 25° C. when the phosphor of the example 77 was irradiated with the monochromatic light having the wavelength of 460 nm. Next, the value of the emission intensity at the room temperature of 25° C. before increasing the measurement temperature was standardized as 100% for each sample, and the measurement result of the change of the emission intensity at the time of increasing the measurement temperature from 25° C. to 300° C. is shown. In addition, the table 13 also shows the value of the emission intensity when the temperature of the sample is increased up to 300° C. and is cooled again down to 25° C. Note that the light having the wavelength of 460 nm was used as the excitation light.

FIG. 18A shows the measurement result of the temperature characteristics, wherein the value of the relative emission intensity is taken on the ordinate axis, and the value of the measurement temperature, at which the measurement of the emission intensity is performed, is taken on the abscissa axis, and the example 76 is shown by a solid line, the example 77 is shown by one dot chain line, the example 78 is shown by two dot chain line, and the example 79 is shown by a broken line.

FIG. 18B is a graph showing a relation between oxygen content and the relative emission intensity in each sample, wherein the relative emission intensity is taken on the ordinate axis and the oxygen content in each sample is taken on the abscissa axis.

As is obvious from the results of the table 13, FIG. 18A, and FIG. 18B, the phosphor, with O/Sr being 0.59, shows most excellent emission characteristics. Incidentally, the emission intensity was excellent by about 17.0% at 25° C. before increasing the temperature as compared to the case that O/Sr is 0.48, and the deterioration of the emission intensity was small in all temperature regions even when the temperature was increased, and the excellent temperature characteristics were shown. At the measurement temperature of 100° C., the deterioration of the emission intensity could be suppressed by about 3.0% as compared to the case that O/Sr was 0.48, and at the measurement temperature of 300° C., the deterioration of the emission intensity could be suppressed by about 6.0% as compared to the case that O/Sr is 0.48.

Although in this example, the value of Al/Sr is set at 1.43 (best value in the examples 67 to 72), the temperature characteristics of the example 76 is slightly deteriorated compared to other samples. However, in a range of this example, an excellent result regarding the temperature characteristics of each sample is obtained, irrespective of the value of O/Sr. Meanwhile, the initial emission intensity is significantly affected by the value of O/Sr, and it was found that the initial emission intensity was improved by 10%, as compared to a case of other values, when the value of O/Sr is in the vicinity of O/Sr=0.59, being an optimal value. Then, when the value of O/Sr is within a range of 0.0<o/m≦1.5, more preferably within a range of 0.0<o/m≦1.0, a sufficiently practicable phosphor can be obtained.

In the present invention, the reason seems to be as follows. Although a part of Si of a tetrahedron structure of (SiN4) is substituted with Al, when only the Al substitution amount is changed, the crystal structure is deviated from the structure suitable for light emission because Al has a larger ionic radius than that of Si, and further the valency of an entire body of a matrix structure is unstable because Si has the valency of IV while Al has the valency of III. However, when a part of site N is substituted with O having smaller ionic radius than N, the crystal structure suitable for light emission can be taken, and further the excellent emission characteristics can be exhibited because the valency of the entire body of the matrix structure becomes stable zero.

TABLE 13

| | PEAK WAVE-LENGTH (nm) | CHROMATICITY | | RELATIVE EMISSION INTENSITY (25° C.) (%) | CHANGE RATE OF EMISSION INTENSITY AT EACH MEASUREMENT TEMPERATURE | | | | | | | (AFTER COOLING) | | |
|---|---|---|---|---|---|---|---|---|---|---|---|---|---|---|
| | | | | | (TEMPERATURE INCREASING PROCESS) | | | | | | | | | |
| | | x | y | | 25° C. | 50° C. | 100° C. | 150° C. | 200° C. | 250° C. | 300° C. | 25° C. | O (wt %) | N (wt %) |
| EXAMPLE 76 | 558.2 | 0.408 | 0.545 | 82.8 | 100.0 | 95.5 | 91.4 | 86.2 | 80.4 | 74.2 | 67.4 | 98.3 | 2.46 | 29.0 |
| EXAMPLE 77 | 556.0 | 0.404 | 0.548 | 100.0 | 100.0 | 96.8 | 94.4 | 91.0 | 85.8 | 80.1 | 73.4 | 98.8 | 2.63 | 27.8 |
| EXAMPLE 78 | 555.6 | 0.399 | 0.549 | 87.8 | 100.0 | 96.7 | 94.0 | 90.2 | 85.3 | 79.4 | 72.6 | 97.6 | 3.61 | 26.8 |
| EXAMPLE 79 | 554.7 | 0.395 | 0.549 | 79.4 | 100.0 | 97.1 | 93.9 | 90.0 | 85.4 | 79.0 | 71.9 | 96.1 | 4.39 | 27.9 |

Examples 80 to 82

In the examples 80 to 82, the samples of examples 80 to 82, with o/m ratio (here, o/m and O/Sr have the same meaning) changed, were manufactured, in the phosphor having composition formula of a target composition after firing expressed by $SrAl_{1.33}Si_{4.09}O_oN_n$:Ce(Ce/(Sr+Ce)=0.030, n=2/3m+a+4/3b-2/3o, m=1.0, a=1.33, b=4.09), and the peak wavelength, the chromaticity (x, y), the relative emission intensity at 25° C., and the temperature characteristics were measured, as the emission characteristics in each sample.

Here, in the manufacture of the phosphors of the examples 80 to 82, each phosphor sample was manufactured in the same way as the example 62, other than adapting the mixing ratio of $Al_2O_3$(3N) and AlN(3N) of each raw material of $SrCO_2$(3N), $Al_2O_2$(3N), AlN(3N), $Si_3N_4$(3N), $CeO_2$(3N), and the emission intensity and the temperature characteristics of each sample thus manufactured were measured. The blending ratio of O and Sr adjusted was set at O/Sr=0.52 (example 80), O/Sr=0.65 (example 81), and O/Sr=0.77 (example 82).

The result of the emission characteristics and the temperature characteristics of each sample manufactured in the examples 80 to 82 is shown in table 14 and FIG. 19A.

In the measurement of the emission intensity shown in the table 14, the values of the emission intensity of the samples (25° C.) of the examples 80 to 82 were shown by the relative emission intensity, when the value of the emission intensity at the time of irradiating the phosphor of the example 81 with the monochromatic light having the wavelength of 460 nm as the excitation light (25° C.) was set at 100%. Next, the value of the emission intensity at the room temperature (25° C.) before increasing the measurement temperature was standardized as 100% for each sample, and the measurement result of the change of the emission intensity at the time of increasing the measurement temperature from 25° C. to 300° C. was shown. In addition, the table 14 shows the value of the emission intensity when the sample is cooled again to 25° C. after increasing the temperature of the sample up to 300° C. Note that the light having the wavelength of 460 nm was used as the excitation light.

FIG. 19A shows the measurement result of the temperature characteristics, wherein the value of the relative emission intensity is taken on the ordinate axis, and the value of the measurement temperature, at which the measurement of the emission intensity is performed, is taken on the abscissa axis, and the example 80 is shown by a solid line, the example 81 is shown by one dot chain line, and the example 82 is shown by two dot chain line.

Also FIG. 19B is a graph showing a relation between oxygen content and the relative emission intensity in each sample, wherein the relative emission intensity is taken on the ordinate axis and the oxygen content in each sample is taken on the abscissa axis.

As is obvious from the result of the table 14, FIG. 19A, and FIG. 19B, the phosphor of this example shows most excellent emission characteristics, when the value of O/Sr is 0.65. For example, the value of O/Sr is more excellent by about 5.0% than a case of 0.52 before increasing the temperature (25° C.), and even when the temperature is increased, the deterioration of the emission intensity is slightly smaller in an entire temperature region, thus exhibiting the excellent temperature characteristics. At the measurement temperature of 100° C., the deterioration of the emission intensity can be suppressed in a range of $(P_{25}-P_{100})/P_{25}\times 100 \leq 10.0$, and at the measurement temperature of 300° C., the deterioration of the emission intensity can be suppressed by about 3.4% as compared to a case that the value of O/Sr is 0.52.

Regarding the temperature characteristics of the phosphor of this example, since the value of Al/Sr is set at 1.33 (best value in the examples 73 to 75), an excellent result is obtained in a range of this example, irrespective of the value of O/Sr. However, the initial emission intensity is significantly affected by the value of O/Sr, and it was found that the initial emission intensity was largest at the case of O/Sr=0.65, being the optimum value, and for example, was larger by about 25.0% as compared to a case of O/Sr=0.77. Then, in the examples 80 to 82 also, in the same way as the case of the examples 76 to 79, when the value of O/Sr is within a range of $0.0 < o/m \leq 1.5$, more preferably within a range of $0.0 < o/m \leq 1.0$, a sufficiently practicable phosphor can be obtained.

Here, Al molar ratio and Si molar ratio are different between the examples 80 to 82 and the examples 76 to 79. Therefore, a tendency of the optimal value of o/m in the examples 80 to 82 is slightly different from the examples 76 to 79. Particularly, difference is observed in the initial emission intensity in the vicinity of O/Sr=0.50, and in the examples 76 to 79, the initial emission intensity is deteriorated by about 17.0% as compared to the initial emission intensity under the optimal value of O/Sr=0.59. However, in the examples 80 to 82, the initial emission intensity is deteriorated only by about 5.0% as compared to the optimal value of O/Sr=0.65. Accordingly, it is found that the optimal value of O/Sr is not determined independently, but is changed according to the Al substitution amount of the site Si.

TABLE 14

| | PEAK WAVE-LENGTH (nm) | CHROMATICITY x | CHROMATICITY y | RELATIVE EMISSION INTENSITY (25° C.) (%) | CHANGE RATE OF EMISSION INTENSITY AT EACH MEASUREMENT TEMPERATURE (TEMPERATURE INCREASING PROCESS) 25° C. | 50° C. | 100° C. | 150° C. | 200° C. | 250° C. | 300° C. | (AFTER COOLING) 25° C. | O (wt %) | N (wt %) |
|---|---|---|---|---|---|---|---|---|---|---|---|---|---|---|
| EXAMPLE 80 | 557.3 | 0.407 | 0.546 | 94.5 | 100.0 | 96.3 | 92.7 | 87.7 | 81.7 | 74.6 | 67.4 | 99.0 | 2.50 | 28.6 |
| EXAMPLE 81 | 555.6 | 0.404 | 0.548 | 100.0 | 100.0 | 96.3 | 93.0 | 89.0 | 83.8 | 77.7 | 70.8 | 98.4 | 2.79 | 29.8 |
| EXAMPLE 82 | 557.2 | 0.401 | 0.547 | 76.0 | 100.0 | 97.0 | 93.1 | 88.6 | 82.7 | 75.9 | 68.3 | 97.8 | 3.69 | 29.6 |

Hereunder, in the examples 83 to 92, evaluation was made for the phosphor mixture and the light emission device using the phosphors of the aforementioned examples 1 and example 61. In comparative examples 4 to 8, the evaluation was made for the phosphor mixture and the light emission device using a conventional green phosphor.

Example 83

In an example 83, the emission characteristics and the color rendering properties were evaluated when the phosphor sample $SrAlSi_{4.5}ON_7$:Ce (wherein Ce/(Sr+Ce)=0.030) of the example 1 of the present invention was excited by using the light emitting element (LED) emitting the light having the wavelength of 460 nm. However, the emission wavelength of the light emitting element may be in an excitation band range from 300 nm to 500 nm where efficiency of this phosphor is excellent, and is not limited to the wavelength of 460 nm.

First, the LED element (emission wavelength of 467 nm) of blue light using a nitride semiconductor was prepared as a light emission part. Further, the phosphor prepared by the example 1, epoxy resin, and a dispersant were mixed to obtain a mixture. Note that regarding the resin, it is preferable to set the transmittance and the refractive index to be higher, and not only epoxy-based resin but also silicone-based resin may be satisfactory provided that the aforementioned condition is satisfied. Fine particles such as $SiO_2$ may be slightly mixed in the dispersant. Then, by sufficiently stirring this mixture, which was then applied on the LED light element by a conventional process, a white LED illumination (light emission device) was manufactured. Since the emission color and the emission efficiency are changed by the ratio of the phosphor and the resin in the aforementioned mixture and the thickness of coating, the condition may be adjusted in accordance with a target color temperature.

FIG. 20 shows the emission spectrum when power of 20 mA is applied to the manufactured white LED illumination. FIG. 20 is a graph showing the relative emission intensity taken on the ordinate axis and the emission wavelength (nm) taken on the abscissa axis. Then, the emission spectrum of the white LED illumination of the example 83 is shown by a solid line.

This phosphor emitted light under excitation of blue light emitted by the light emission part, and emitted light of white light having the emission spectrum with a broad peak continuously in the wavelength range from 400 nm to 750 nm, and the white LED illumination was thereby obtained. When the color temperature, chromaticity, and color rendering properties of this light emission were measured, it was found that the color temperature was 6078K, x=0.317, and y=0.374. Moreover, an general color rendering index (Ra) of this white LED lamp was 73. Further, by suitably changing the blending amount of the phosphor and the resin, the emission color with different color temperature could be obtained.

Example 84

In the example 84, in the same way as the example 83, the emission characteristics and the color rendering properties of this phosphor were evaluated when the phosphor of $SrAl_{1.43}Si_{3.81}O_{0.59}N_{6.79}$:Ce of the example 61 of the present invention was excited by using the light emitting element (LED) emitting light having the wavelength of 460 nm.

FIG. 21 shows the emission spectrum when the power of 20 mA is applied to the white LED illumination manufactured by the same manufacturing method as that of the example 83. FIG. 21 is a graph showing the relative emission intensity taken on the ordinate axis, and the emission wavelength (nm) taken on the abscissa axis. Then, the emission spectrum of the white LED illumination of the example 84 is shown by a solid line.

This phosphor was excited to emit light by the blue light emitted by the light emission part, and emitted white light having the emission spectrum with a broad peak continuously in the wavelength range from 400 nm to 750 nm, and the white LED illumination was thereby obtained. When the color temperature, chromaticity, and the color rendering properties of this light emission were measured, it was found that the color temperature was 6344K, the chromaticity was x=0.3115, y=0.3649, and the general color rendering index Ra was 72.

Examples 85 and 86

In an example 85 or an example 86, the phosphor mixture was manufactured, which emits light of correlated color temperature of 5000K (example 85) or 3000K (example 86), when the red phosphor was further added to the phosphor of the example 61 and the phosphor mixture was then excited by the light emitting element (LED) emitting light having the wavelength of 460 nm. Then, the emission characteristics and the color rendering properties of this phosphor mixture were evaluated. Note that in this example, $CaSiAlN_3$:Eu was used as the red phosphor, however the red phosphor having nitrogen such as $Sr_4AlSi_{11}O_2N_{17}$:Eu, $(Ca, Sr)_2Si_5N_8$:Eu or a sulfide-based red phosphor such as SrS:Eu, CaS:Eu can also be used.

1) Preparation of the Phosphor Sample

The green phosphor $SrAl_{1.43}Si_{3.81}O_{0.59}N_{6.79}$:Ce (phosphor of the example 61) was manufactured by the method explained in the example 61. Meanwhile, the red phosphor $CaSiAlN_3$:Eu was manufactured by a method described hereunder.

Commercially available Ca3N2(2N), AlN(3N), Si3N4 (3N), and Eu2O3(3N) were prepared, and each raw material was weighed so that the molar ratio of each element was Ca:Al:Si:Ce=0.970:1.00:1.00:0.030, and was mixed by using a mortar in a nitrogen atmosphere. The temperature of mixed raw materials was increased at a temperature-rising rate of 15° C./min up to 1500° C. in a powder state under a nitrogen atmosphere. Then, the raw materials were retained/fired for 12 hours at 1500° C., and thereafter were cooled for 1 hour from 1500° C. down to 200° C., to thereby obtain the phosphor having the composition formula expressed by $CaSiAlN_3$:Eu. The sample thus obtained was pulverized, classified, and a red phosphor sample was prepared.

2) Manufacture of the Phosphor Mixture

The emission spectrum for two kinds of phosphor samples such as $SrAl_{1.43}Si_{3.81}O_{0.59}N_{6.79}$:Ce and $CaSiAlN_3$:Eu under excitation by excitation light having the wavelength of 460 nm were respectively measured, and from the emission spectra, relative mixing ratios to achieve 5000K (example 85) or 3000K (example 86) of the correlated color temperature of both phosphor mixtures were obtained by simulation. According to the results of this simulation, when the correlated color temperature was 5000K (example 85), the molar ratio was $SrAl_{1.43}Si_{3.81}O_{0.59}N_6$:Ce:$CaAlSiN_3$:Eu=98.0:2.0 (molar ratio), and when the correlated color temperature was 3000K (example 86), the molar ratio was $SrAl_{1.43}Si_{3.81}O_{0.59}N_{6.79}$:Ce: $CaAlSiN_3$:Eu=95.0:5.0 (molar ratio). Based on these results, each phosphor was weighed and the phosphor mixtures were obtained.

However, by the emission wavelength of the light emission part (excitation wavelength of the phosphor mixture) and the emission efficiency of the phosphor to the excitation light, a preferable mixing ratio is sometimes deviated from this simulation result. In this case, the blending ratio of the phosphors is suitably adjusted, and an actual emission spectrum shape is arranged.

3) Evaluation by the Light Emitting Element

In the same way as the examples 83 and 84, the LED (having the emission wavelength of 460 nm) of blue light having the nitride semiconductor was prepared as the light emission part, and on this LED, the mixture of the aforementioned phosphor mixture and resin was set. Regarding the mixing ratio of the phosphor mixture and the resin, a suitable blending ratio of the phosphors were adjusted so as to obtain a daylight white color corresponding to the color temperature of 5000K and a warm color corresponding to 3000K, based on the simulation result, which was then combined with the light emission part of the LED, and the white color LED illumination (light emission device) were thereby manufactured, by a conventional process.

The aforementioned both phosphor mixtures were excited/emitted light by the blue light emitted by the light emission part, and the white LED illuminations emitting white light having the emission spectra with a broad peak in the wavelength range from 420 nm to 750 nm could be obtained. Here, the emission spectra when the power of 20 mA was fed to the light emitting element of the manufactured white LED illumination are shown in FIG. 21. In FIG. 21, the emission spectrum of daylight white color of the white LED illumination set to have the color temperature of 5000K is shown by one dot chain line, and the emission spectrum of warm color of the white LED illumination set to have the color temperature of 3000K is shown by two dot chain line.

Here, list of measurement data such as luminance, chromaticity, color rendering index, and color temperature of the white LED illumination of the example 85 or the example 86 is shown in table 15.

When the color temperature, chromaticity, or color rendering properties of the light emission were measured, the white LED illumination of the example 85 set to have the color temperature of 5000K showed the color temperature of 4987K, x=0.3454, y=0.3512, the general color rendering index Ra of 90, and a special color rendering index R9 of 84, R13 of 91, and R15 of 91. The white color LED illumination of the example 86 set to have the color temperature of 3000K showed the color temperature of 2999K, x=0.4362, y=0.4024, the general color rendering index Ra of 95, and the special color rendering index R9 of 89, R13 of 99, and R15 of 97. Further, in these white LED illuminations, by suitably changing the blending amount of the phosphors to be mixed and the blending amount of resin, the emission color of different color temperature could also be obtained.

Example 87

1) Preparation of Phosphor

The green phosphor $Sr_2Al_2Si_{10}ON_{16}$:Ce was manufactured and prepared by a method as described hereunder.

Commercially available $SrCO_3$(2N), AlN(3N), $Si_3N_4$(3N), $CeO_2$(3N) were prepared. These raw materials were weighed and mixed to obtain the mixing ratio of the respective raw materials in $SrCO_3$ of 0.970 mol, AlN of 1.0 mol, $Si_3N_4$ of 5/3 mol, and $CeO_2$ of 0.030 mol, so that the molar ratio of each element becomes Sr:Al:Si:Ce=0.970:1:5:0.030. The raw materials thus mixed were set in a nitrogen atmosphere (flow state, 20.0 L/min) in a powder state, and the temperature was increased up to 1800° C. at a rate of 15° C./min, with an in-furnace pressure set at 0.05 MPa, which were then retained/fired at 1800° C. for 3 hours, and thereafter the temperature was decreased from 1800° C. down to 50° C. to cool the raw materials for one hour and half. Thereafter, fired samples were pulverized in an atmospheric air by using the mortar until the samples have a proper particle size, and the phosphor having a mixed composition formula expressed by $Sr_2Al_2Si_{10}ON_{16}$:Ce was prepared.

The red phosphor $CaAlSiN_3$:Eu was manufactured by the method explained in the example 85.

A commercially available blue phosphor BAM:Eu ($BaMgAl_{10}O_{17}$:Eu) was prepared.

2) Manufacture of Phosphor Mixture

The emission spectra for three kinds of phosphor samples such as $Sr_2Al_2Si_{10}ON_{16}$:Ce, $CaAlSiN_3$:Eu, and BAM:Eu under excitation by excitation light having the wavelength of 405 nm were respectively measured, and from these emission spectra, the relative mixing ratio to achieve 6500K of the correlated color temperature of the phosphor mixtures was obtained by simulation. According to the result of this simulation, the molar ratio was BAM:Eu:$Sr_2Al_2Si_{10}ON_{16}$:Ce:

TABLE 15

| | COLOR TEMPERATURE | CHROMATICITY | | AVERAGE COLOR RENDERING INDEX | SPECIAL COLOR RENDERING INDEX | | | | | | |
|---|---|---|---|---|---|---|---|---|---|---|---|
| | Tcp (K) | x | y | Ra | R9 | R10 | R11 | R12 | R13 | R14 | R15 |
| EXAMPLE 85 | 4987 | 0.3454 | 0.3512 | 90 | 84 | 77 | 81 | 48 | 91 | 93 | 91 |
| EXAMPLE 86 | 2999 | 0.4362 | 0.4024 | 95 | 89 | 87 | 95 | 69 | 99 | 92 | 97 |

Next, examples 87 to 89 will be explained.

In the examples 87 to 89, the phosphor mixture emitting light of the correlated color temperature of 6500K when excited by the light emitting element (LED) emitting light having the wavelength of 405 nm, was manufactured and the emission characteristics and the color rendering properties of this phosphor mixture were evaluated. Further, in the example 89, two kinds of red phosphors were added, and excellent color rendering properties were obtained and the luminance was improved. Here, BAM:Eu($BaMgAl_{10}O_{17}$:Eu) and (Sr,Ca,Ba,Mg)$_{10}$(PO$_4$)$_6$Cl$_2$:Eu were used as blue phosphors. However, the phosphors are not limited thereto, and the phosphors expressed by $Sr_5(PO_4)_3Cl$:Eu, $SrAl_xSi_{6-x}O_{1+x}N_{8-x}$:Eu ($0 \leq x \leq 2$), (Ba,Sr,Ca,Mg)$_2$SiO$_4$:Eu, (Ba,Sr,Ca) Si$_2$O$_2$N$_2$:Eu may be combined.

$CaAlSiN_3$:Eu=47.6:49.5:2.9, and therefore based on this result, each phosphor was weighed and the phosphor mixture was obtained.

Here, under the excitation by the excitation light having the wavelength of 405 nm, the half value width of the emission spectrum of BAM:Eu was 53.5 nm, the half value width of the emission spectrum of $Sr_2Al_2Si_{10}ON_{16}$:Ce was 118.0 nm, and the half value width of the emission spectrum of $CaAlSiN_3$:Eu was 86.7 nm, all of which were 50 nm or more.

However, a preferable mixing ratio is sometimes deviated from the result of the simulation, depending on the emission wavelength of the light emission part (excitation wavelength of the phosphor mixture) and the emission efficiency of the phosphor with this emission wavelength. In this case, by suitably adjusting the blending ratio of the phosphors, an actual shape of the emission spectrum may be arranged.

3) Evaluation of the Emission Characteristics

The phosphor mixture thus obtained was irradiated with the light having the wavelength of 405 nm as the excitation light, and the correlated color temperature of the light emission of this phosphor mixture was measured. Then, it was found that the correlated color temperature was 6512K and this phosphor mixture had a target color temperature. Further, when the chromaticity of this light emission was measured, x=0.312 and y=0.331 was obtained. A value of the luminance (Y) was obtained based on a calculation method in the XYZ color system defined by JISZ8701, and the luminance was set at 100.

It was found that the luminance of the phosphor mixture of the example 87 was increased by about 18%, as compared to the luminance of the phosphor mixture of the comparative example 4 as will be described later.

The emission spectrum is shown by a thick solid line in FIG. 22. FIG. 22 is a graph showing the relative emission intensity taken on the ordinate axis and the emission wavelength (nm) on the abscissa axis. The emission spectrum has three emission peaks in the wavelength range from 420 nm to 680 nm and had a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. Then, it was found that the general color rendering index Ra was 97 and the special color rendering index R9 was 93 and R15 was 95, and an extremely excellent color rendering property was exhibited.

A list of the measurement data of the luminance, chromaticity, color rendering index, and color temperature, etc, obtained from the example 87 and examples 88, 89, and comparative examples 4 to 6 as will be described later is shown in a table 16.

Example 88)

1) Preparation of the Phosphor $Sr_2Al_2Si_{10}ON_{16}$:Ce was prepared by the method explained in the example 87, as the green phosphor.

$CaAlSiN_3$:Eu was prepared by the method explained in the example 85, as the red phosphor.

Commercially available $(Sr,Ca,Ba,Mg)_{10}(PO_4)_6Cl_2$:Eu was prepared as the blue phosphor.

2) Manufacture of the Phosphor Mixture

Under the same simulation as the example 87, (Sr, Ca, Ba, Mg)$_{10}$(PO$_4$)$_6$Cl$_2$:Eu: $Sr_2Al_2Si_{10}ON_{16}$:Ce:CaAlSiN$_3$:Eu=64.5:33.1:2.4 was obtained, and based on this result, each phosphor was weighed and mixed to obtain the phosphor mixture.

Here, the half value width of the emission spectrum of $(Sr,Ca,Ba,Mg)_{10}(PO_4)_6Cl_2$:Eu was 51.1 nm, when the phosphor was excited by the excitation light having the wavelength of 405 nm.

3) Evaluation of the Emission Characteristics

In the same way as the example 87, when the correlated color temperature of the light emission of this phosphor mixture was measured, it was 6502K, thus exhibiting a target color temperature. Further, when the chromaticity of this light emission was measured, x=0.313 and y=0.327 was obtained. When the luminance was obtained from the obtained emission spectrum, it was found that the luminance of the phosphor mixture of this example was 101, when the luminance of the example 87 was set at 100.

The luminance of the phosphor mixture of the example 88 was increased by about 16%, as compared to the luminance of the phosphor mixture of the comparative example 5 as will be described later.

The obtained emission spectrum is shown by a thick one dot chain line in FIG. 22.

In the same way as the example 87, this emission spectrum had three emission peaks in the wavelength range from 420 nm to 680 nm and a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. Then, it was found that the general color rendering index Ra was 94, the special color rendering index R9 was 60, R15 was 89, and an extremely excellent color rendering property was exhibited.

Example 89

In an example 89, the phosphor mixture emitting light having the correlated color temperature of 6500K when excited by the light emitting element (LED) emitting the light having the wavelength of 405 nm was manufactured by a method of using two kinds of red phosphors having further improved luminance and color rendering properties, and the emission characteristics and color rendering properties of this phosphor mixture was evaluated.

1) Preparation of the Phosphor $Sr_2Al_2Si_{10}ON_{16}$:Ce was prepared by the method explained in the example 87, as the green phosphor.

$CaAlSiN_3$:Eu was prepared by the method explained in the example 85, as the red phosphor.

Commercially available BAM:Eu was prepared as the blue phosphor.

In addition, a second red phosphor $CaAl_2Si_4N_8$:Eu was manufactured by the following method.

Commercially available $Ca_3N_2$(2N), AlN(3N), $Si_3N_4$(3N), $Eu_2O_3$(3N) were prepared and each raw material was weighed, so that the molar ratio of each element was Ca:Al:Si:Eu=0.970:2:4:0.030, and mixed in the glove box under the nitrogen atmosphere by using the mortar. Then, the temperature was increased at a rate of 15° C./min up to 1700° C. in the nitrogen atmosphere, and the raw materials were retained and fired for 3 hours at 1700° C., and the temperature was decreased from 1700° C. to 200° C. for 1 hour, to obtain the phosphor having the composition formula expressed by $CaAl_2Si_4N_8$:Eu. Then, the phosphor was pulverized and classified.

2) Manufacture of the Phosphor Mixture

Under the same simulation as the example 87, BAM:Eu: $Sr_2Al_2Si_{10}ON_{16}$:Ce:CaAl$_2$Si$_4$N$_8$:Eu CaAlSiN$_3$:Eu 48.7:48.1:1.0:2.2 was obtained and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 6496K, thus exhibiting a target color temperature. Further, when the chromaticity of this light emission was measured, x=0.313, y=0.329 was obtained. When the luminance was obtained from the obtained emission spectrum, the luminance of the phosphor mixture of this example was 107, with the luminance of the example 87 set at 100.

The luminance of the phosphor mixture of the example 89 was increased by about 2%, as compared to the luminance of the phosphor mixture of a comparative example 6 as will be described later.

The obtained emission spectrum is shown by a thick two dot chain line in FIG. 22.

In the same way as the example 87, this emission spectrum had three emission peaks in the wavelength range from 420 nm to 680 nm and had a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. The general color rendering index Ra was 95, the special color rendering index R9 was 92, R15 was 97, and it was found that an extremely excellent color rendering property was exhibited.

Next, the phosphor mixture manufactured by using an already known green phosphor is shown as a comparative example. In the comparative examples 4 to 6, the phosphor mixtures emitting light having the correlated color temperature of 6500K when excited by the light emitting element (LED) emitting the light having the wavelength of 405 nm were manufactured, and the emission characteristics and the color rendering properties of these phosphor mixture were evaluated. The comparative example 6 used two kinds of red phosphors, and was compared to the example 89 having the improved color rendering property and the luminance.

Comparative Example 4

1) Preparation of the Phosphor

Commercially available ZnS:Cu,Al was prepared as the green phosphor.

$CaAlSiN_3$:Eu was prepared by the method explained in the example 85, as the red phosphor.

Commercially available BAM:Eu was prepared as the blue phosphor.

2) Manufacture of the Phosphor Mixture

The simulation similar to that of the example 87 was performed, and a relative mixing ratio of BAM:Eu:ZnS:Cu, Al:$CaAlSiN_3$:Eu=61.1:27.4:11.5 was obtained, so that the correlated color temperature of the emission spectrum of the phosphor mixture under the excitation light having the wavelength of 405 nm was 6500K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 6518K, thus exhibiting a target color temperature. Further, when the chromaticity of this light emission was measured, x=0.311, y=0.337 was obtained. When the luminance was obtained from the obtained emission spectrum, it was found that the luminance of the phosphor mixture of this example was 82, with the luminance of the example 87 set at 100.

The obtained emission spectrum is shown by a thin broken line in FIG. 22.

This emission spectrum had three emission peaks in the wavelength range from 420 nm to 680 nm and a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. Then, it was found that the general color rendering index Ra was 87, and the special color rendering index R9 was 6, R15 was 78.

Comparative Example 5

1) Preparation of the Phosphor

Commercially available ZnS:Cu,Al was prepared as the green phosphor.

$CaAlSiN_3$:Eu was prepared by the method explained in the example 85, as the red phosphor.

Commercially available $(Sr,Ca,Ba,Mg)_{10}(PO_4)_6Cl_2$:Eu was prepared as the blue phosphor.

2) Manufacture of the Phosphor Mixture

The simulation similar to that of the example 87 was performed, and a relative mixing ratio of $(Sr,Ca,Ea,Mg)_{10}(PO_4)_6Cl_2$:Eu ZnS:Cu,Al:$CaAlSiN_3$:Eu=74.3:19.3:6.4 was obtained, so that the correlated color temperature of the emission spectrum of the phosphor mixture under the excitation light having the wavelength of 405 nm was 6500K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 6481K, thus exhibiting a target color temperature. Further, when the chromaticity of this light emission was measured, x=0.313, y=0.329 was obtained. When the luminance was obtained from the obtained emission spectrum, the luminance of the phosphor mixture of this example was 85, with the luminance of the example 87 set at 100. The obtained emission spectrum is shown by a thin one dot chain line in FIG. 22.

4) Evaluation of the Color Rendering Property

The evaluation of the color rendering property in the light emission of this phosphor mixture was performed based on the JIS8726. Then, it was found that the general color rendering index Ra was 75, the special color rendering index R9 was −59, R15 was 57.

Comparative Example 6

In the comparative example 6, the phosphor mixture having further improved luminance and color rendering properties emitting light having the correlated color temperature of 6500K when excited by the light emitting element (LED) emitting light having the wavelength of 405 nm, was manufactured by using the already known green phosphor, two kinds of red phosphors, and the already known blue phosphor, and the emission characteristics and the color rendering properties of this phosphor mixture were evaluated.

1) Preparation of the Phosphor

Commercially available ZnS:Cu,Al was prepared as the green phosphor.

$CaAl_2Si_4N_8:Eu$ and $CaAlSiN_3:Eu$ were prepared by the method explained in the example 89, as the red phosphors.

Commercially available BAM:Eu was prepared as the blue phosphor.

2) Manufacture of the Phosphor Mixture

In the same way as the example 89, the relative mixing ratio of $BAM:Eu:ZnS:Cu,Al:CaAl_2Si_4N_8:Eu:CaAlSiN_3:Eu=60.19:30.50:4.65:4.65$ was obtained, so that the correlated color temperature of the emission spectrum of the phosphor mixture under the excitation light having the wavelength of 405 nm was 6500K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 6568K, thus exhibiting a target color temperature. Further, when the chromaticity of this light emission was measured, x=0.314, y=0.322 was obtained. When the luminance was obtained from the obtained emission spectrum, the luminance of the phosphor mixture of this example was 105, with the luminance of the example 87 set at 100.

The obtained emission spectrum is shown by a thin two dot chain line in FIG. 22.

4) Evaluation of the Color Rendering Property

The evaluation of the color rendering property in the light emission of this phosphor mixture was performed based on the JISZ8726. Then, the general color rendering index Ra was 96, the special color rendering index R9 was 84, R15 was 92.

4200K, when excited by the light emitting element (LED) emitting the light having the wavelength of 405 nm, were manufactured and the emission characteristics and the color rendering properties of these phosphor mixtures were evaluated. In the example 91, two kinds of red phosphors were used and the color rendering properties and luminance were improved.

Example 90)

1) Preparation of the Phosphor

In the same way as the example 87, $Sr_2Al_2Si_{10}ON_{16}:Ce$ was prepared as the green phosphor, and $CaAlSiN_3:Eu$ was prepared as the red phosphor, and BAM:Eu was prepared as the blue phosphor.

2) Manufacture of the Phosphor Mixture

In the same way as the example 87, the emission spectra when three kinds of phosphors such as BAM:Eu, $Sr_2Al_2Si_{10}ON_{16}:Ce$, and $CaAlSiN_3:Eu$ were excited by the excitation light having the wavelength of 405 nm, were measured, and the relative mixing ratio to achieve the correlated color temperature of 4200K of the phosphor mixture was obtained from these emission spectra by simulation. A simulation result showed $BAM:Eu\ Sr_2Al_2Si_{10}ON_{16}:Ce:CaAlSiN_3:Eu=33.2:40.8:6.0$, and therefore based on this result, each phosphor was weighed and mixed to obtain the phosphor mixture.

3) Evaluation of the Emission Characteristics

In the same way as the example 87, the obtained phosphor mixture was irradiated with the light having the wavelength of 405 nm, and when the correlated color temperature of the light emission of this phosphor mixture was measured, it was 4205K, thus exhibiting a target color temperature. Further, when the chromaticity of this light emission was measured, x=0.373, y=0.376. The value of luminance (Y) is obtained based on a calculation method in the XYZ color system defined by JISZ8701, and the luminance was set at 100.

The luminance of the phosphor mixture of the example 90 was increased by about 5%, as compared to the luminance of the phosphor mixture of a comparative example 7 as will be described later.

TABLE 16

|  | LUMINANCE (%) | COLOR TEMPERATURE Tcp (K) | CHROMATICITY x | y | AVERAGE COLOR RENDERING INDEX Ra | SPECIAL COLOR RENDERING INDEX | | | | | | |
|---|---|---|---|---|---|---|---|---|---|---|---|---|
|  |  |  |  |  |  | R9 | R10 | R11 | R12 | R13 | R14 | R15 |
| EXAMPLE 87 | 100 | 6512 | 0.312 | 0.331 | 97 | 93 | 97 | 97 | 87 | 98 | 99 | 96 |
| EXAMPLE 88 | 101 | 6502 | 0.313 | 0.327 | 94 | 60 | 92 | 91 | 93 | 93 | 98 | 89 |
| EXAMPLE 89 | 107 | 6496 | 0.314 | 0.322 | 95 | 92 | 95 | 94 | 86 | 98 | 98 | 97 |
| COMPARATIVE EXAMPLE 4 | 82 | 6518 | 0.311 | 0.337 | 87 | 6 | 97 | 87 | 87 | 90 | 92 | 78 |
| COMPARATIVE EXAMPLE 5 | 85 | 6481 | 0.313 | 0.329 | 75 | −59 | 82 | 67 | 93 | 77 | 90 | 57 |
| COMPARATIVE EXAMPLE 6 | 105 | 6568 | 0.313 | 0.318 | 96 | 80 | 97 | 97 | 86 | 96 | 97 | 92 |

Next, in the examples 90 to 91, the phosphor mixtures emitting light having the correlated color temperature of This emission spectrum had three emission peaks in the wavelength range from 420 nm to 680 nm and had a continuous spectrum without being interrupted in the wavelength range from 420 nm to 750 nm.

The obtained emission spectrum is shown by a thick solid line in FIG. 23.

Note that in the same way as FIG. 22, FIG. 23 is a graph showing the relative emission intensity taken on the ordinate axis, and the emission wavelength (nm) taken on the abscissa axis.

4) Evaluation of the Color Rendering Property

The evaluation of the color rendering property in the light emission of this phosphor mixture was performed based on the JISZ8726. Then, it was found that the general color rendering index Ra was 95, the special color rendering index R9 was 73, R15 was 92, and an extremely excellent color rendering property was exhibited.

The list of the measurement data of the luminance, chromaticity, color rendering index, and color temperature, etc, of the example 90, and an example 91 and comparative examples 7 and 8 as will be described later, are shown in table 17.

Example 91

In the example 91, the phosphor mixture emitting light having the correlated color temperature of 4200K when excited by the light emitting element (LED) emitting light having the wavelength of 405 nm, was manufactured by using two kinds of red phosphors having further improved luminance and color rendering properties, and the emission characteristics and color rendering properties of this phosphor mixture were evaluated.

1) Preparation of the Phosphor

The green phosphor $Sr_2Al_2Si_{10}ON_{16}$:Ce was manufactured by the method explained in the example 87.

The red phosphor $CaAlSiN_3$:Eu was manufactured by the method explained in the example 85. In addition, a second red phosphor $CaAl_2Si_4N_8$:Eu was manufactured by the method explained in the example 89.

Commercially available BAM:Eu was prepared as the blue phosphor.

2) Manufacture of the Phosphor Mixture

In the same way as the example 87, BAM:Eu: $Sr_2Al_2Si_{10}ON_{16}$:Ce:$CaAl_2Si_4N_8$:Eu:$CaAlSiN_3$:Eu=35.6: 57.4:2.7:4.3 were obtained by simulation, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 4189K, thus having a target color temperature. Further, when the chromaticity of this light emission was measured, x=0.373, y=0.372 was obtained. When the luminance was obtained from the obtained emission spectrum, the luminance of the phosphor mixture of this example was 107, with the luminance of the example 90 set at 100.

The luminance of the phosphor mixture of the example 91 was increased by about 5%, as compared to the luminance of the phosphor mixture of a comparative example 8 as will be described later.

The obtained emission spectrum is shown by a thick one dot chain line in FIG. 23.

In the same way as the example 87, this emission spectrum had three emission peaks in the wavelength range from 420 nm to 680 nm and had a continuous spectrum without being interrupted in the wavelength range from 420 nm to 750 nm.

4) Evaluation of the Color Rendering Property

The evaluation of the color rendering property in the light emission of this phosphor mixture was performed based on the JISZ8726. The general color rendering index Ra was 95, the special color rendering index R9 was 80, R15 was 94, and an extremely excellent color rendering property was exhibited.

Next, a phosphor mixture using an already known green phosphor is shown as a comparative example.

In the comparative examples 7 and 8, the phosphor mixtures emitting light of the correlated color temperature of 4200K when excited by the light emitting element (LED) emitting light having the wavelength of 405 nm, were manufactured and the emission characteristics and color rendering property of these phosphor mixtures were evaluated. The comparative example 8 shows a comparative example corresponding to the example 91 wherein the color rendering property and the luminance were improved by adding two kinds of red phosphors.

Comparative Example 7

In the comparative example 7, the phosphor mixture emitting light having the correlated color temperature of 4200K was manufactured and the emission characteristics and color rendering properties of this phosphor mixture were evaluated.

1) Preparation of the Phosphor

Commercially available ZnS:Cu,Al was prepared as the green phosphor.

$CaAlSiN_3$:Eu was prepared as the red phosphor.

Commercially available BAM:Eu was prepared as the blue phosphor.

2) Manufacture of the Phosphor Mixture

The relative mixing ratio of BAM:Eu:ZnS:Cu,Al: $CaAlSiN_3$:Eu=39.6:43.7:16.7 was obtained, so that the correlated color temperature of the emission spectrum of the phosphor mixture under the excitation light having the wavelength of 405 nm was 4200K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 4193K, thus having a target color temperature. Further, when the chromaticity of this light emission was measured, x=0.374, y=0.378 was obtained. When the luminance was obtained from the obtained emission spectrum, the luminance of the phosphor mixture of this comparative example was 95, with the luminance of the example 90 set at 100.

The obtained emission spectrum is shown by a thin broken line in FIG. 23.

In the same way as in the example 87, this emission spectrum had three emission peaks in the wavelength range from 420 nm to 680 nm and had a continuous spectrum without being interrupted in the wavelength range from 420 nm to 750 nm.

4) Evaluation of the Color Rendering Property

The evaluation of the color rendering property in the light emission of this phosphor mixture was evaluated based on the JISZ8726. Then, it was found that the general color rendering index Ra was 70, and the special color rendering index R9 was −53, R15 was 54.

Comparative Example 8

In the comparative example 8, the phosphor mixture having further higher luminance and color rendering property emitting light having the correlated color temperature of 4200K when excited by the light emitting element (LED) emitting light having the wavelength of 405 nm, was manufactured by using an already known green phosphor, two kinds of red phosphors and the blue phosphor, and the emission characteristics and color rendering properties of this phosphor mixture were evaluated, as a comparative example corresponding to the example 91.

1) Preparation of the Phosphor

Commercially available ZnS:Cu,Al was prepared as the green phosphor.
The red phosphor CaAlSiN$_3$:Eu was manufactured by the method explained in the example 85, as the red phosphor. In addition, the second red phosphor CaAl$_2$Si$_4$N$_8$:Eu was manufactured by the method explained in the example 89.
Commercially available BAM:Eu was prepared as the blue phosphor.

2) Manufacture of the Phosphor Mixture

According to the simulation similar to that of the example 87, the relative mixing ratio of BAM:Eu:ZnS:Cu,Al: CaAl$_2$Si$_4$N$_8$:Eu:CaAlSiN$_3$:Eu=52.0:29.5:9.2:9.3 was obtained, so that the correlated color temperature of the emission spectrum of the phosphor mixture under the excitation light having the wavelength of 405 nm was 4200K, and based on this result, each phosphor was weighed and mixed to obtain the phosphor mixture.

3) Evaluation of the Emission Characteristics

In the same way as the example 87, when the correlated color temperature of the light emission of this phosphor mixture was measured, it was 4167K, thus having a target color temperature. Further, when the chromaticity of this light emission was measured, x=0.374, y=0.373 was obtained. When the luminance was obtained from the obtained emission spectrum, the luminance of the phosphor mixture of this comparative example was 102, with the luminance of the example 90 set at 100.

The obtained emission spectrum is shown by a thin two dot chain line in FIG. 23.

4) Evaluation of the Color Rendering Property

The evaluation of the color rendering property in the light emission of this phosphor mixture was performed based on the JISZ8726. The general color rendering index Ra was 96, and the special color rendering index R9 was 92, and R15 was 97.

TABLE 17

| | LUMINANCE | COLOR TEMPERATURE | CHROMATICITY | | AVERAGE COLOR RENDERING INDEX | SPECIAL COLOR RENDERING INDEX | | | | | | |
|---|---|---|---|---|---|---|---|---|---|---|---|---|
| | (%) | Tcp (K) | x | y | Ra | R9 | R10 | R11 | R12 | R13 | R14 | R15 |
| EXAMPLE 90 | 100 | 4205 | 0.373 | 0.376 | 95 | 73 | 96 | 96 | 89 | 95 | 98 | 92 |
| EXAMPLE 91 | 107 | 4189 | 0.373 | 0.372 | 95 | 80 | 96 | 93 | 85 | 97 | 100 | 94 |
| COMPARATIVE EXAMPLE 7 | 95 | 4193 | 0.374 | 0.378 | 70 | −53 | 81 | 61 | 91 | 73 | 87 | 54 |
| COMPARATIVE EXAMPLE 8 | 102 | 4167 | 0.374 | 0.373 | 96 | 92 | 90 | 95 | 82 | 97 | 96 | 97 |

Example 92

Evaluation with Light Emitting Elements

The LED (having emission peak wavelength of 403.5 nm) of ultraviolet light having a nitride semiconductor was set as a light emission part, and a mixture of the phosphor sample obtained by the example 1 and resin was set on the LED. The mixing ratio of this phosphor and the resin was adjusted so as to obtain a daylight color corresponding to the color temperature of 6500K based on the aforementioned result, and a white LED was manufactured by combining with the light emission part of this LED by a publicly known method. As a result, FIG. 24 shows the emission spectrum at the time of feeding power of 20 mA to the light emitting element of the white LED thus obtained.

Note that in the same way as FIG. 22, FIG. 24 is a graph showing the relative emission intensity taken on the ordinate axis and the emission wavelength (nm) taken on the abscissa axis.

This phosphor was excited to emit light by the ultraviolet light emitted by the light emission part, and the light was mixed with the blue color emitted from the light emission part, thus making it possible to obtain the white LED emitting white light. When the color temperature or chromaticity of this light emission was measured, the color temperature was 6469K, and x=0.312, y=0.331. Moreover, the general color rendering index (Ra) of the white LED was 97, and the special color rendering index R9 was 90, and R15 was 96. Further, by suitably changing the blending amount of the phosphor to be mixed and the blending amount of the resin, the emission color of different color temperature could also be obtained.

The list of the measurement data of the luminance, chromaticity, color rendering index, and color temperature, etc, of the example 92 is shown in table 18.

TABLE 18

| | COLOR TEMPERATURE | CHROMATICITY | | AVERAGE COLOR RENDERING INDEX | SPECIAL COLOR RENDERING INDEX | | | | | | |
|---|---|---|---|---|---|---|---|---|---|---|---|
| | Tcp (K) | x | y | Ra | R9 | R10 | R11 | R12 | R13 | R14 | R15 |
| EXAMPLE 92 | 6469 | 0.312 | 0.331 | 97 | 90 | 98 | 98 | 89 | 98 | 99 | 96 |

Example 93

In the example 93, the phosphor sheet was manufactured by dispersing the phosphor mixture manufactured in the example 84 into the resin, and the white LED was manufactured by combining this phosphor sheet and the LED element.

First, by using the silicone-based resin as the resin, being a medium, 10 wt % of phosphor mixture of the example 84 was dispersed in the resin, and the phosphor sheet was manufactured. Next, as shown in the designation mark 1 of FIG. 26(C), the LED in which the phosphor sheet was set on the LED element that emits light having the wavelength of 405 nm was manufactured. Then, when this LED is allowed to emit light, the white light can be emitted.

BRIEF DESCRIPTION OF THE DRAWINGS

FIGS. 26A-C is a sectional view of a bullet type LED of an example.

FIGS. 27A-E is a sectional view of a reflective type LED of an example.

DESCRIPTION OF SIGNS AND NUMERALS

Figure 1:
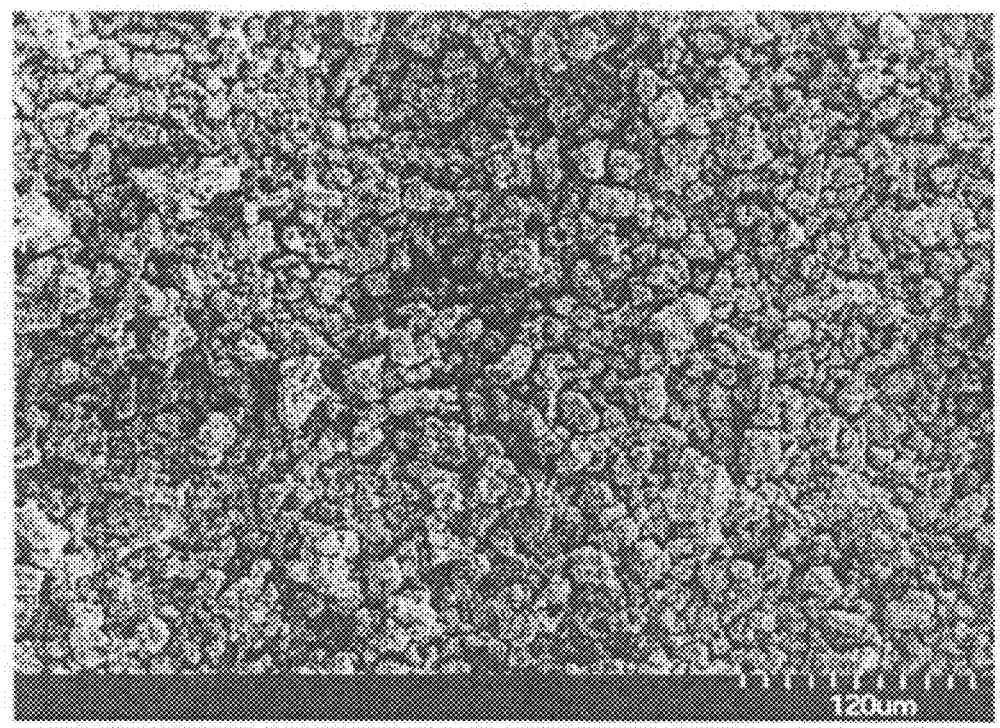
FIG. 1 is a SEM photograph of phosphor powders of an example 1.
Figure 2:
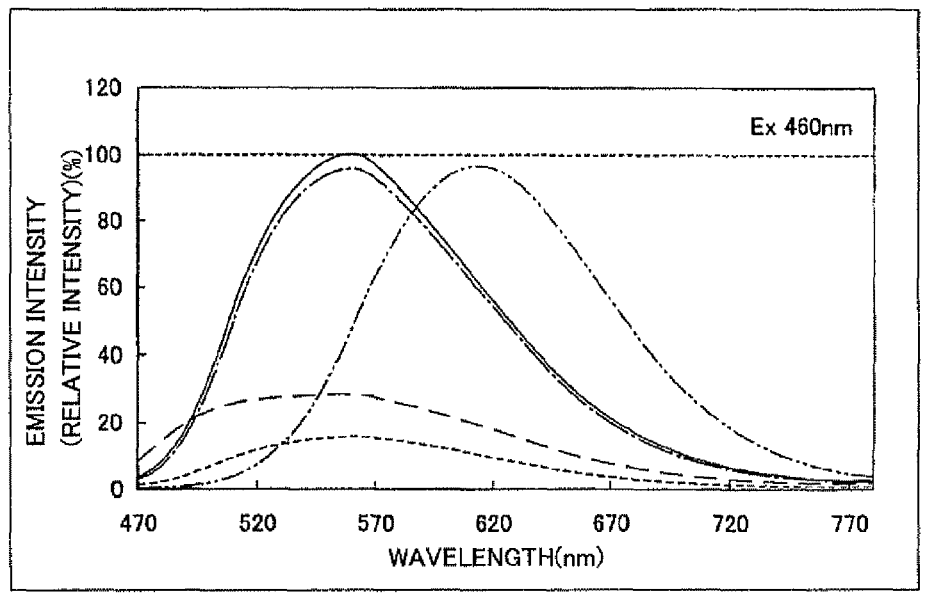
FIG. 2 is a graph showing emission spectra when phosphors of examples 1 to 3 and comparative examples 1 and 2 are irradiated with monochromatic light having the wavelength of 460 nm.
Figure 3:
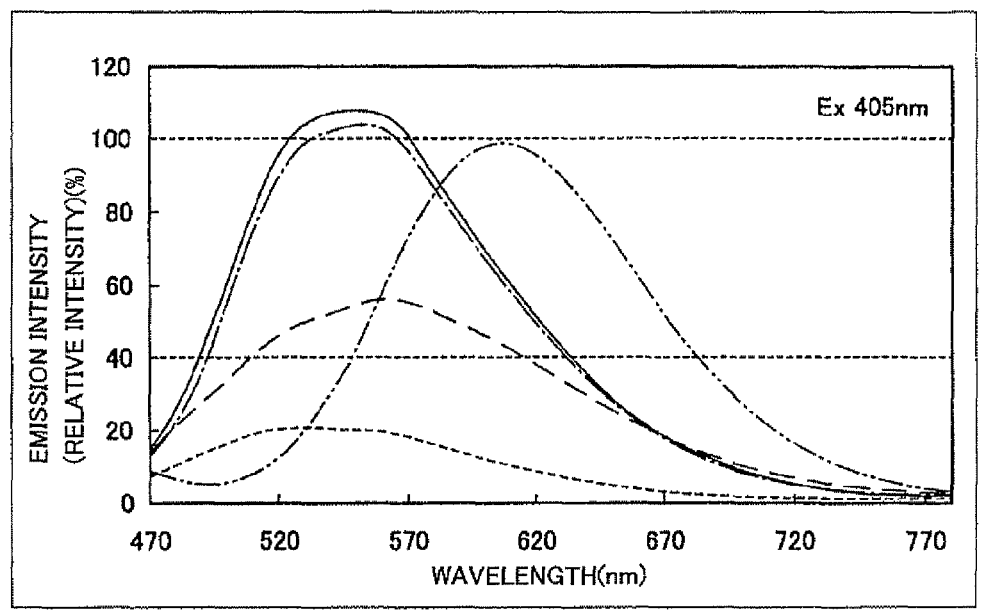
FIG. 3 is a graph showing emission spectra when the phosphors of the examples 1 to 3 and the comparative examples 1 and 2 are irradiated with the monochromatic light having the wavelength of 405 nm.
Figure 4:
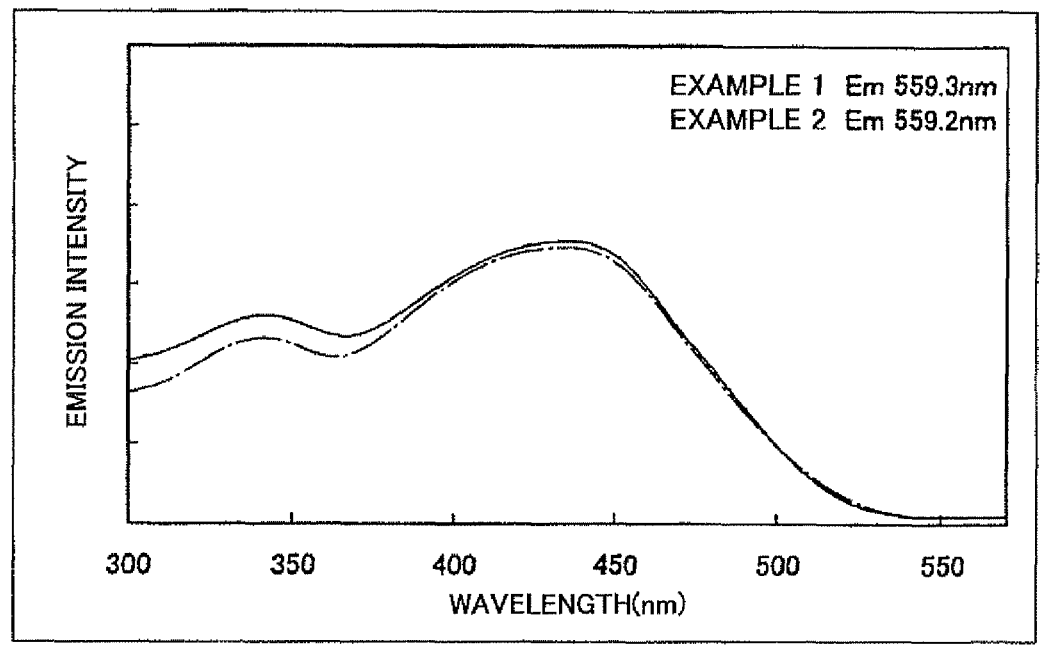
FIG. 4 is a graph showing excitation spectra of the phosphors of the examples 1 and 2.
Figure 5:
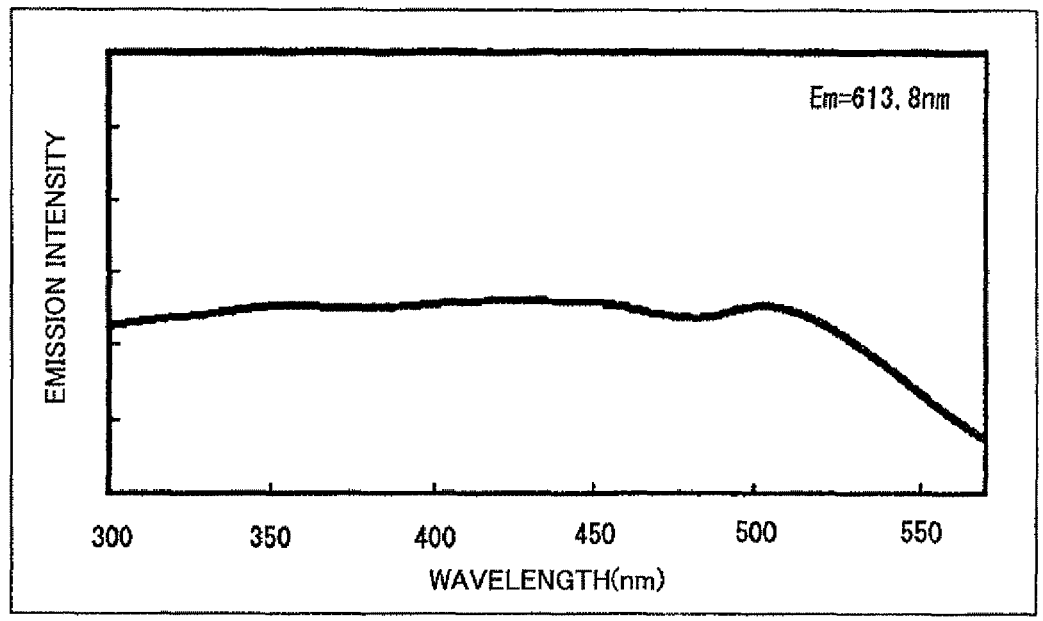
FIG. 5 is a graph showing an excitation spectrum of the phosphor of the example 3.
Figure 6:
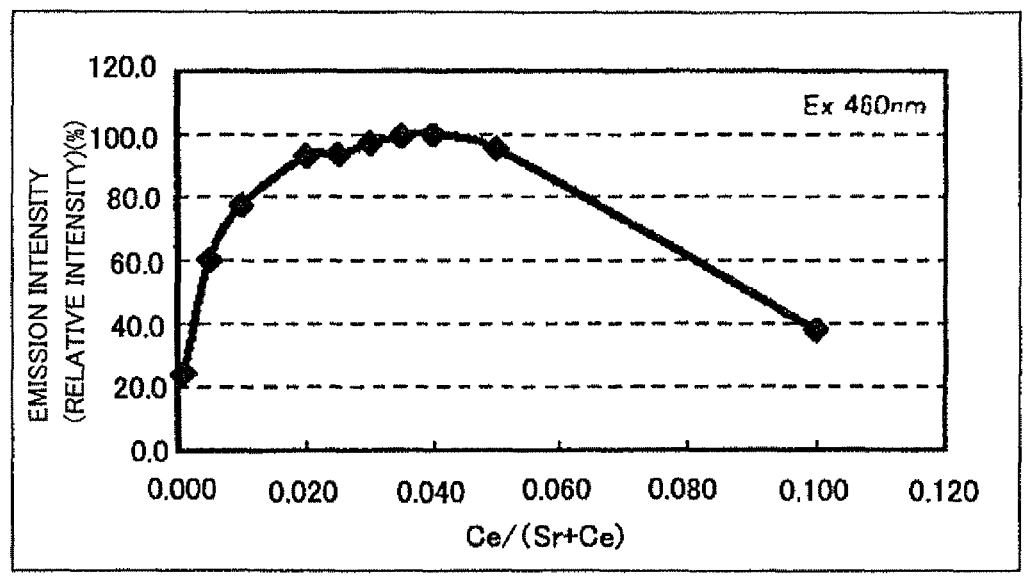
FIG. 6 is a graph showing a relation between a concentration of an activator Z(Ce) and an emission intensity, in the phosphors of examples 4 to 13.
Figure 7:
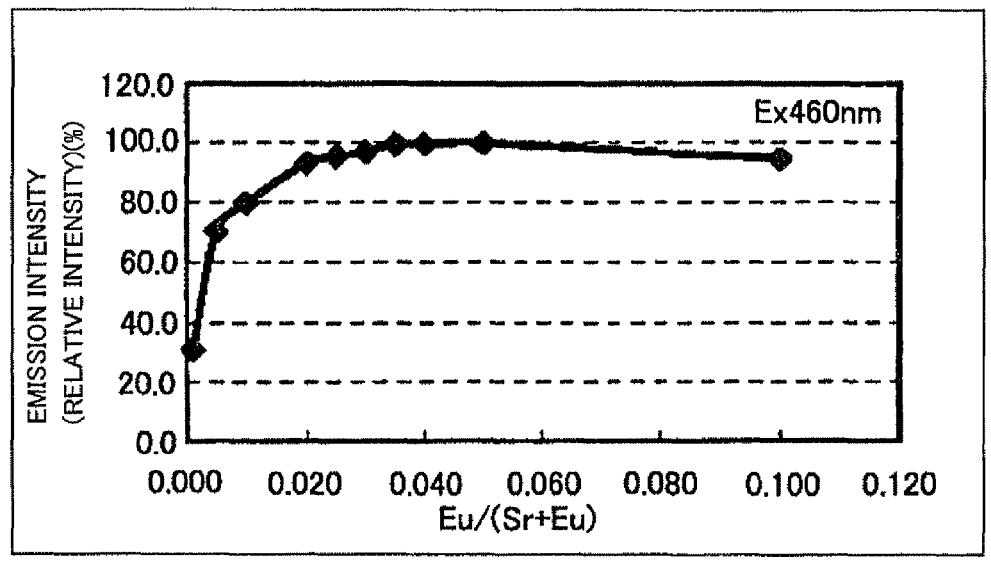
FIG. 7 is a graph showing a relation between a concentration of an activator Z(Eu) and an emission intensity, in the phosphors of examples 14 to 23.
Figure 8:
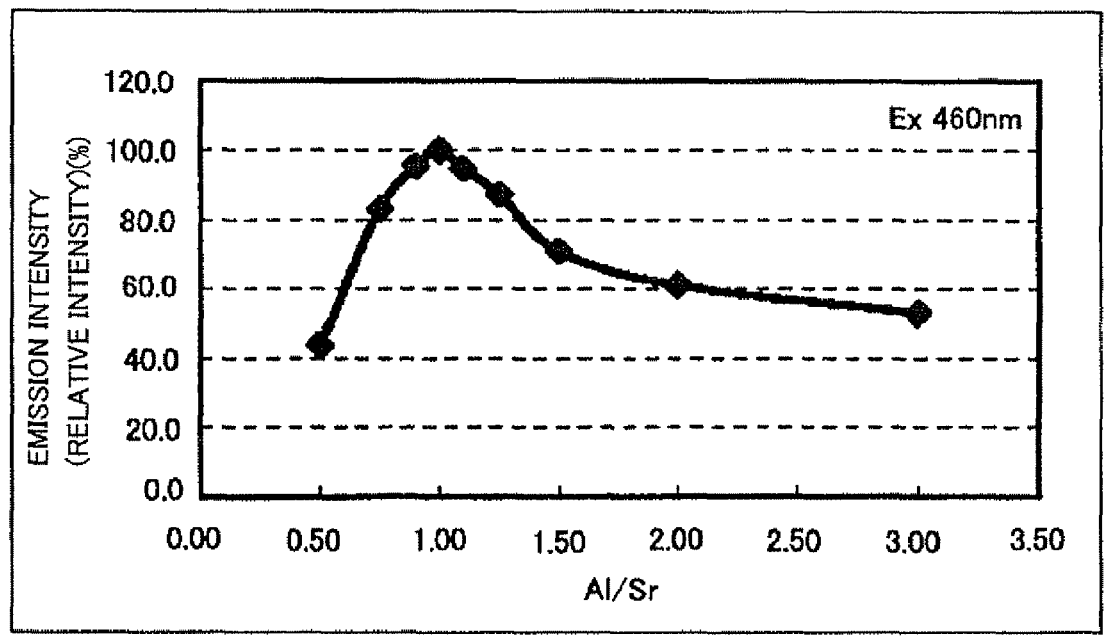
FIG. 8 is a graph showing a relation between Al/Sr ratio and an emission intensity, in the phosphors of examples 24 to 32.
Figure 9:
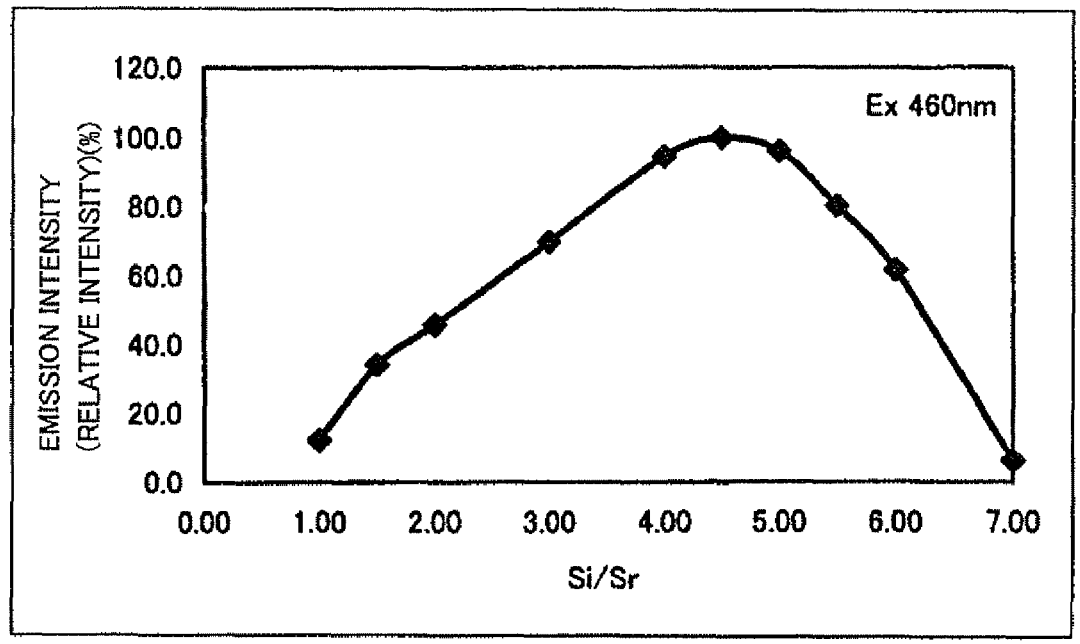
FIG. 9 is a graph showing a relation between Si/Sr ratio and an emission intensity, in the phosphors of examples 33 to 42.
Figure 10:
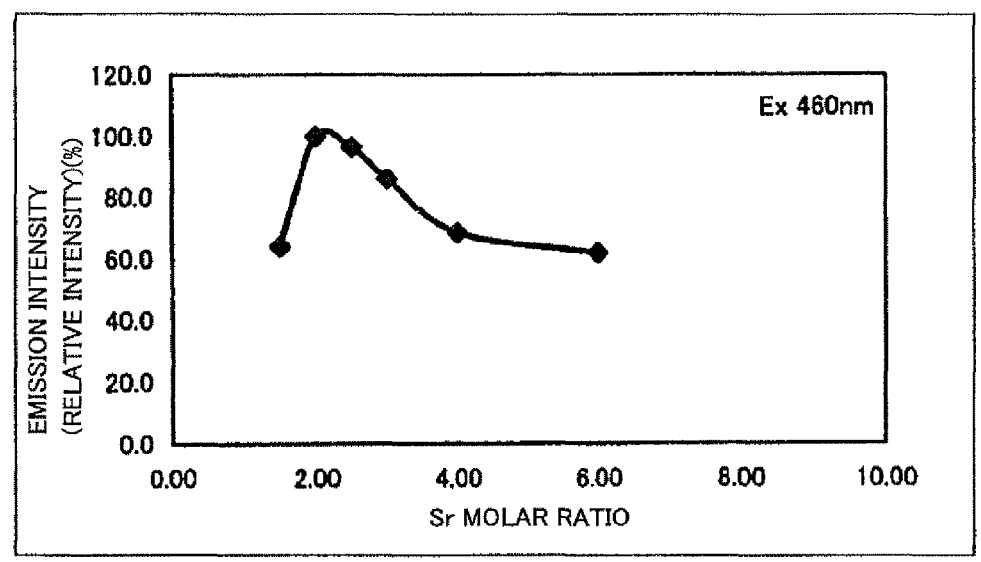
FIG. 10 is a graph showing a relation between Sr molar ratio and an emission intensity, in the phosphors of examples 43 to 50.
Figure 11:
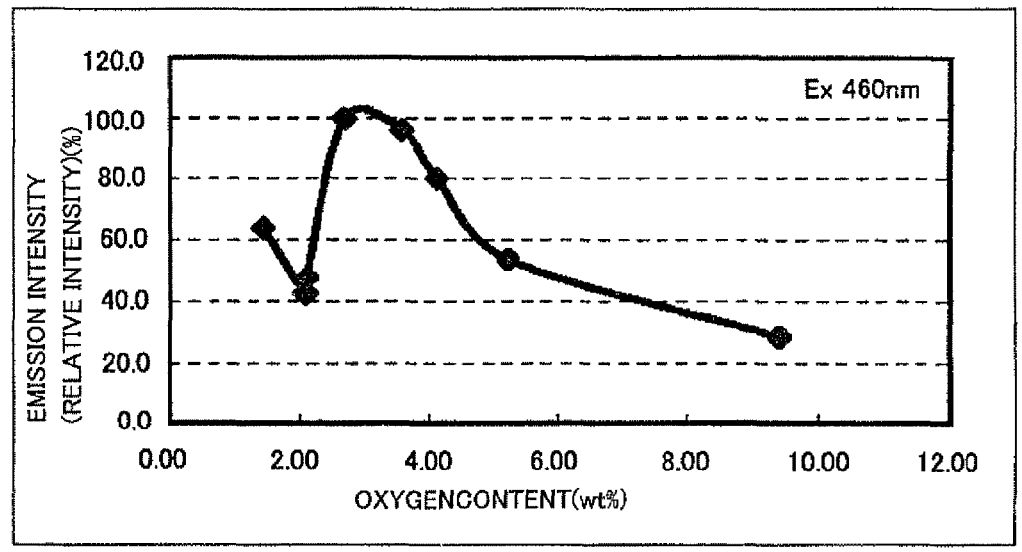
FIG. 11 is a graph showing a relation between oxygen content and an emission intensity, in the phosphors of examples 51 to 60.
Figure 12:
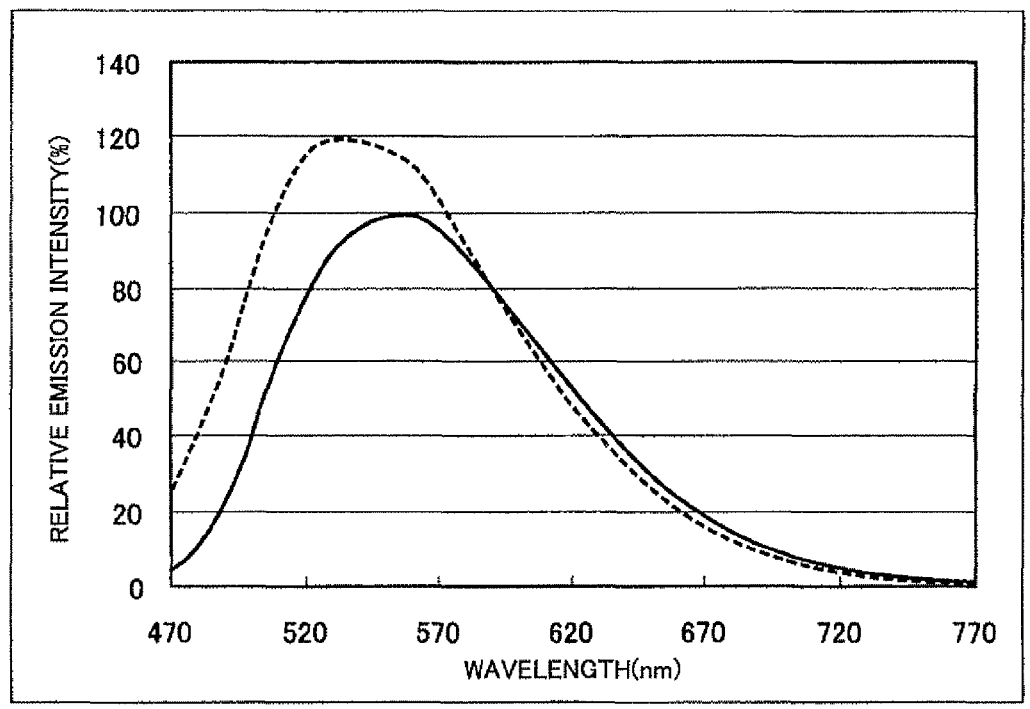
FIG. 12 is an emission spectrum of the phosphor of the example 61.
Figure 13:
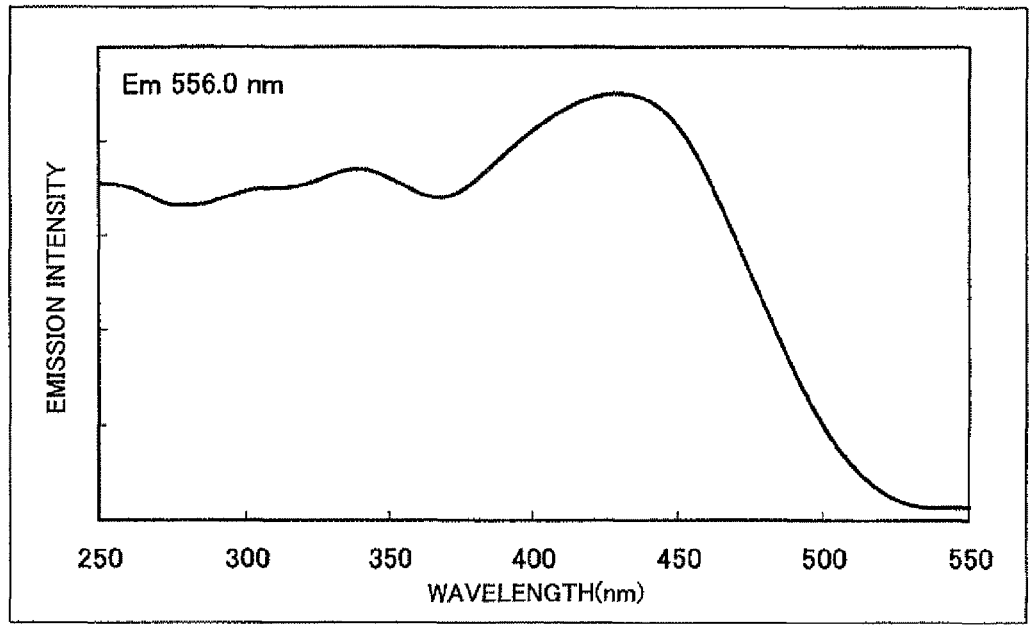
FIG. 13 is an excitation spectrum of the phosphor of the example 61.
Figure 14A:
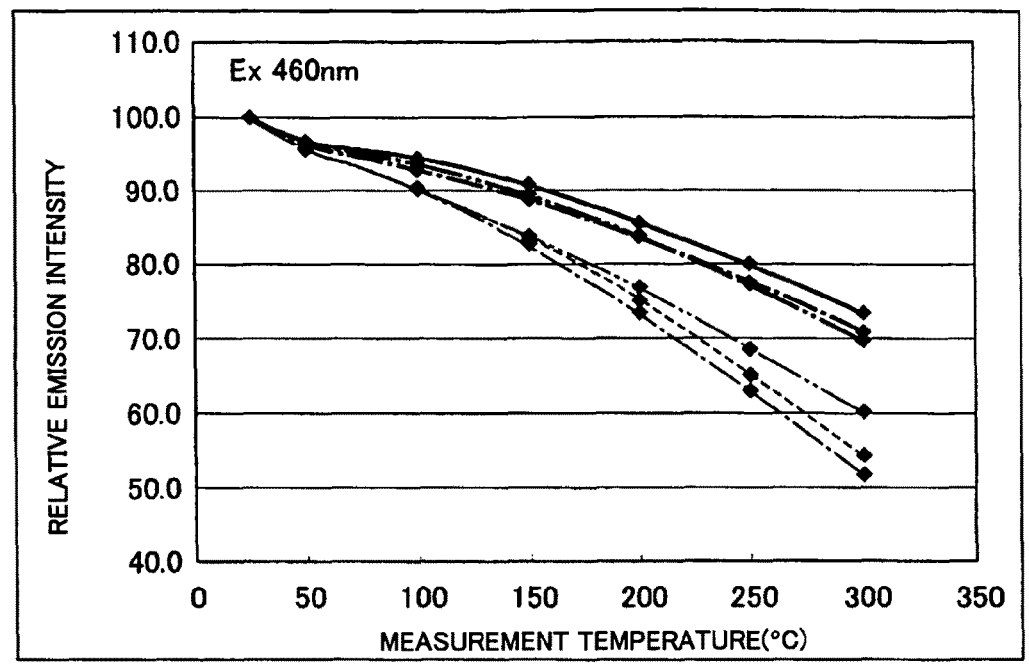
FIG. 14A is a graph showing measurement results of temperature characteristics of the emission intensity, when the phosphors of examples 61 to 66 are excited by the light having the wavelength of 460 nm.
Figure 14B:
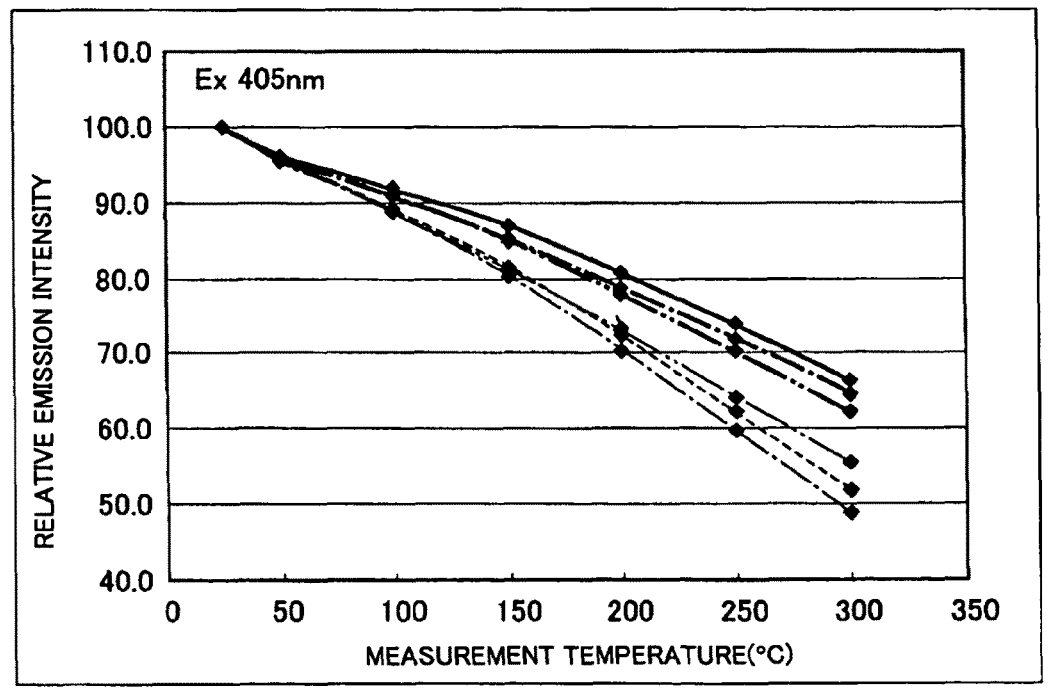
FIG. 14B is a graph showing the measurement results of the temperature characteristic of the emission intensity, when the phosphors of the examples 61 to 66 are excited by the light having the wavelength of 405 nm.
Figure 15:
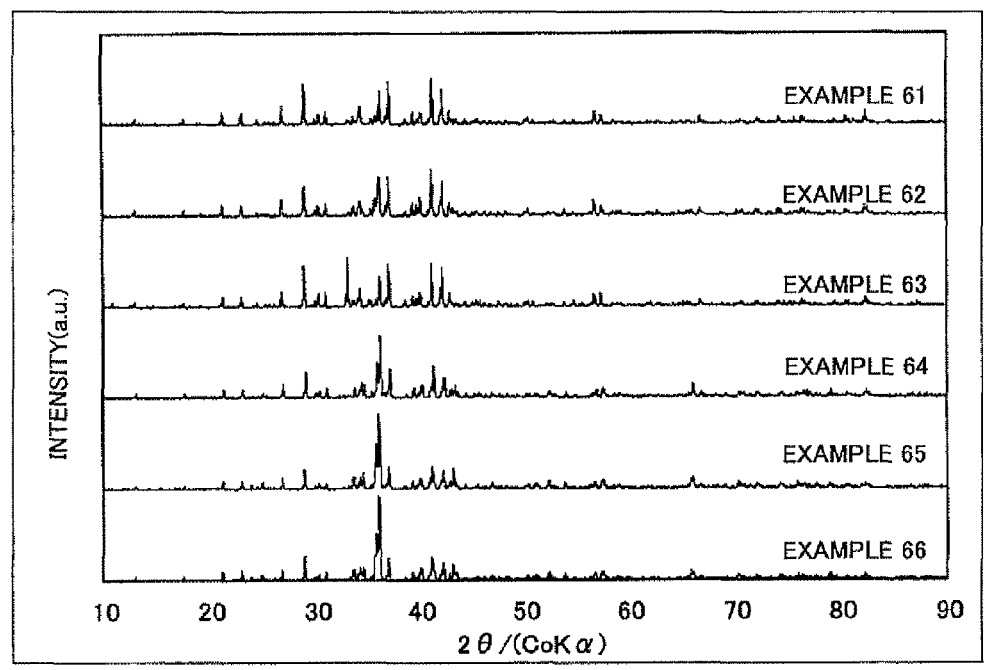
FIG. 15 shows X-ray diffraction patterns of the phosphors of the examples 61 to 66.
Figure 16:
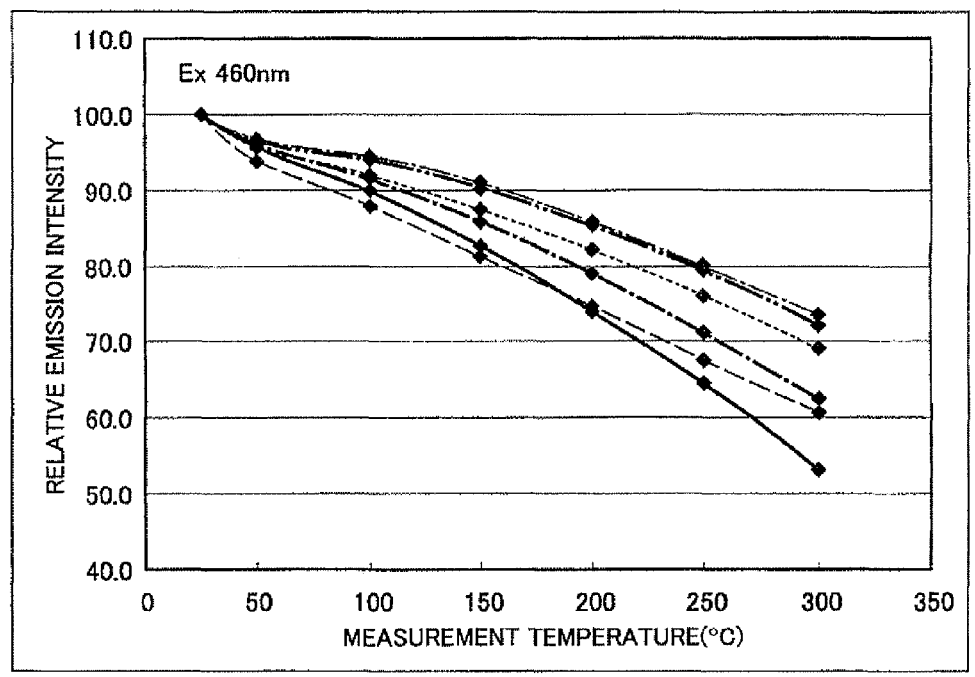
FIG. 16 is a graph showing the measurement results of the temperature characteristics of the emission intensity of the phosphors of examples 67 to 72.
Figure 17:
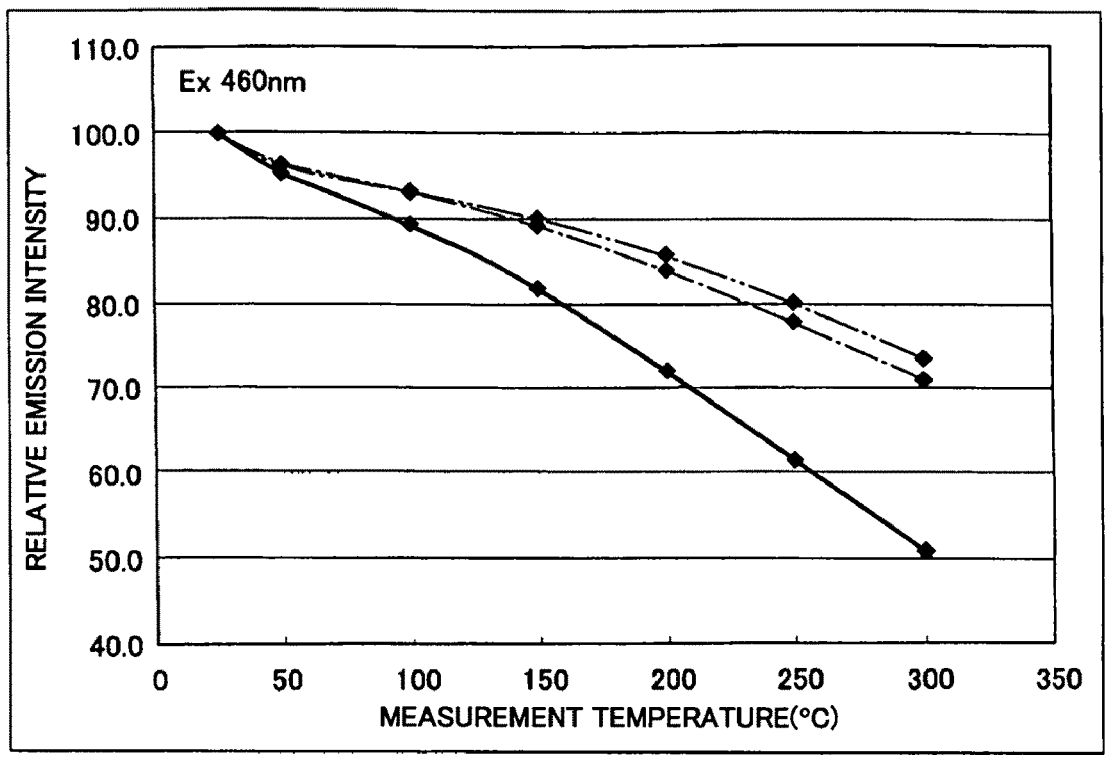
FIG. 17 is a graph showing the measurement results of the temperature characteristics of the emission intensity of the phosphors of examples 73 to 75.
Figure 18A:
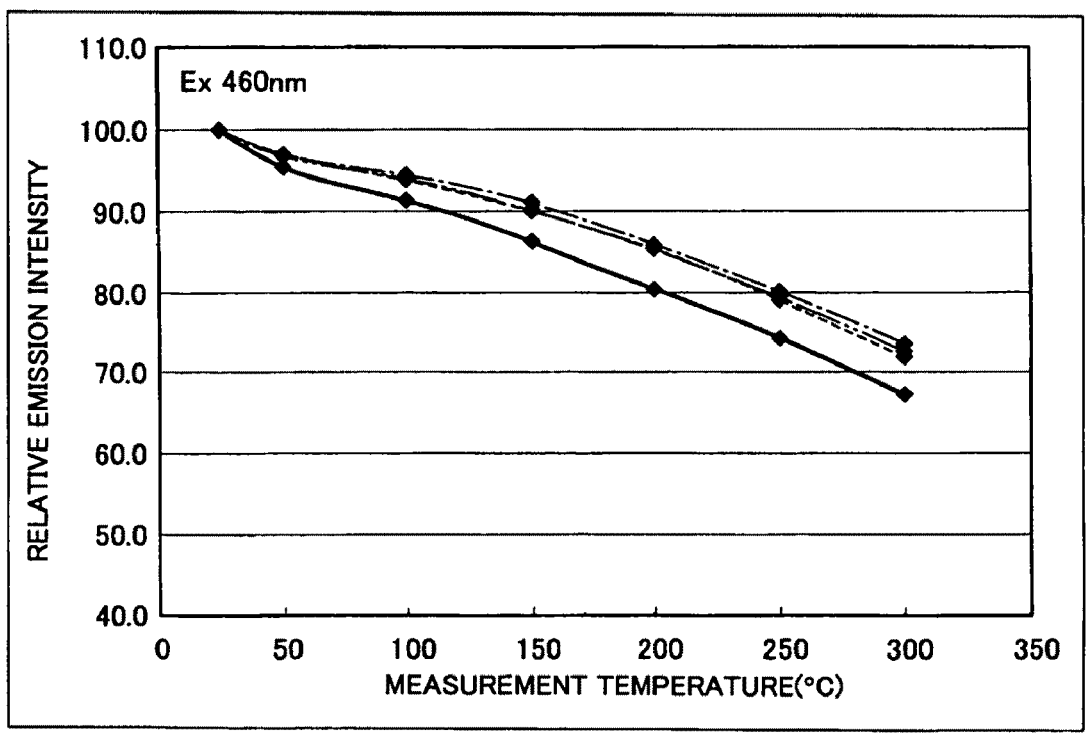
FIG. 18A is a graph showing the measurement results of the temperature characteristics of the emission intensity of the phosphors of examples 76 to 79.
Figure 18B:
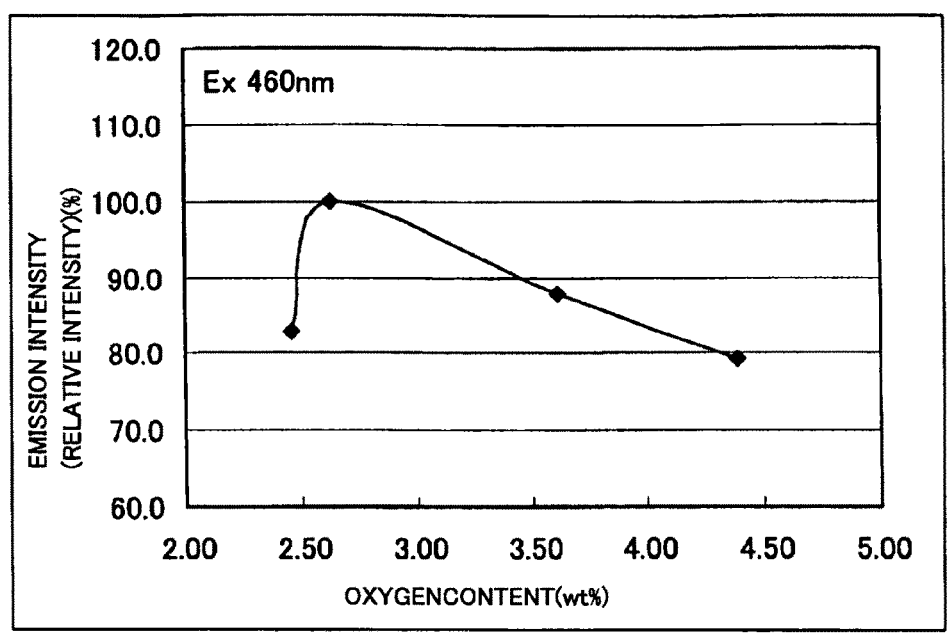
FIG. 18B is a graph showing a relation between the emission intensity and the oxygen content of the phosphors of the examples 76 to 79.
Figure 19A:
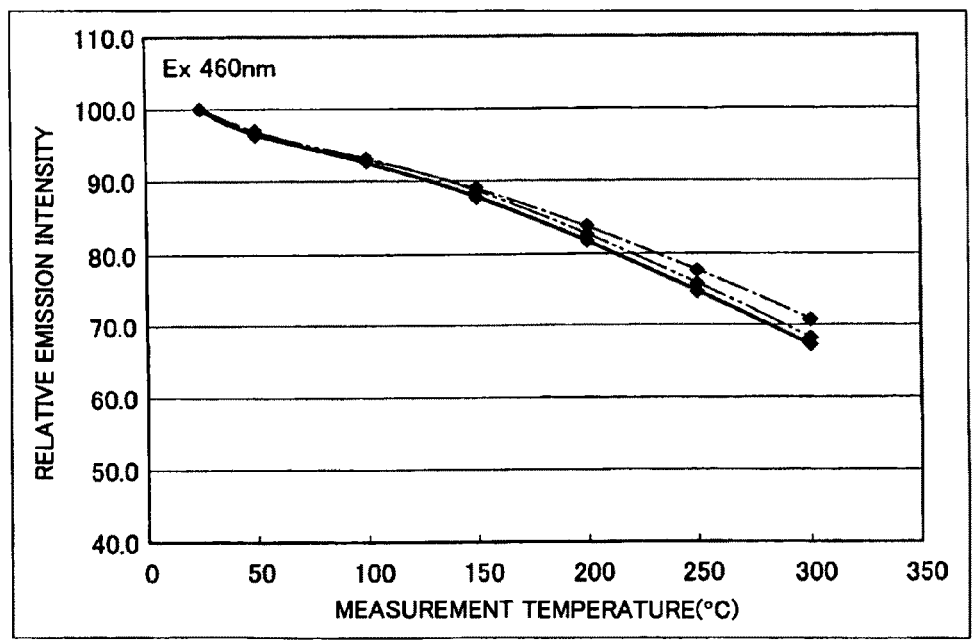
FIG. 19A is a graph showing the measurement results of the temperature characteristics of the emission intensity of the phosphors of examples 80 to 82.
Figure 19B:
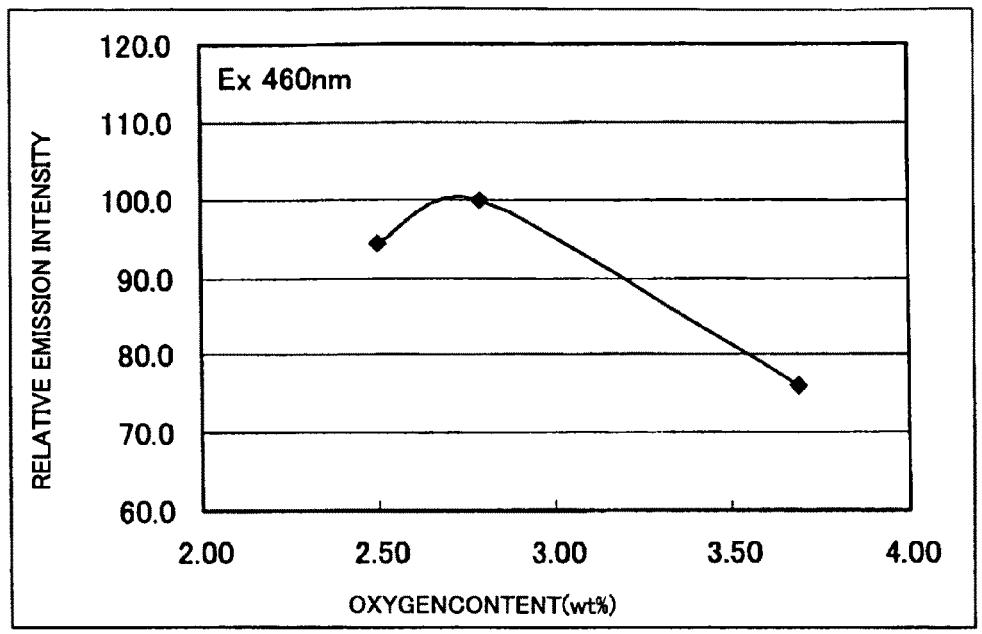
FIG. 19B is a graph showing the relation between the emission intensity and the oxygen content of the phosphors of the examples 80 to 82.
Figure 20:
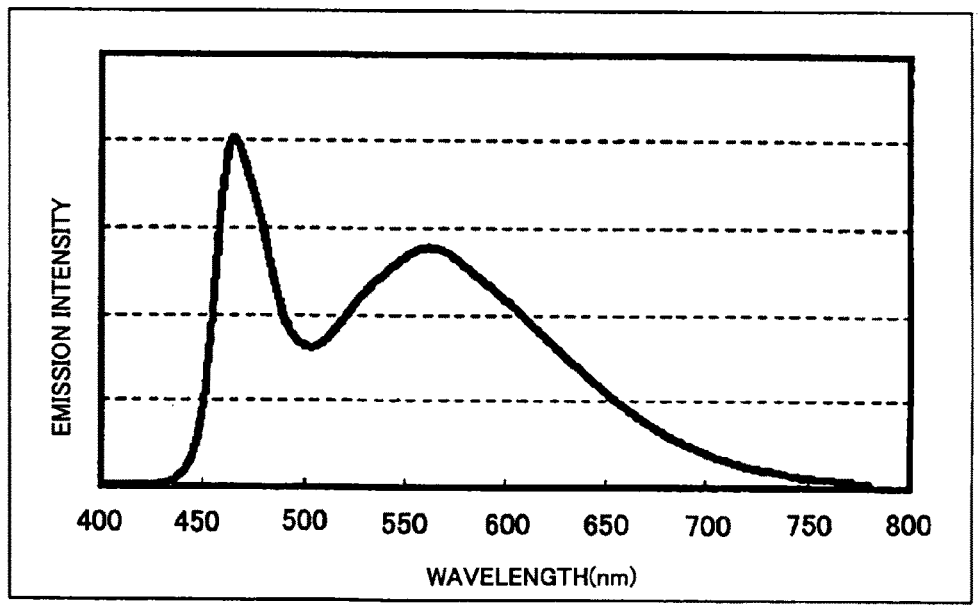
FIG. 20 shows an emission spectrum of a white LED illumination of the example 83.
Figure 21:
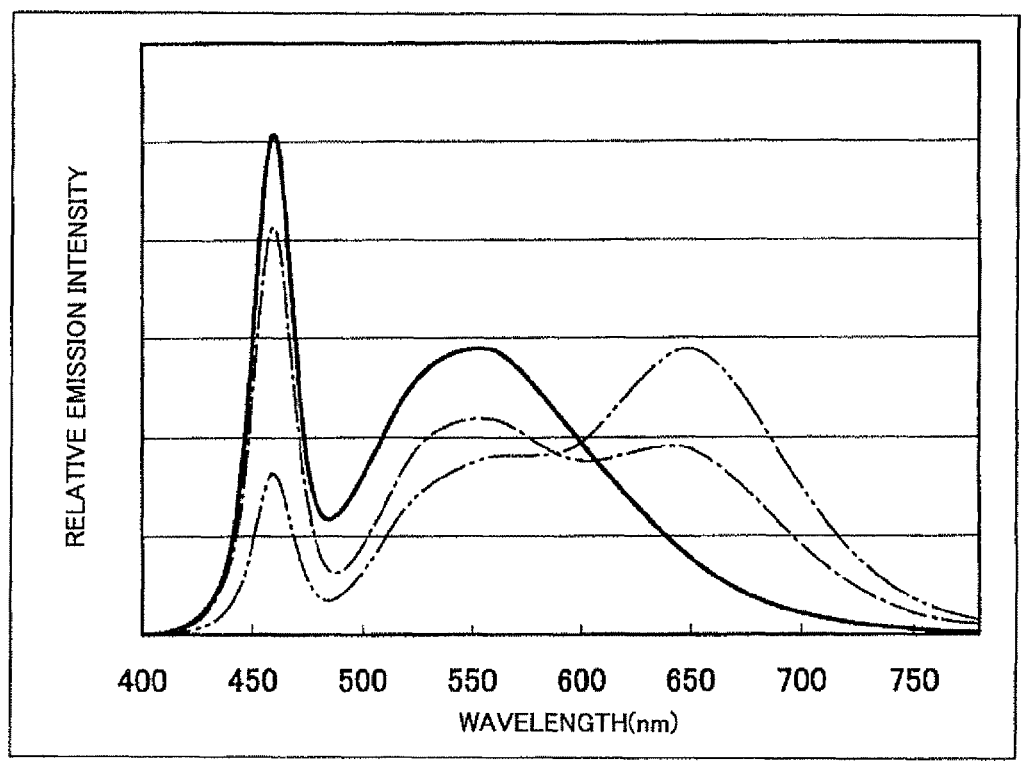
FIG. 21 shows emission spectra of the white LED illuminations of examples 84 to 86.
Figure 22:
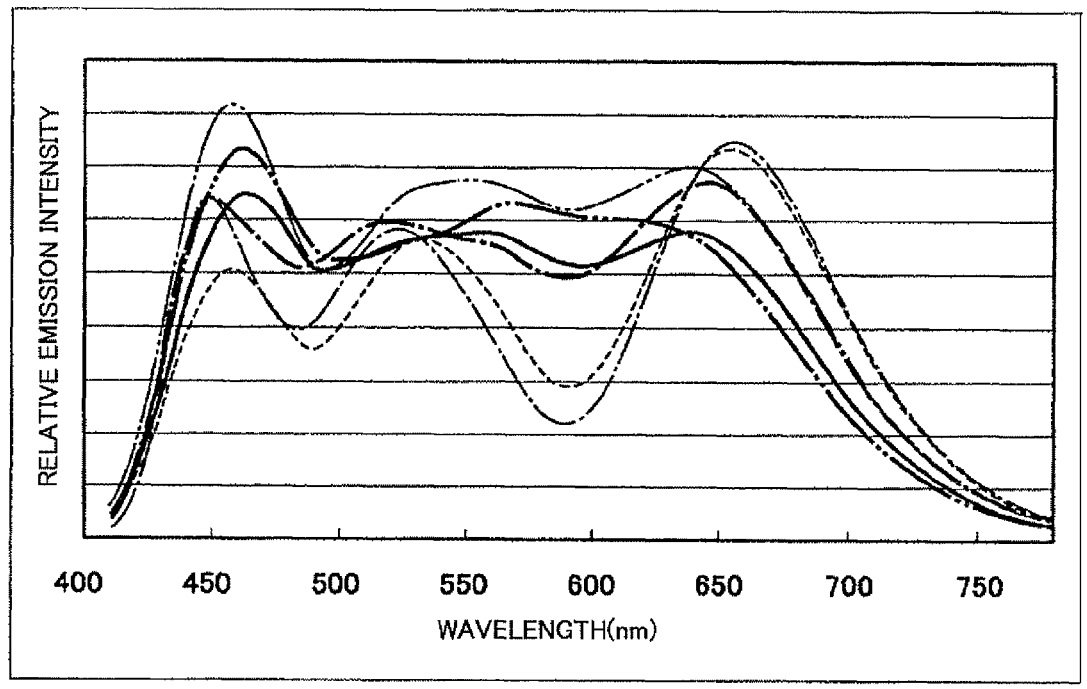
FIG. 22 shows emission spectrum patterns when a correlated color temperature is set at 6500K, in a phosphor mixtures of examples 87 to 89 and comparative examples 4 to 6.
Figure 23:
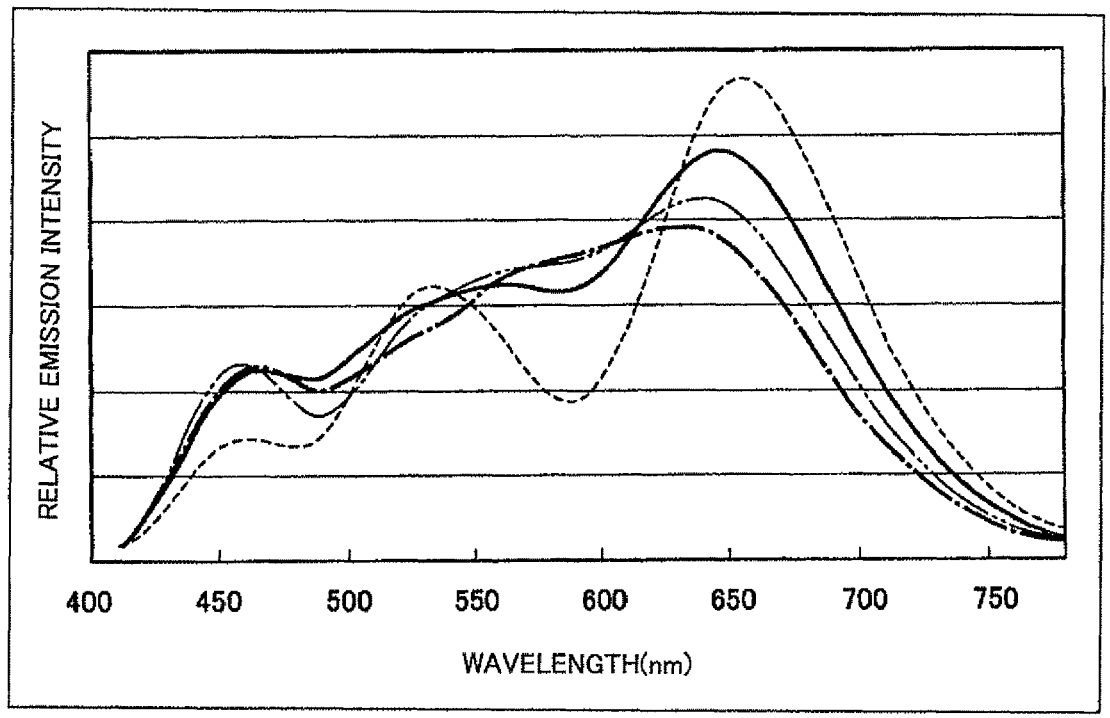
FIG. 23 is emission spectrum patterns when the correlated color temperature is set at 4200K, in the phosphor mixtures of examples 90, 91, and comparative examples 7 and 8.
Figure 24:
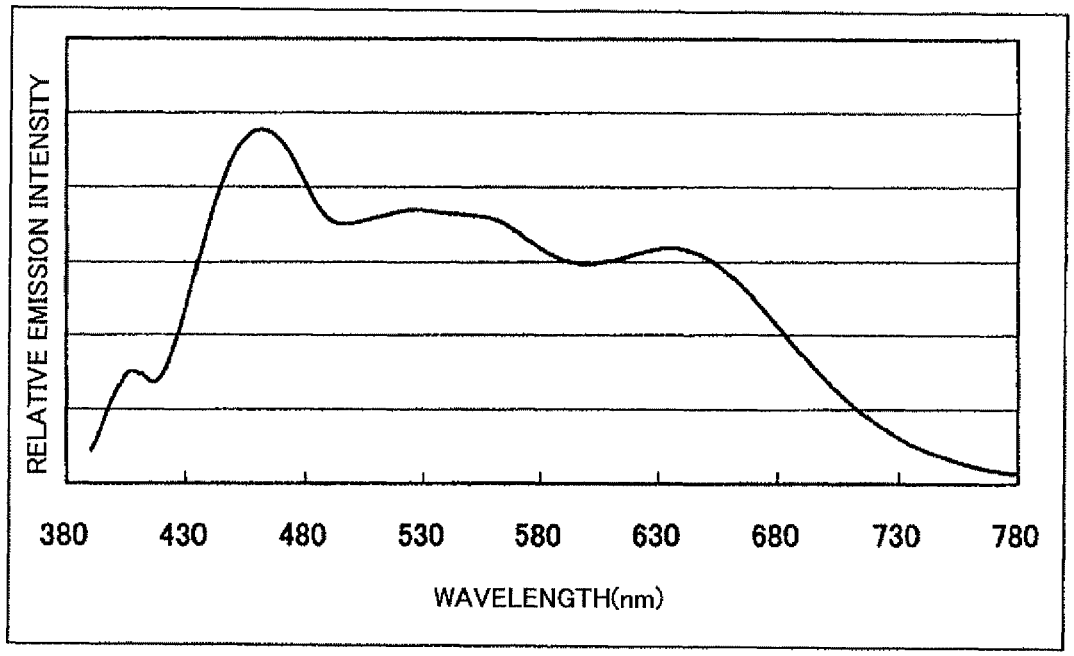
FIG. 24 is a spectrum pattern of the light emitting element when the correlated color temperature is set at 6500K, in the phosphor mixture of example 92.
Figure 25:
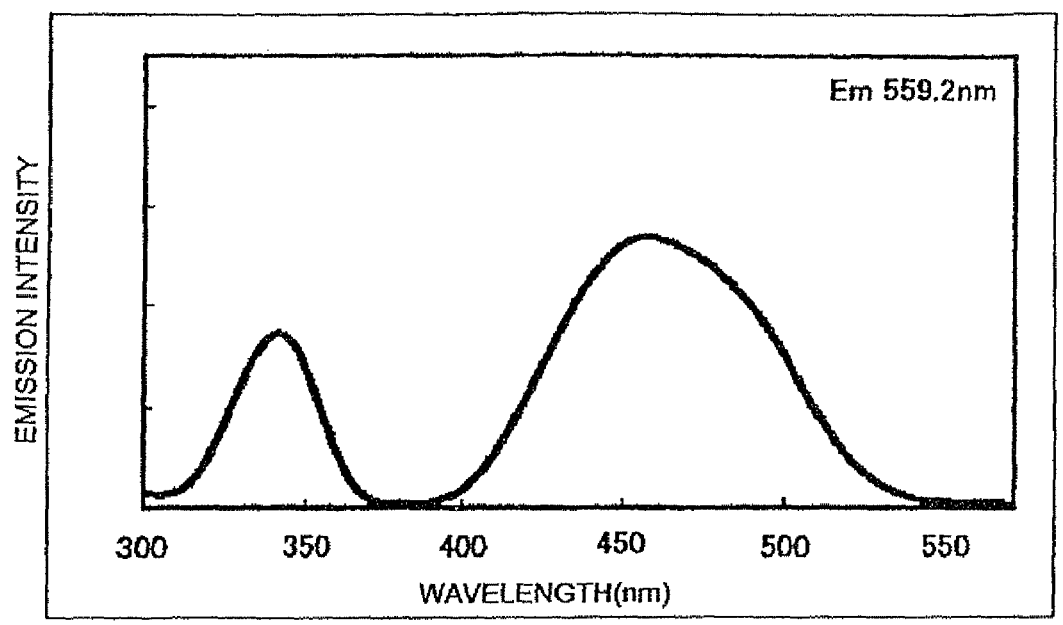
FIG. 25 is a graph showing an excitation spectrum of a conventional yellow phosphor YAG:Ce.

1 Phosphor mixture
2 LED light emitting element
3 Lead frame

4 Resin
5 Cup-shaped container
8 Reflective surface
9 Transparent mold material

The invention claimed is:

1. A phosphor of the composition formula $M_mA_aB_bO_oN_n$:Z, wherein element M is Sr, element A is Al, element B is Si, O is oxygen, N is nitrogen, and element Z is Ce or Eu, satisfying $4.0<(a+b)/m<7.0$, $0.5 \leq a/m \leq 2.0$, $3.0<b/m<7.0$, $0<o/m \leq 4.0$, and $n=2/3m+a+4/3b-2/3o$, wherein the phosphor contains from 19.5 wt. % to 29.5 wt. % of Sr, from 5.0 wt. % to 16.8 wt. % of Al, from 0.5 wt. % to 8.1 wt. % of O, from 22.6 wt. % to 32.0 wt. % of N, and from more than 0.0 to 3.5 wt. % of element Z, wherein when excited by light in a wavelength range from 300 nm to 500 nm, a peak wavelength in an emission spectrum is in a range from 500 nm to 650 nm, a crystal system of a main production phase of said phosphor is a crystal phase of a rhombic or a monoclinic system, and a product phase contained in the phosphor has characteristic peaks in a Bragg angle (2θ) range of 12.5° to 13.5°, 17.0° to 18.0°, 21.0° to 22.0°, 22.5° to 23.5°, 26.5° to 27.5°, 28.5° to 29.5°, 34.0° to 35.0°, 35.5° to 36.5°, 36.5° to 37.5°, 41.0° to 42.0°, 42.0° to 43.0°, 56.5° to 57.5°, and 66.0° to 67.0°.

2. The phosphor according to claim 1, wherein the composition formula is further satisfying $0.8 \leq a/m \leq 1.5$, $3.0<b/m<6.0$, and $0<o/m \leq 3.0$.

3. The phosphor according to claim 1, wherein the composition formula is further satisfying $3.5 \leq b/m \leq 4.5$.

4. The phosphor according to claim 1, wherein the composition formula is further satisfying $0.5 \leq a/m \leq 2.0$, $3.0<b/m<7.0$, and $0<o/m \leq 4.0$.

* * * * *